(12) United States Patent
Hollman

(10) Patent No.: US 6,744,268 B2
(45) Date of Patent: Jun. 1, 2004

(54) HIGH RESOLUTION ANALYTICAL PROBE STATION

(75) Inventor: Kenneth F. Hollman, Carson City, NV (US)

(73) Assignee: The Micromanipulator Company, Inc., Carson City, NV (US)

( * ) Notice: Subject to any disclaimer, the term of this patent is extended or adjusted under 35 U.S.C. 154(b) by 0 days.

(21) Appl. No.: 10/119,346

(22) Filed: Apr. 8, 2002

(65) Prior Publication Data

US 2003/0042921 A1 Mar. 6, 2003

Related U.S. Application Data

(63) Continuation-in-part of application No. 09/774,249, filed on Jan. 30, 2001, now Pat. No. 6,621,282, which is a continuation of application No. 09/527,874, filed on Mar. 17, 2000, now Pat. No. 6,191,598, which is a continuation of application No. 09/140,910, filed on Aug. 28, 1998, now Pat. No. 6,198,299.

(51) Int. Cl.$^7$ .......................... G01R 31/02; G01R 31/28
(52) U.S. Cl. .................... 324/758; 324/158.1; 324/751; 324/765
(58) Field of Search ................. 324/758, 501, 324/750, 751, 752, 158.1, 500, 765; 250/310, 311; 174/35

(56) References Cited

U.S. PATENT DOCUMENTS

| 4,532,423 | A | * | 7/1985 | Tojo et al. ................. 324/751 |
| 4,618,767 | A |   | 10/1986 | Smith et al. |
| 4,706,019 | A |   | 11/1987 | Richardson |
| 4,747,698 | A |   | 5/1988 | Wickramasinge et al. |
| 4,772,846 | A | * | 9/1988 | Reeds ....................... 324/758 |
| 4,807,159 | A | * | 2/1989 | Komatsu et al. ........... 250/311 |
| 4,837,445 | A |   | 6/1989 | Nishioka et al. |
| 4,866,271 | A |   | 9/1989 | Ono et al. |
| 4,871,938 | A |   | 10/1989 | Elings et al. |
| 4,880,975 | A |   | 11/1989 | Nishioka et al. |
| 4,881,029 | A | * | 11/1989 | Kawamura ................. 324/751 |
| 4,894,537 | A |   | 1/1990 | Blackford et al. |
| 4,992,660 | A |   | 2/1991 | Kobayashi |
| 4,999,494 | A |   | 3/1991 | Elings |
| 5,107,114 | A |   | 4/1992 | Nishioka et al. |
| 5,109,724 | A |   | 5/1992 | Delarue et al. |
| 5,117,110 | A |   | 5/1992 | Yasutake |
| 5,136,162 | A |   | 8/1992 | Miyamoto et al. |
| 5,325,010 | A |   | 6/1994 | Besocke et al. |
| 5,349,735 | A |   | 9/1994 | Kawase et al. |

(List continued on next page.)

FOREIGN PATENT DOCUMENTS

| EP | 0 095 370 A2 | 11/1983 |
| EP | 0 027 517 B1 | 2/1984 |
| EP | 0 037 568 B1 | 2/1984 |
| EP | 0 138 250 A2 | 4/1985 |
| EP | 0 069 750 B1 | 4/1987 |
| EP | 0 223 918 A2 | 6/1987 |
| EP | 0 095 370 B1 | 11/1988 |
| EP | 0 335 398 A1 | 10/1989 |
| EP | 0 110 301 B1 | 11/1989 |
| EP | 0 349 911 A2 | 1/1990 |

(List continued on next page.)

*Primary Examiner*—Ernest F. Karlsen
(74) *Attorney, Agent, or Firm*—Fitch, Even, Tabin & Flannery

(57) ABSTRACT

A specimen probing apparatus in provided including a vacuum chamber within which a carrier for the specimen to be probed and a probe assembly are positioned. The housing for the chamber is preferably constructed to allow a variety of options for electrically isolating the test environment in the chamber. Also, unique drive or shift assemblies for the carrier and probe assembly are disclosed for allowing precision movements thereof in the vacuum chamber.

15 Claims, 37 Drawing Sheets

U.S. PATENT DOCUMENTS

| | | |
|---|---|---|
| 5,444,244 A | 8/1995 | Kirk et al. |
| 5,493,236 A | 2/1996 | Ishii et al. |
| 5,519,212 A | 5/1996 | Elings et al. |
| 5,530,372 A | 6/1996 | Lee et al. |
| 5,557,156 A | 9/1996 | Elings |
| 5,672,816 A | 9/1997 | Park et al. |

FOREIGN PATENT DOCUMENTS

| | | |
|---|---|---|
| EP | 0 206 016 B1 | 9/1990 |
| EP | 0 386 840 A1 | 9/1990 |
| EP | 0 231 247 B1 | 10/1990 |
| EP | 0 260 734 B1 | 1/1991 |
| EP | 0 423 877 A1 | 4/1991 |
| EP | 0 442 630 A2 | 8/1991 |
| EP | 0 218 829 B1 | 11/1991 |
| EP | 0 480 424 A2 | 4/1992 |
| EP | 0 504 972 A1 | 9/1992 |
| EP | 0 538 861 A1 | 4/1993 |
| EP | 0 546 305 A1 | 6/1993 |
| EP | 0 548 573 A2 | 6/1993 |
| EP | 0 335 398 B1 | 7/1993 |
| EP | 0 584 869 A1 | 3/1994 |
| EP | 0 594 084 A1 | 4/1994 |

\* cited by examiner

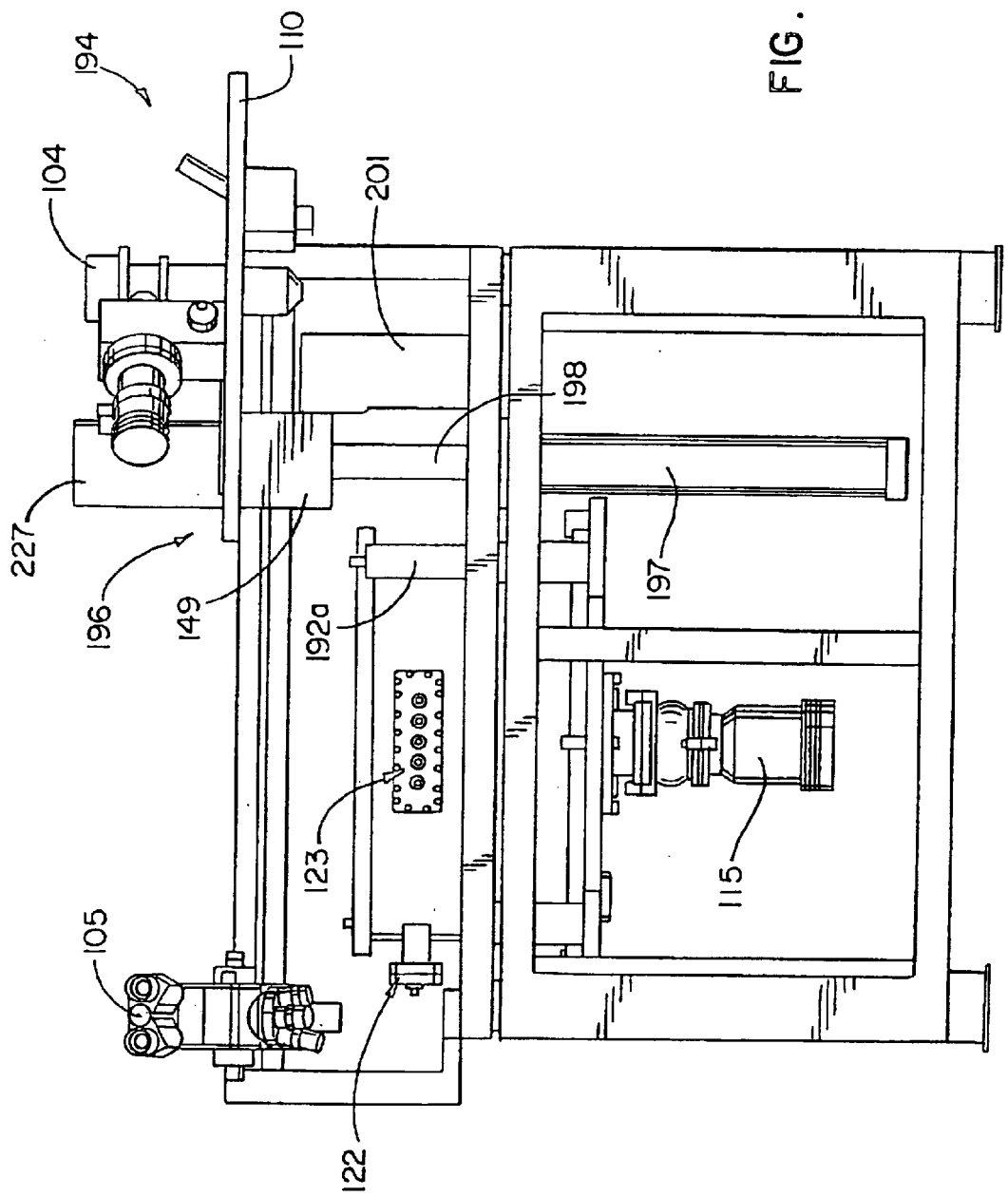

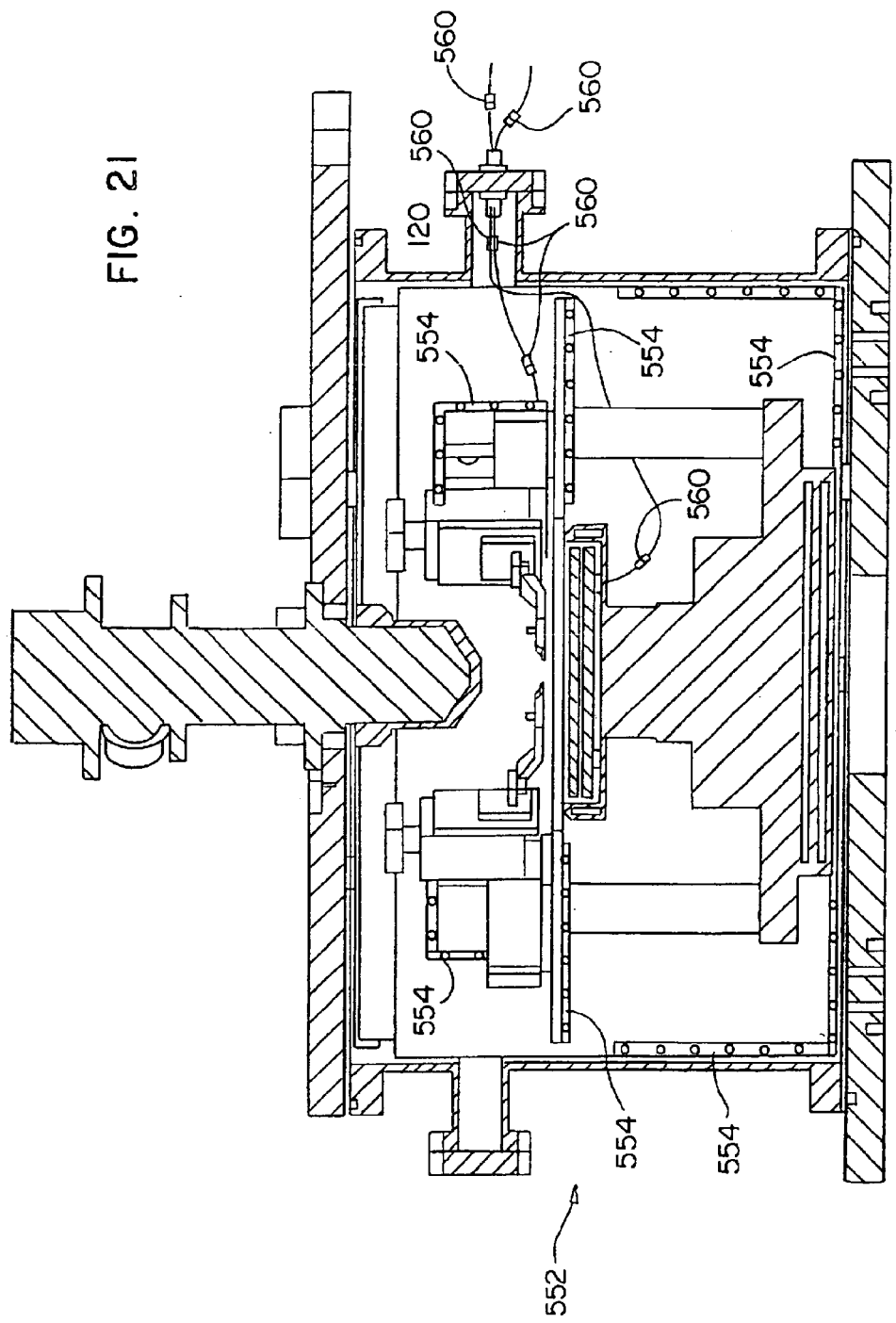

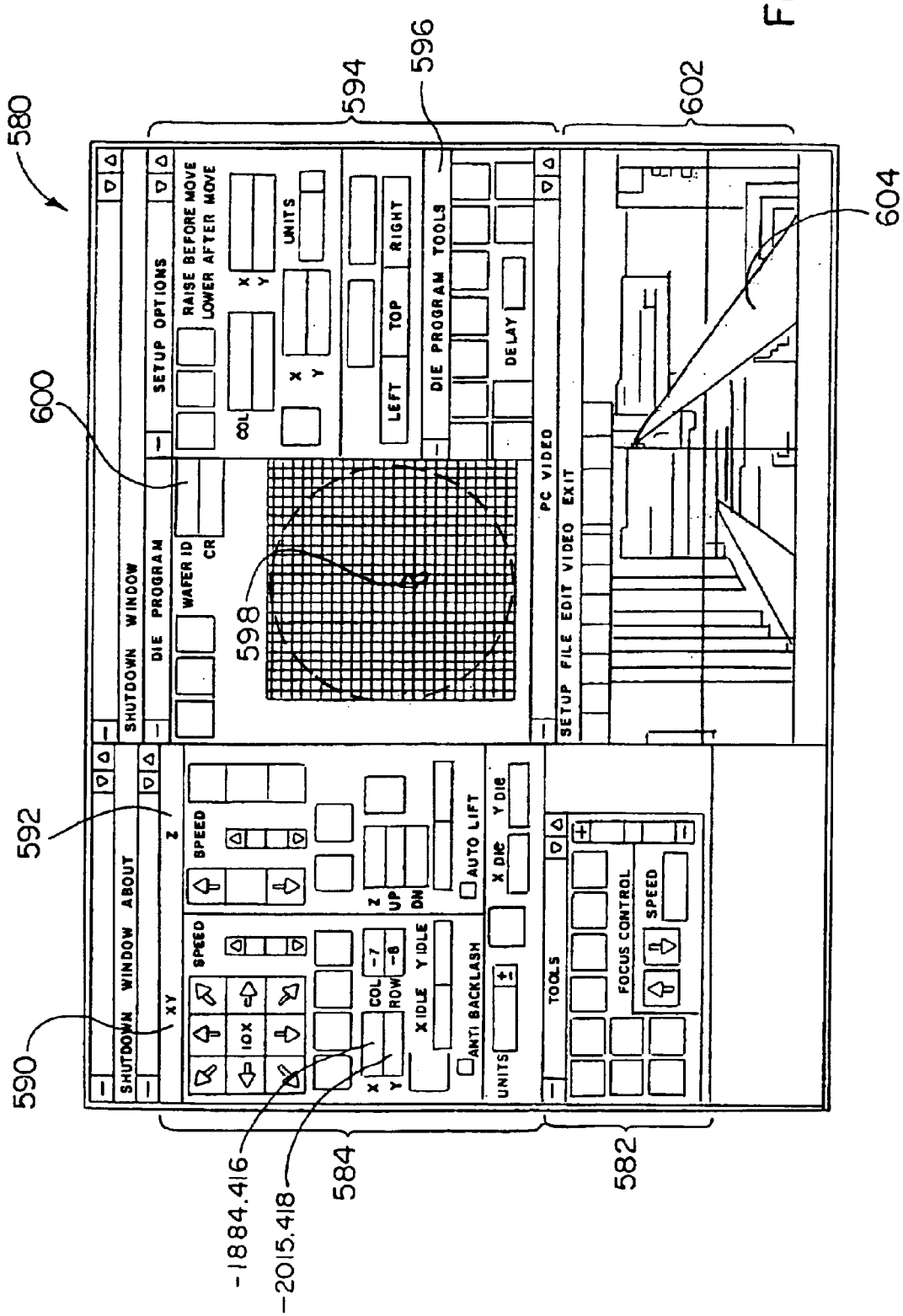

HIGH RESOLUTION ANALYTICAL PROBE STATION

CROSS REFERENCE TO RELATED APPLICATIONS

This is a continuation-in-part of prior application Ser. No. 09/774,249, filed Jan. 30, 2001, now issued U.S. Pat. No. 6,621,282 which is a continuation of prior application Ser. No. 09/527,874, filed Mar. 17, 2000, now issued U.S. Pat. No. 6,191,598, which is a continuation of prior application Ser. No. 09/140,910, filed Aug. 28, 1998, now issued U.S. Pat. No. 6,198,299, which are hereby incorporated herein by reference in their entirety.

BACKGROUND OF THE INVENTION

The invention relates in general to the use of high resolution microscopy probe stations, and particularly to methods and system for probing with electrical test signals on integrated circuit (IC) specimens using a scanning electron microscope (SEM) positioned for observing the surface indicia of the specimen identifying the electrically conductive terminals for the positioning of the probes.

Presently, probe stations typically employ optical microscopes. Although the diameters of wafers are getting larger, the structures constructed on and in those wafers are getting smaller. In the past several decades, the industry has driven the size of these structures from large sizes on the order of hundredths of an inch to small fractions of micrometers today. Until recently, most structures could be observed by normal high magnification light microscopes and probed. However, modern structures have now achieved a size that no longer allows viewing with standard light microscopes. With the industry integrated circuit design rules driving towards 0.18 micron features and smaller, most advanced optical light microscopes cannot be relied upon to accurately identify the electrically conductive terminals from the conductive path indicia of the surface of the integrated circuit specimens under test. Additionally, when viewing very small features on a specimen, the optical microscope lens often must be positioned so close to the specimen that it may interfere with the test probes.

Another approach is necessary in addition to optical microscopy if the industry is to continue to probe these structures, which is surely needed. It would be desirable therefore to provide a probe station which can visualize and probe features not typically visible under even the most advanced light microscope, that can be used in conjunction with electron optics while maintaining the features typically found on optical microscope probe stations.

SUMMARY OF THE INVENTION

Briefly summarized, the present invention relates to a method and system for probing with electrical test signals a specimen using high resolution microscopy, such as a scanning electron microscope (SEM) or a Focus Ion Beam (FIB) system, positioned for observing a surface of the specimen to identify locations of electrically conductive terminals on the specimen. In a preferred form, a carrier is provided for supporting the specimen in relation to the scanning electron microscope while a controller, such as a computer, acquires an image identifying conductive path indicia of the surface of the specimen from the scanning electron microscope. The carrier may be anyone of a number of items known to one of ordinary skill in the art, such as a chuck (e.g., ambient, thermal, triaxial, etc.), a probe card adapter and probe card, a socket stage adapter, etc.

Motorized manipulators can be automatically controlled by the computer, or manually by the operator using a joystick or the like, to precisely position associated probes on or near the surface of the specimen for acquiring and conveying electrical test signals inside a vacuum chamber inner enclosure which houses at least a portion of the scanning electron microscope, the carrier, the motorized manipulators and probes for analyzing the specimen in a vacuum. A feedthrough or electrical connector mounted to the vacuum chamber allows for the computer to be electrically interconnected to the motorized manipulators and their associated probes in the sealed enclosure and can provide access to the internal vacuum chamber for additional wiring and conduits. The computer communicates with the motorized manipulators for positioning the probes thereof, and for acquiring and applying electrical test signals from and/or to the terminals on the specimen using the image acquired by the computer to identify the electrically conductive terminals from the conductive path indicia of the surface of the specimen observed with the scanning electron microscope.

The computer includes a display which shows a viewer an enlarged view of the surface of the specimen being probed. A cursor indicates the selected location or test site on the specimen at which test signals are transferred to and from the probe. In this manner, an operator can change selected test locations via on-screen manipulation of the cursor, as by a mouse or other computer interface control. Moving the cursor causes the relative position between the probe and the specimen surface to shift under software control so that the probe is oriented at the selected test site. To this end, the software is programed to operate actuators of the probe assemblies and/or the carrier on which the specimen is affixed for precision shifting thereof to position the probe at the selected test site. Accordingly, with a mouse, an operator can click on the cursor, and drag it across the screen to the desired conductive path indicia location or terminal they desire to test.

To improve low current testing accuracy, the preferred probing system is highly flexible in allowing for different guarding and/or shielding schemes to be employed throughout substantially every level of its operating components. For example, the probe station housing can be separated into two electrically isolated outer and inner portions each having conductive walls so that the inner portion can be driven to the same potential as the signal applied to the specimen to assist in isolating the testing area from noise and other environmental interference and the outer portion can be grounded to reduce the risk of electrical shock to probe station users. The probes and chuck can be wired in a similar configuration to further isolate the testing area from noise and interference. Further, locations of the electrical interconnects can be selected to minimize lengths of wiring runs from the chamber walls to the operating components, e.g., probe and chuck and their actuators or motors.

To compensate for the sources of heat and radiation of heat within the vacuum chamber, the drive mechanisms of the system are constructed of heat insulating materials having low coefficients of thermal expansion to insulate components of the drive mechanisms from heat and unwanted movement or drift caused by thermal expansion, and have radiation shields for deflected heat or energy from the motors of the drive systems towards the housing walls which are better equipped to handle the buildup of heat due to their proximity to the outer atmoshphere.

In other aspects, the probes can include extended cladding to minimize the amount of unwanted insulator charging. A touchdown sensing mechanism can be utilized to reduce the risk of damage to the specimen caused by excessive force applied thereto by probe engagement. The duty cycle of the high resolution microscope is preferably reduced as by a shuttering system. In this way, damage done to the DUT via the beam of the microscope is minimized.

BRIEF DESCRIPTION OF THE DRAWINGS

FIGS. 5A–K are views of another form of high resolution probe station in accordance with the present invention showing a vacuum chamber housing the probe assemblies and chuck with the station generally setup in triaxial or coaxial configurations;

FIG. 5A is a perspective view of the high resolution analytical probe station with its cover open;

FIG. 5B is a front elevational view of the high resolution analytical probe station with its cover closed;

FIG. 5C is a right side elevational view of the high resolution analytical probe station with its cover open;

FIG. 5D is a top plan view of the high resolution analytical probe station with the cover open;

FIG. 5E is a perspective view of the housing of the high resolution analytical probe station taken from below the housing;

FIG. 5F is a right side elevational view of the high resolution analytical probe station with the cover closed;

FIG. 5G is a rear view of the high resolution analytical probe station with its cover closed;

FIG. 5H is a cross sectional view of the high resolution analytical probe station with its cover closed;

FIG. 5I is an enlarged view of the upper left side of the high resolution analytical probe station with its cover closed;

FIG. 5J is an enlarged view of the upper right side of the high resolution analytical probe station with its cover closted;

FIG. 5K is a cross sectional view of the housing of the high resolution analytical probe station with its cover closed;

FIG. 21 is a schematic cross-sectional view of the high resolution probe station of FIG. 5 including a temperature control system and showing a bank of heat exchange tubes through which a cooling or heating fluid is run to control the temperature within the vacuum chamber;

FIGS. 22A–B are views of screen printouts showing video images of the specimen and a wafer profile of the specimen;

DETAILED DESCRIPTION OF THE PREFERRED EMBODIMENTS

Figure 1:
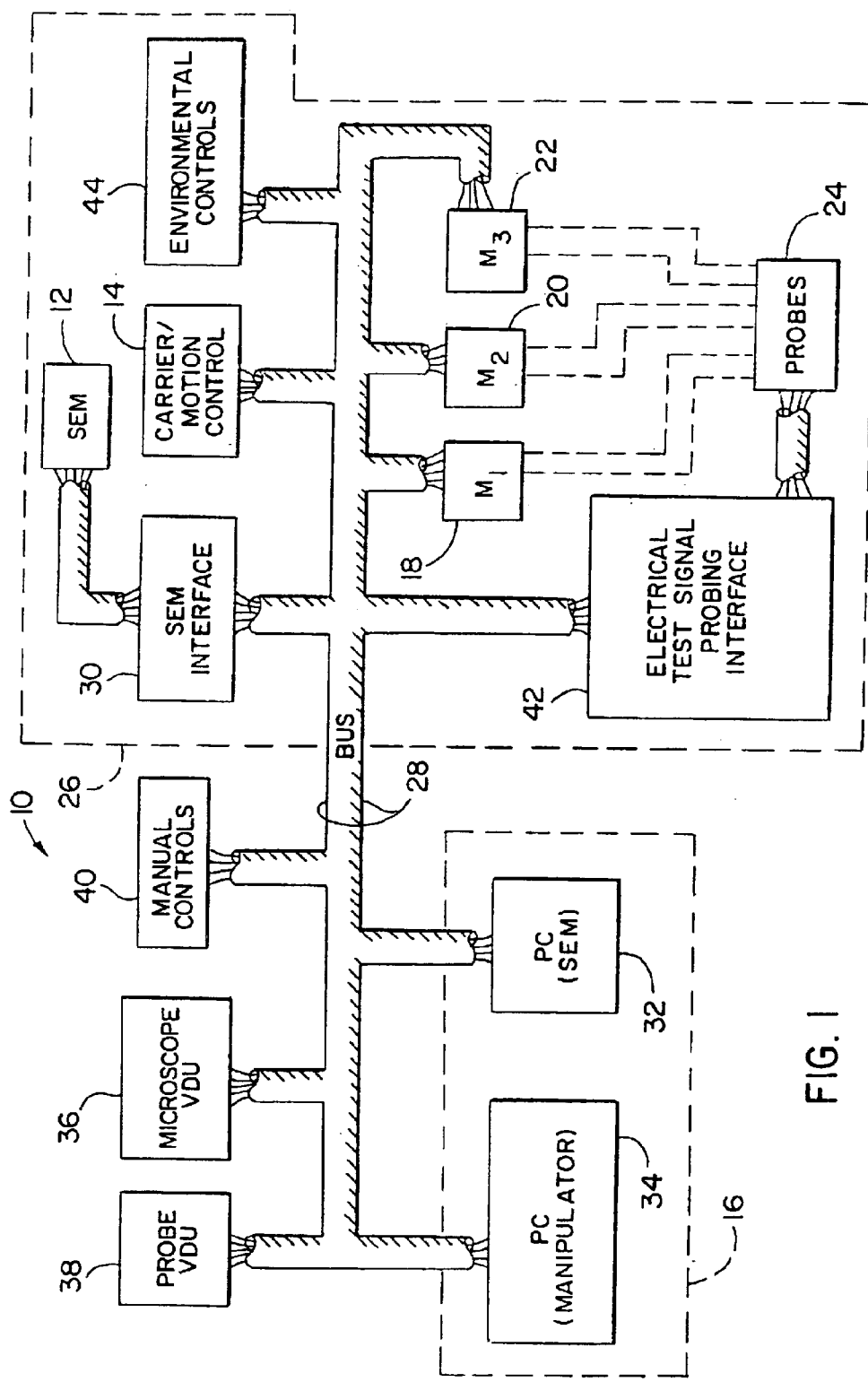
FIG. 1 shows a high resolution probe station embodying the present invention.
Figure 2:
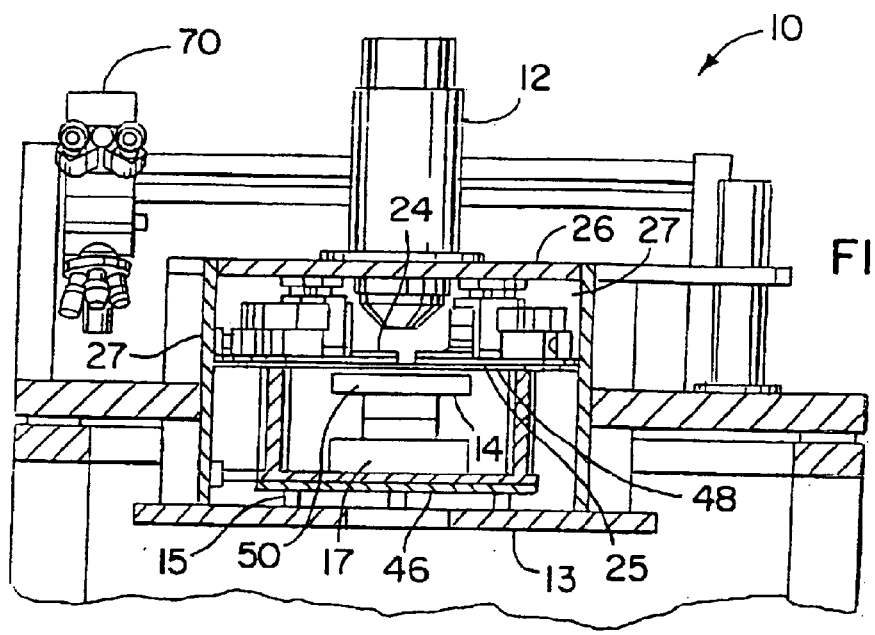
FIG. 2 shows a vacuum chamber in cross-section housing at least a portion of a scanning electron microscope (SEM), motorized manipulators, and a plurality of probes positioned on an integrated circuit specimen in accordance with the invention.

Referring to the drawings and especially to FIGS. 1 and 2, a system 10 is shown for high resolution analytical probing of an integrated circuit specimen, (e.g., a semiconductor wafer 50). The system 10 is capable of applying electrical test signals to an integrated circuit specimen 50, which may include whole wafers, packaged parts, or wafer fragments. Thus the system 10 may probe entire wafers in addition to a large variety of similarly sized specimens. A conventional scanning electron microscope (SEM), an X-ray microscope for material analysis during probing functions, or a Focus Ion Beam (FIB) system 12, may be employed for enhanced capabilities. Thus, the prober may be integrated into FIB systems as well as SEM systems. The embodiment described herein uses a SEM provided by R. J. Lee Instruments Ltd. which is positioned for observing a surface of the specimen 50 exposing electrically conductive terminals on the specimen 50. See, e.g., FIG. 4, discussed below. The system 10 may be provided with Electron Beam Induced Current (EBIC) capabilities to allow for current path tracing tests and the like as a form of non-contact probing.

As shown in FIG. 2, a carrier 14 is provided for supporting the specimen 50 in relation to the scanning electron microscope 12. The scanning electron microscope 12 is positioned sufficiently above the specimen 50 so as to allow for the positioning of several test probes on the specimen 50, which may not be possible using an optical microscope for viewing very small circuit features. A computer system 16, is coupled to the carrier/motion control 14 in FIG. 1, and provides for acquisition of the high resolution images of FIG. 4 which identify the conductive path indicia of the surface of the specimen 50 with the scanning electron microscope 12. The computer system 16 may be provided as a processor such as a conventional microprocessor-based system, or an electronic controller, or microcontroller suitable for the information processing described below. Multiple motorized manipulators identified by reference numerals 18, 19, 20, 21, 22 and 23 respectively are also remotely controlled by the computer system 16. A plurality of probes 24 are thus used for conveying electrical test signals, and are positionable on the surface of the specimen 50 with motorized manipulators 18–23.

Figure 3A:
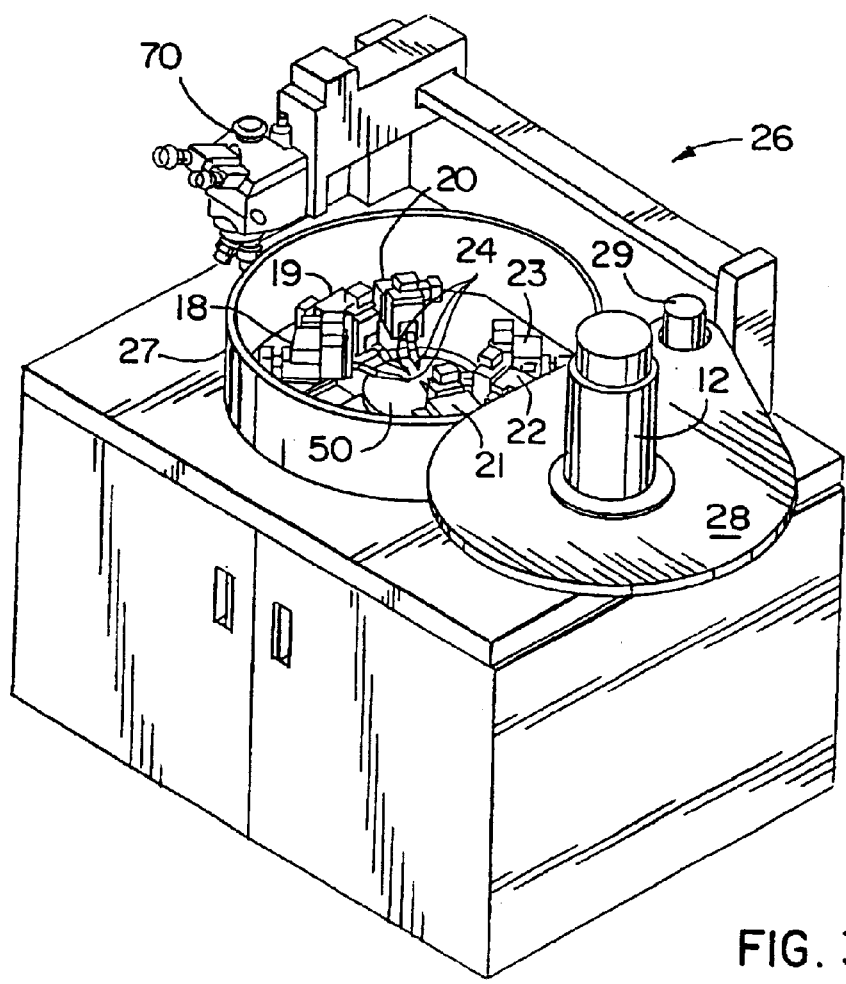
FIGS. 3A, 3B and 3C are perspective views of the vacuum chamber in which electrical signals from a computer are coupled to motorized manipulators and a plurality of probes allowing the computer to communicate with the motorized manipulator for positioning the probes for applying electrical test signals.
Figure 3B:
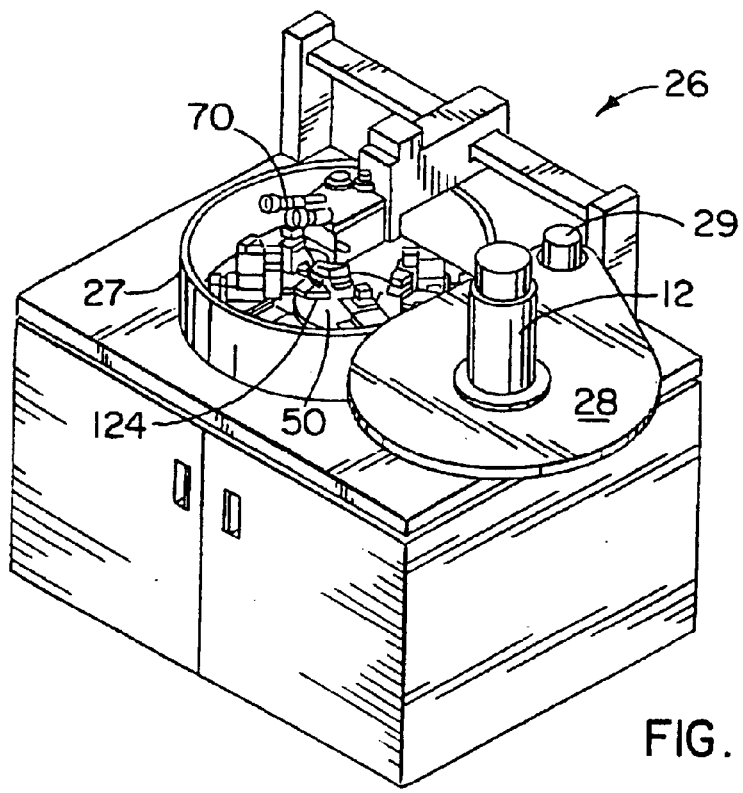
Figure 3C:
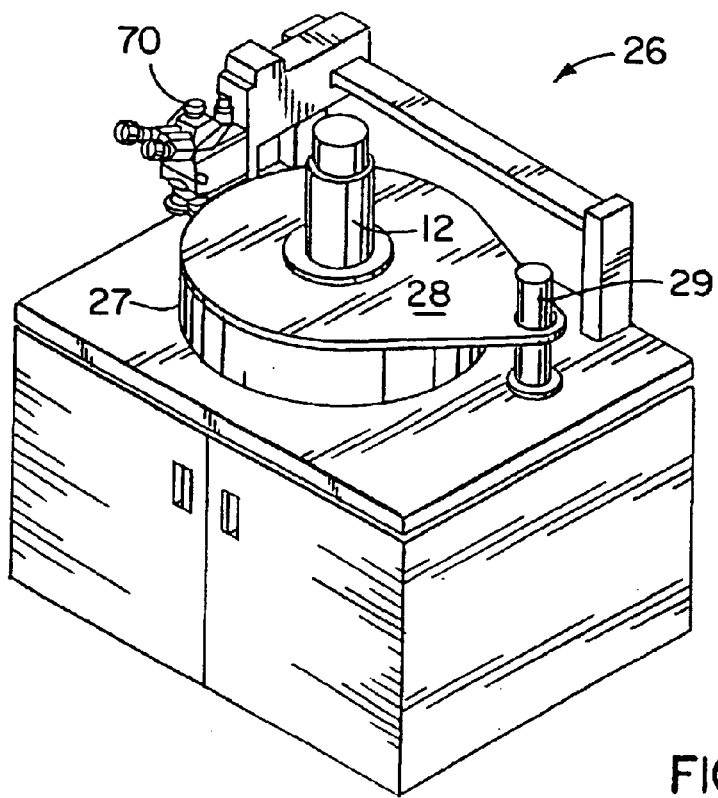

A vacuum chamber 26 shown in perspective views in FIGS. 3A, 3B and 3C illustrates system operation in which an inner enclosure 27 is adapted for housing the scanning electron microscope 12, the carrier 14, multiple motorized manipulators 18–23, and the plurality of probes 24 for analyzing the specimen 50 in a vacuum generated by the vacuum chamber 26 for use with the scanning electron microscope 12. An angle of incidence from 45°–90° with adjustment capability in the form of different styles of replaceable probe tips, (e.g., with 45° and 90° attack angles), facilitates probe positioning in relation to the scanning electron microscope 12.

The chamber size of the inner enclosure 27 is dependent upon the type of probing required. A relatively small chamber is needed for small sample probing. Small samples are likely packaged parts or wafer fragments. For wafer level probing, the chamber size has to be much larger to accommodate wafer stage translations up to 300 mm and larger. The chamber is approximately 23" inner diameter×10" deep. This allows for a 6" wafer chuck having less than an inch of travel in the X and Y directions. It also allows for up to six (6) programmable manipulators having at least 50 nm resolution and 0.5 inches of travel in all axis. The footprint of the system is approximately 3'×3'×5' which includes all of the electronics and pumping facilities required.

The system 10 is built upon a vibration isolation table provided by Kinetics Systems, which may be supplied by a variety of manufacturers. The design of this table system is customized to accommodate the vacuum chamber, which resides above and below the tabletop surface. This arrangement is made to allow easy access to the prober without having to work much above normal tabletop height. In the embodiment shown, a lift mechanism 29, which is either pneumatically or hydraulically driven, is employed to raise and lower the chamber top 28. Further, all of the hardware services needed for the system to function are integrated into the table leg area.

The chamber wall 27 has feedthroughs welded to it which provide flanged access for the needed cabling to both operate the programmable functions of the system as well as provide for signal paths to the surface of chuck 14, individual probe contacts 24, and probe card signals (not shown). A thermal chuck 14 may be employed within the system chamber. The chamber floor 13 also has feedthroughs welded to it with flanged access to attach a means for pulling a vacuum in the chamber as well as additional feedthrough ports for interconnection requirements, discussed below. Thus, the system 10 is well suited for low noise and low current testing when fitted with the described interconnection hardware and instrumentation.

A Model 900VM manipulator, manufactured by The Micromanipulator Company, Inc., Carson City, Nev., is designed to meet the needs of "hands-off" operation and programmable probe applications. The manipulators 18–23 are motorized in the X, Y and Z axes. The Z axis positioning is aided by manual, coarse positioning allowing compensation for various probe holders and probe station systems, which may be operated in a fully programmable or motorized-only (e.g., joystick control) mode depending upon the choice of control system. The Model 900VM manipulator accepts all standard probe holders in disposable tip or integrated tip models.

At 0.05 microns, the Model 900VM manipulators offer very high manipulator resolution. This resolution is attainable with either motorized (e.g., joystick) or programable control. The 900VM also features a wide range of probe holder "Z" positioning settings, an indexed rotational nosepiece, fast manual "Z" lift for fast probe tip changes and a stable vacuum base with quick release. The model 900VM may be used with joystick only control (REM version) or with external computer control using pcProbe™ software discussed below.

A feedthrough is provided on the vacuum chamber 26 for coupling electrical signals, (e.g., via a computer bus 28), from the computer system 16 to the motorized manipulators 18–23, stage 14, and the plurality of probes 24. The feedthroughs used are provided by PAVE Technology Co., Inc. and others that include signal, positioner and probe card connection interconnects which fall into either of two categories. The first category includes those interconnects provided for device under test (DUT) 50 test signal handling capabilities. These can be, but are not limited to single pin jack, coax, triax, SMA, and UMC connections. Further, with fixed position probe card usage, all mentioned feedthroughs may be used together plus many others meant to handle large quantities of leads. The second category are those interconnects which are dedicated to providing control signals to all of the prober functions needed. A typical axis of control may require seven leads for motor step and direction as well as limits controls with respect to travel.

Further, additional leads may be used where position feedback is employed. For example, Kelvin probes and probe holder configurations can be adapted to this application. These would require double the number of signal leads.

The computer system 16 communicates with the motorized manipulators 18–23 for positioning the plurality of probes 24 for applying the electrical test signals to the terminals on the specimen 50 using the image acquired by the computer system 16 to identify the electrically conductive terminals from the conductive path indicia of the surface of the specimen 50 observed with the scanning electron microscope 12.

As described, the probe station system 10 positions the scanning electron microscope 12 for observing a surface of the specimen 12 for positioning the probes 24. The system 10 provides means for supporting the specimen 50 which include the carrier/motion control 14 and a chuck for supporting the specimen 50. The fully configured prober with chuck, probe card adapter, six or more programmable manipulators, stage and platen translation and measurement signal paths could require one hundred and twenty-six (126) or more feedthrough connections for the system requirements. At least five signal paths are used for stage surface and probes, and as many as are needed are used for probe card based connections. Kelvin probes and probe holder configurations may double the number of interconnections.

With reference to FIG. 2 and FIG. 3A, once the chamber top 28 is raised, it may be rotated out of the way such that optical microscope 70 may be moved into position over the wafer chuck 14 by sliding it on the microscope bridge 71 to facilitate the initial positioning of probes over the DUT 50 in the area of interest to the user. This is done to decrease the time spent locating areas to be probed on the DUT 50 once the system is under vacuum. Having completed this, the optical microscope 70 can be positioned out of the way so that the chamber top 28 may be lowered into place. There may be two tapered pins (not shown) that will drop into bushings appropriately placed such that the chamber top 28 with SEM column 12 may properly align with the chamber wall 27 perfecting a seal. Further, the chamber top 27, by means of the alignment pins, should ensure that the SEM column 12 will be properly positioned amidst the probes 24 and manipulators 18–23.

With the SEM embodiment of system 10 described above, hot cathode electron emitter techniques may be used, however an alternate embodiment of the system 10 may use field emission, as discussed above. Field emission provides improved image quality with much less potential for damaging the specimen 50.

Within the chamber 26, there is a motorized X-Y prober platform 46 which will support all of the normal prober functions as described below. The purpose of this platform 46 besides being a support structure is that of translating all of the prober functions in unison to simulate the typical microscope translation found on most probing stations today. The X/Y translation provided by the platform 46 facilitates large area DUT 50 viewing without disturbing the probes 24. Since the microscope column 12 cannot move easily independent of the stage, platen 25, and manipulators 18–23, moving the platform allows the user to scan the DUT 50 for sites to probe or to check the position of each probe or all of the probes provided by a probe card, which is an approach unique to this function.

Below the platform 46 and between the platform and the bottom of the chamber 26 is a mechanism used for tilting the platform in the "Z" direction vertically with the motorized tilt axis 15. This mechanism allows the platform 46 to be tipped or tilted along either the "X" or "Y" axis to allow the user to observe the probe 24 making contact with the DUT 50 from an angle other than vertical. The motorized tip and tilt functions improve the probe-viewing angle. This aids the user in "seeing" touchdown of the probes 24 on the DUT 50 on very small DUT structures. Thus, the tip/tilt functions provided by the motorized tilt axis 15 with the platen 25 allows vertical movement for alternate views of the probes 24 and probe positioning on the specimen 50.

Attached to the platform is an X-Y stage 17 with Theta adjust provided for the stage 17 for the chuck 14. Also attached to the platform 46 is the "Z" platen 25 which supports both fixed probe cards and manipulators. The platen is motor driven in the "Z" axis such that either fixed position probe cards and/or single probes may be raised and lowered simultaneously. This controlled motion provides for probe and probe card "Z" positioning. The platen 25 may be used to simultaneously raise the manipulators and move a fixed position probe card which may be used.

The method of DUT 50 attachment to the wafer chuck 14 is by mechanical means because vacuum, as a method of hold down, will not work in a vacuum chamber. Thus a spring clip arrangement which secures the wafer to the chuck is used. The wafer 50 sets into a slight depression with alignment pins for registration with the notches or flats typically found on most wafers today.

The multiple motorized/programmable micromanipulators 18–23 sit on top of the platen 25. The supplied drawings indicate six of these devices. While six is likely a practical limit, any number may be used to direct probes into contact with the DUT as required.

The scanning electron microscope 12 is coupled to the computer system 16 with a scanning electron microscope interface 30, which may be used with CAD navigation software. The computer system 16 thus communicates via the bus 28 to the scanning electron microscope 12 through a SEM interface 30 which includes means for acquiring the image.

The computer system 16 may include a first computer 32, such as a general purpose personal computer (PC) configured as a digital image processor for acquiring the images from the scanning electron microscope 12. The computer system 16 may also include a second computer 34 for remotely controlling the plurality of probes 24 via the motorized manipulators 18–23 which are remotely controlled by the computer 34. Alternatively, the computer system 16 may be a single PC or server which performs control operations for both the prober functions and the microscope functions. The computer system 16 may also include two computers and three monitors. In a prototype version, all of this could be accomplished with a single computer and monitor. It was found however that having two monitors, one for high-resolution viewing and one for all of the system control and navigation functions was advantageous in the described embodiment.

Separate video display units (VDUs) 36 and 38, which may be provided as conventional PC computer monitors, are used for displaying high resolution microscope images and computer graphics relating to the SEM 12 and probes 24, respectively. The VDUs 36 and 38 are used to visually assist a user in remotely controlling the plurality of probes 24 for placement on the specimen 50 by acquiring the images which convey information to the user relating to particular integrated circuit surface indicia corresponding to the exposed electrically conductive terminals of the specimen 50.

The Micromanipulator Company, Inc. pcProbeII™ software (PCPII) is used with a Windows™ based personal computer and provides functions such as auto planarity compensation, auto alignment and setup which automatically guide the occasional user through the process of getting ready to probe. Manual controls 40 (e.g., mouse and/or joystick), are also used by the user to control the plurality of probes 24 being placed on the specimen 50. An electrical test signal probe interface 42 is coupled to the probes 24 for applying the electrical test signals to the specimen 50. Alternatively, the plurality of probes 24 may be provided as a fixed position probe card for applying the electrical test signals to the specimen 50.

The PCPII probe software used with the computer system 16 provides a probe positioning system having control capabilities in the form of a simplified intuitive icon-based tool kit. The PCPII probe software is designed in a modular format allowing for wafer mapping, die and in-die stepping, multiple device navigation options and probe touchdown sensing. The PCPII probe features include on-screen video with an active navigation control, advanced alignment and scaling functions and programming through wafer map, interactive learning and matrix mode. The PCPII probe navigation software supports Windows, DDE, RS-232 and GPIB interfaces. The PCPII probe navigator module provides interactive device management for controlling four or more manipulators 18–23, the platen 25, and the microscope 12.

While analyzing the specimen 50 using the probes, the navigator display shows the position and control information for the active specimen device. The navigator module also provides system operation data and probe touch-down parameters. The wafer mapping module provides a continuous visual indication of the die selected, and displays the exact coordinates of the die specimen. The PCPII probe software also includes a video module for imaging of the specimen 50 with the personal computer. Each PCPII module uses a separate application window, which allows the user to tailor the viewing screen by defining the placement of each module and minimizing or maximizing each window individually.

Environmental controls 44 (FIG. 1) are provided for, among other things, controlling the temperature and for generating the vacuum in the inner enclosure 27 of the chamber prober housing, for operating the scanning electron microscope 12, and for analyzing the specimen 50 under controlled environmental conditions in a vacuum. The environmental controls 44 may include, e.g., first as with most E-beam optical systems, magnetic shielding without which, the beam may not be properly collimated for proper resolution. Second, as the wafer probing area is completely enclosed by metal, the user will experience significant electromagnetic shielding characteristics that are an improvement over current conventional probe stations.

An additional layer of insulator with a metalized surface may be employed for shielding the chuck surface 14 and provides a low noise environment. Additionally, the use of isolated coax connections will allow for triaxial measurements when the chamber is connected to ground. Next, because the probing function occurs in a vacuum, frost formation during low temperature probing applications may be nonexistent. Since little air is present, probes will not oxidize during ambient and elevated temperature applications. Finally, a thermal chuck employed with system 10 provides that the DUT may be tested at temperatures above and below ambient.

A bench style table was used for supporting the VDU monitors, keyboards, mouse and joystick. The chamber for a 200 mm system is on the order of about 2'×2'×1'+/− and approximately 3'×5'×1' for a 300 mm system. The pumping elements for the larger chambers may require additional space.

Figure 4:
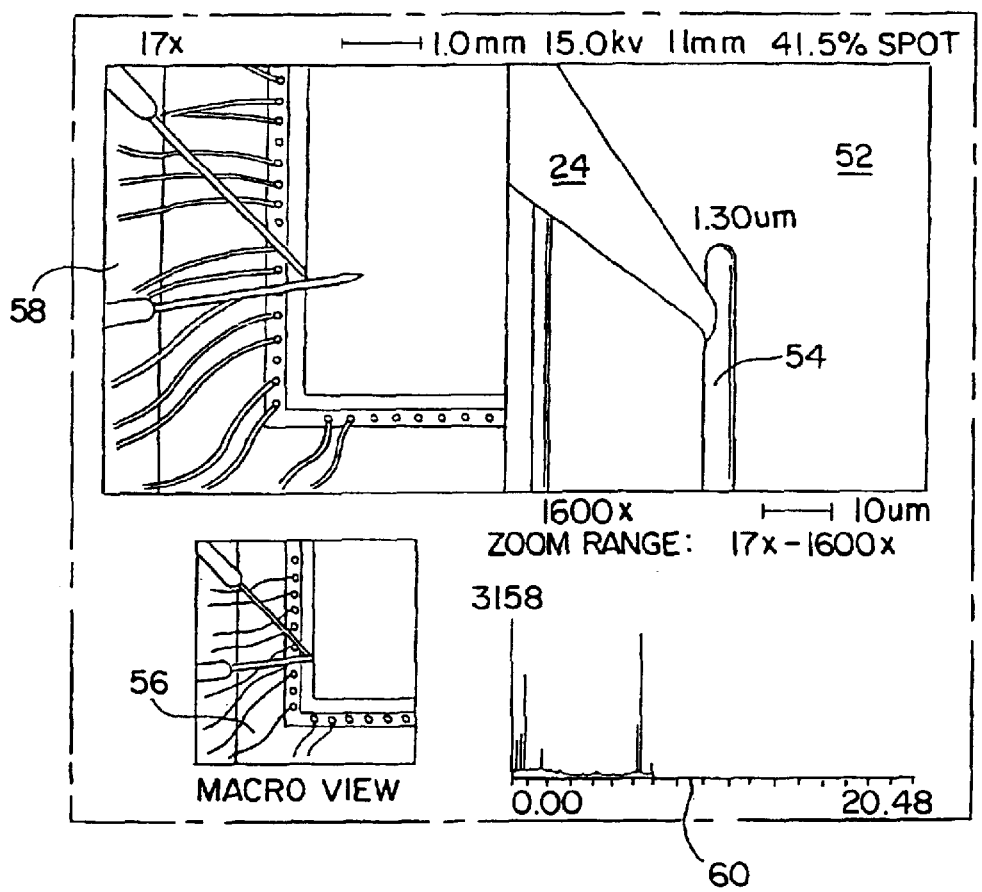
FIG. 4 is a SEM photograph showing probe positioning providing electrical test signals to an integrated circuit specimen showing the specimen surface indicia and plural probes.

Turning now to FIG. 4, in which a SEM photograph is shown with multiple views 52, 56 and 58 of probe 24 positioned on the specimen 50 at an exposed electrically conductive circuit path 54 as a method of providing the electrical test signals at the integrated circuit. The method of analyzing the integrated circuit specimen 50 includes acquiring the image identifying conductive path indicia of the surface of the specimen from the scanning electron microscope 12, which is driven in a preferred embodiment by the PCPII software interface. The PCPII navigation software facilitates the process of positioning the probes 24 within the high resolution image of the specimen 50. Thus, the image acquiring step is used to identify the electrically conductive terminals from the conductive path indicia 54 on the surface of the specimen 50 observed with the scanning electron microscope 12 for positioning the plurality of probes with the step of remotely controlling the plurality of probes, as discussed above. The lowest magnification view is item 56, the intermediate magnification view is item 58, and the highest magnification view is item 52. The reason for the three views is to assist the operator in maintaining a good viewpoint of where they are working.

Another form of the high resolution analytical probe station or system is shown in FIGS. 5A–K, and is generally designated with reference numeral 100. As discussed above, the system 100 is capable of being used in applications where traditional optical (or light) microscopes cannot be used due to the size of the specimens being examined, (e.g., applications which require resolutions that are incapable of being reached by light microscopes). The need for higher resolution probe stations, such as probe station 100, is a result of the electronics industry's drive towards smaller and more complex components, (e.g., the need to conduct low current/low voltage probing at sub-micron levels). Unfortunately, high resolution microscopes such as electron or ion microscopes 104 including SEMs and FIBs are typically much more costly, and are heavy and inconvenient to move about. The high expense of these microscopes makes it more desirable to minimize the amount of movement and handling of the microscope. The probe station 100 herein minimizes the amount of movement of the microscope by mounting the microscope to a portion of the probe station housing 102 that is fixed during probe positioning procedures and probing itself and by primarily moving the specimen or device under test (DUT) 118 instead of the microscope 104, (e.g., thereby simulating movement of the microscope). It should be noted that while the microscope 104 can be fixed, it is also possible to enable small or fine movements thereof for positioning it properly relative to the portion of the DUT to be probed. In this instance, it is still the movement of the chuck probes that is primarily used to orient the microscope 104 for viewing the portion of the DUT that is desired to be probed.

More particularly, the probe station 100 minimizes the handling of the microscope by having the high resolution microscope mounted to the cover 194 of the probe station 100 and using a lift mechanism 196 (FIG. 5B), such as a pneumatic or hydraulically driven lift as described more fully hereinafter, to raise the cover 194 of the probe station 100 up and away from the inner probe station chamber so that specimens can be adjusted, replaced, and/or viewed without the high resolution microscope. Furthermore, with the cover 194 open or retracted away from the inner chamber 190, a system operator can conduct additional probing and/or setup, using light microscope 105. More particularly, the light microscope 105 would be positioned above the DUT 118 by sliding the microscope 105 along the microscope bridge so that the system operator can use this microscope to view the DUT 118. Thus, system 100 allows for both light microscope probing and high resolution microscope probing.

The probe station 100 also provides a highly integrated approach to isolating the testing area from outside influences. Guarding and/or shielding configurations are readily provided depending on what is necessary for obtaining accurate results given the low level current and voltage measurements that may need to take place, such as those having sensitivities in the high attoampere ($10^{-18}$) and the low femtoampere ($10^{-15}$) range. For example the housing 102, microscope 104 and probe assembly 106 of the probe station 100 can all be wired in a coaxial or triaxial configuration in order to reduce noise and thereby allow the accurate taking of such sensitive measurements, as will be discussed in further detail below.

The probe station 100 generally includes a probe station housing 102, high resolution microscope 104, and several probe assemblies 106, such as the four assemblies shown in FIGS. 5A–K. The housing 102, as shown in the preferred form in FIG. 5H, has a double-walled construction, or alternatively may have a single wall construction with an insulated metallic coating applied thereon to allow different guarding and/or shielding configurations to be applied thereto. In the double-walled configuration, the system 100 has an outer housing 108 and an inner housing 182. The housing 102 provides a vacuum chamber 190 in which the probe assemblies 106, carrier 250, platen 258, and specimen 118 are disposed. Accordingly, by having two layers of conductive walls that enclose the chamber 190, the testing area is further isolated from external noise sources by the guarding/shielding configuration in which the housing walls are arranged. To that end, the walls of the respective outer and inner housing portions 108 and 182 of the probe station housing 102 are electrically insulted from each other as by a gap 191 therebetween which optionally can be filled with insulative material to further insulate the housing portions 108 and 182 from each other. In the form shown, the gap 191 is maintained via standoff insulators or housing isolators 192.

More specifically, the housing outer portion 108 has a base wall 112 and an outer side wall 114 upstanding therefrom. At the upper end of the side wall 114, a top cover wall 110 is attached to complete the structure of the outer housing portion 108.

In many low current/low voltage probing applications, the DUT 118 has an increased sensitivity to noise, such as light, electrical interference, air contaminants and vibration. For example, some of the wafers manufactured today for integrated circuits are so small and sensitive that simple exposure to light can induce a current in the circuitry of the wafer 118. Such noise can distort low level test readings or probe readings taken from the wafer unless the light/noise is substantially removed. Thus, the outer housing portion 108 of housing 102 serves as a first barrier for noise reduction by reducing, if not eliminating, many of the traditional elements of noise such as the amount of light that is allowed into the internal space 190 of the housing 102.

Inside the outer housing portion 108, walls of the inner housing portion 182 corresponding to the walls 110–114 of the outer housing portion 108 are provided. As mentioned, alternatively these can be metallic layers applied to the inside surfaces of the walls 110–114 and insulated therefrom. The walled inner housing portion 182 includes a bottom wall 186 adjacent the base 112, top wall 184 adjacent the cover 110, and side wall 188 adjacent side wall 114 and extending between the top and bottom walls 184 and 186 with the corresponding walls separated by gap 191, as previously mentioned. Either the outer housing walls 110–114 or the inner housing walls 184–188, or both, cooperate to form the vacuum chamber 190 of the housing 102 and thus either set of the walls 110–114 and 184–188 where formed as separate members may have a vacuum-type seal therebetween such as between the top wall 184 and the upper end of the side wall 188, as described further herein. The provision of the vacuum enclosure 190 in which the test area is disposed is desirable due to the preferred high resolution or electron microscope 104 employed herein. In this manner, an environment substantially free of gas particles or molecules that could affect the path of electron beams from the electron microscope to and from the target DUT is provided.

The housing 102 has through openings 142 to allow vacuum pump 115 to be connected thereto for drawing down the pressure in the chamber 190 to vacuum conditions. In FIG. 5H, it is shown that the openings 142 extend through the bottom walls 112 and 186 of the housing 102. In the embodiment shown, another vacuum pump 116 is connected to the high resolution microscope 104. Such a configuration allows the microscope 104 to be run at a different vacuum pressure than the chamber which can reduce the amount of surface charging that occurs within chamber 190 due to the presence of an electron beam from microscope 104. For example, if the vacuum within the microscope column is at a pressure of $10^{-6}$ Torr, and the vacuum within chamber 190 is at a pressure of $10^{-5}$ Torr, a degree of environmental conductivity is created which increases the amount of time it takes to charge the various surfaces within chamber 190 and/or provides a means for dissipating surface charges by bleeding the surface charges created by the beam off of the surfaces in the chamber 190. This is beneficial for a variety of reasons, including the fact that dissipation of surface changes and/or hindering surface charges from occurring reduces the chance that such charged surfaces will interfere with the probing as measurements are taken by system 100. For example, by hindering a surface within the environment from changing, that surface is less likely to generate noise or interference within the chamber 190. This is particularly important when low voltage/low current measurements are being taken therein as they can be influenced or distorted by even the slightest form of noise/interference. In practice, a vacuum state can be reached in the illustrated probe station 100 in approximately three minutes. As is apparent, this time period can be changed by altering the size of the enclosure 190 and/or the capacity of the vacuum pump.

In order to reduce if not elements the amount of noise such as vibration experienced in chamber 190 due to the operation of vacuum pumps 115 and 116, the vacuum pumps are mounted to the housing using a vibration coupler which absorbs noise generated by the pumps 115 and 116 and allows the pumps to move freely so that they may vibrate as needed. Additional steps for reducing the amount of vibration noise experienced within chambre 190 instruct the use of the vibration isolation table shown in FIGS. 5A–C. This table contains isolators 117 located between the table top and the leg. Furthermore, the housing 102 is suspended from a circular opening in the table top via additional vibration isolation arms not shown, which acts as additional means or backup means of vibration isolation.

Through openings are formed in sidewall 114 and aligned with corresponding inner sidewall through openings to provide access openings or feedthroughs 119, 121, 122, 123, 124, 125 and 127 in the housing 102 from the housing exterior to the vacuum chamber 190. These through openings can be used for running leads 120 from an external controller 576, such as a computer, into the housing 102. In this way, the probe assemblies 106, actuators for the carrier 250, and other system utilities (e.g., environmental controls, motor drives, etc.) can be remotely controlled externally from outside the vacuum chamber 190 in which these components are operable. The leads 120 can be in the form of electrical cable (e.g., coaxial, triaxial, ribbon, etc.), wiring or conduit for wiring, hydraulic fluid lines, or the like.

Figure 5A:
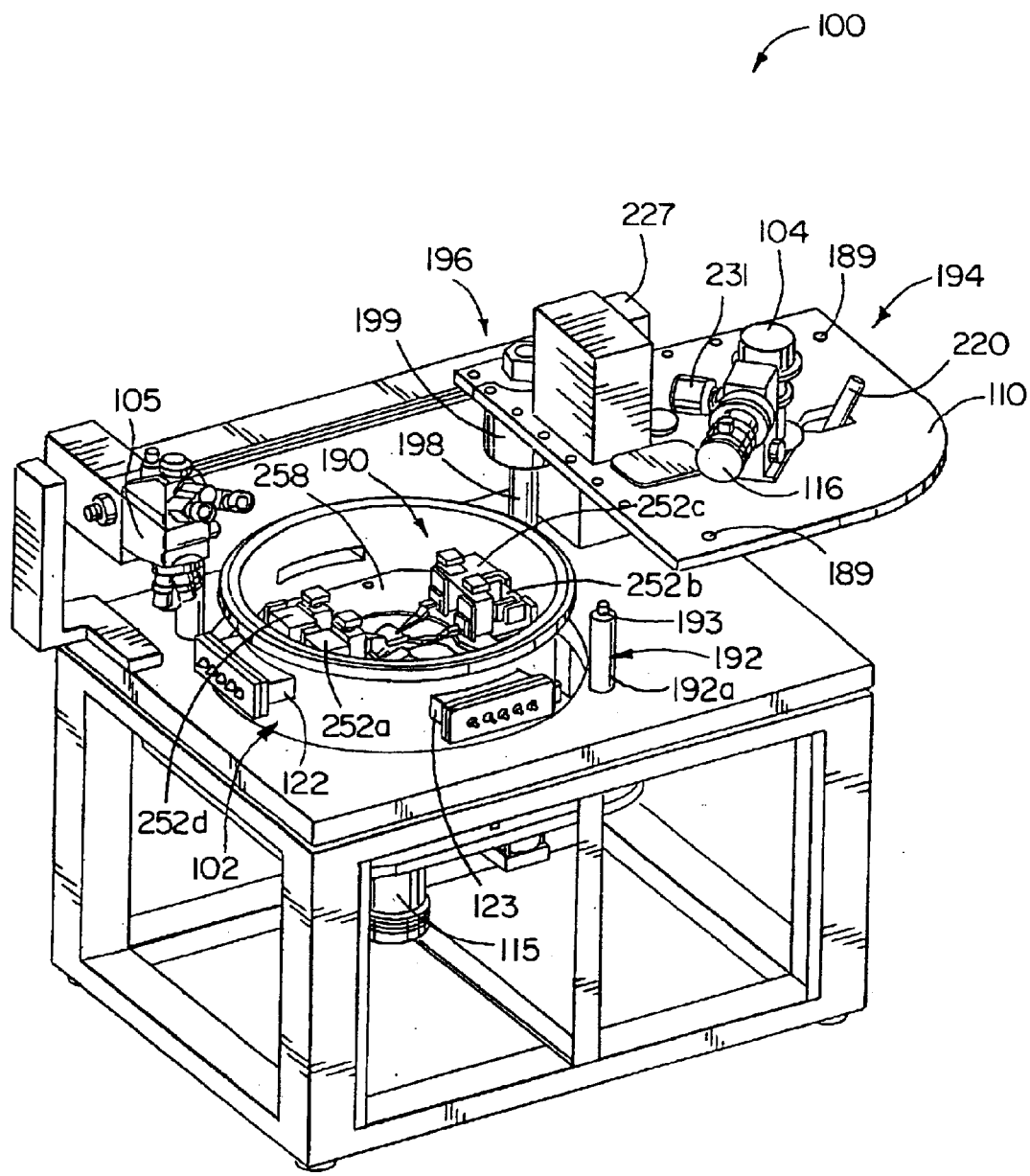
Figure 5C:
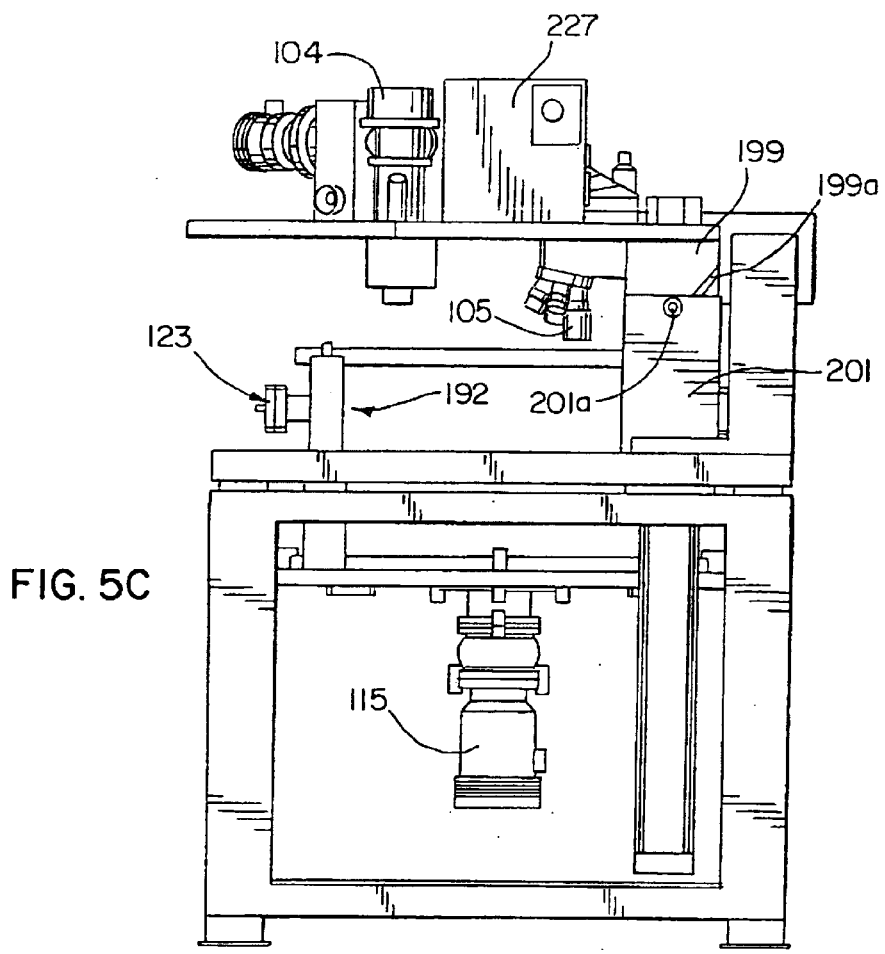
Figure 5D:
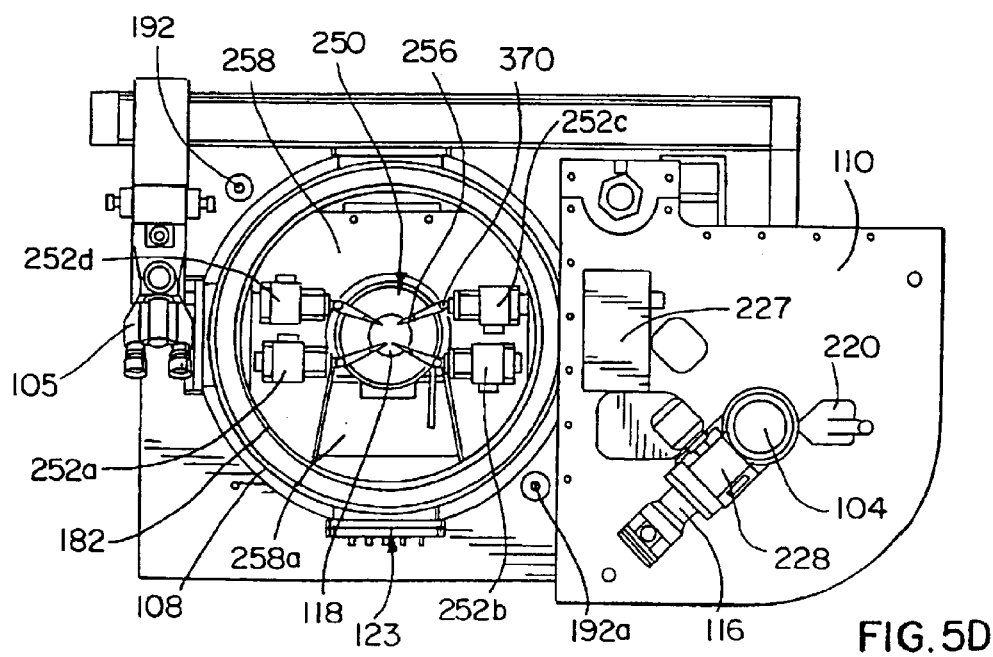
Figure 5E:
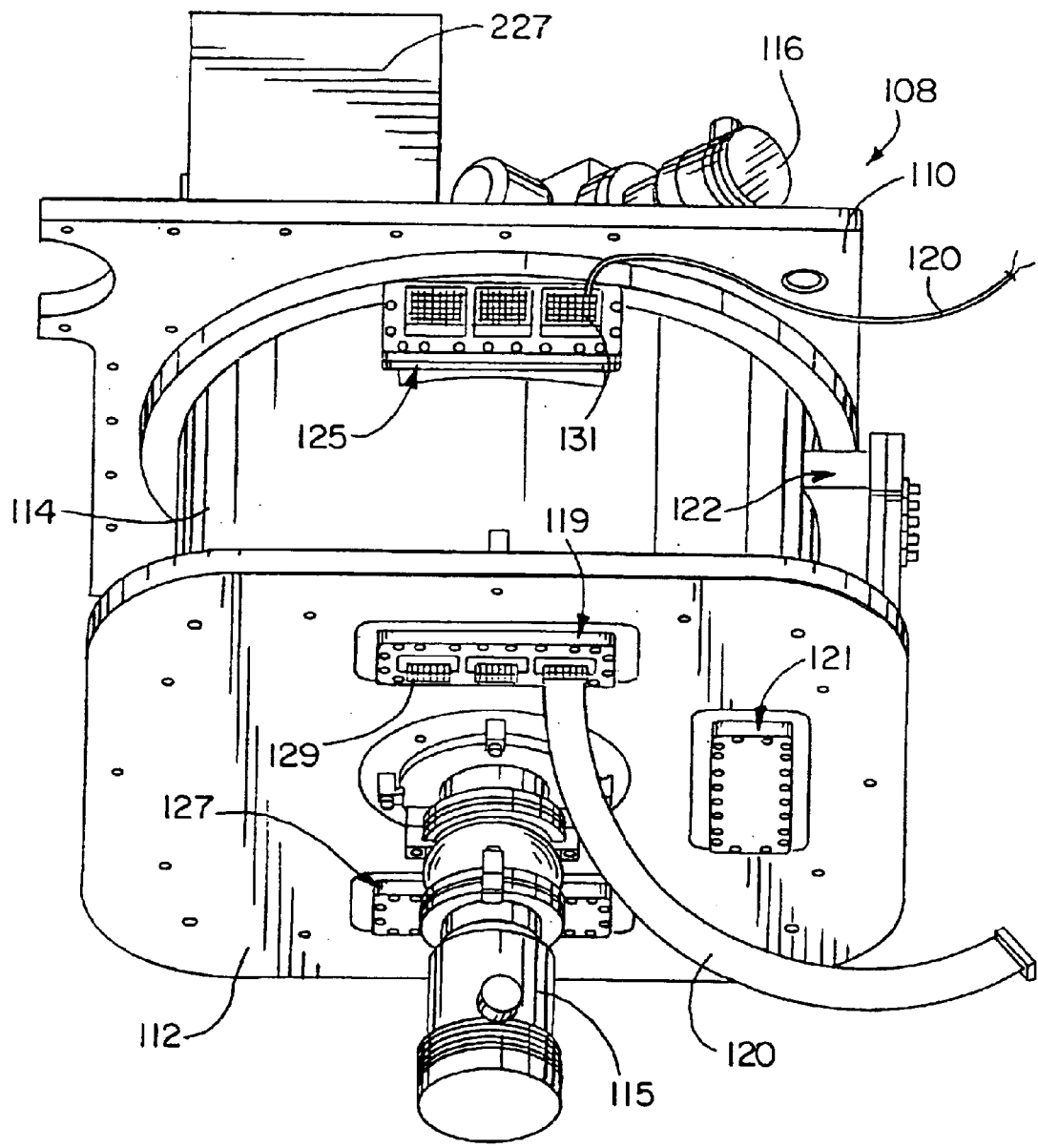
Figure 5F:
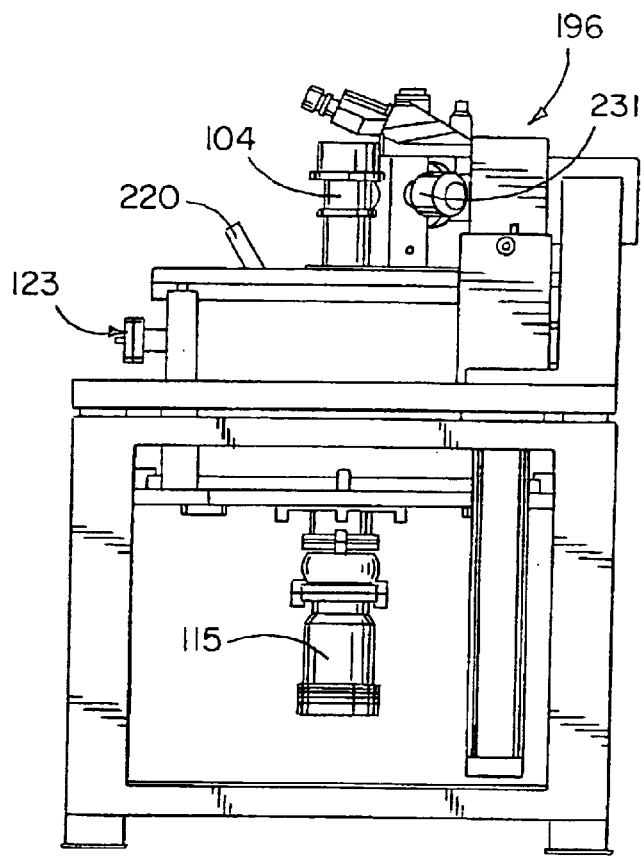
Figure 5H:
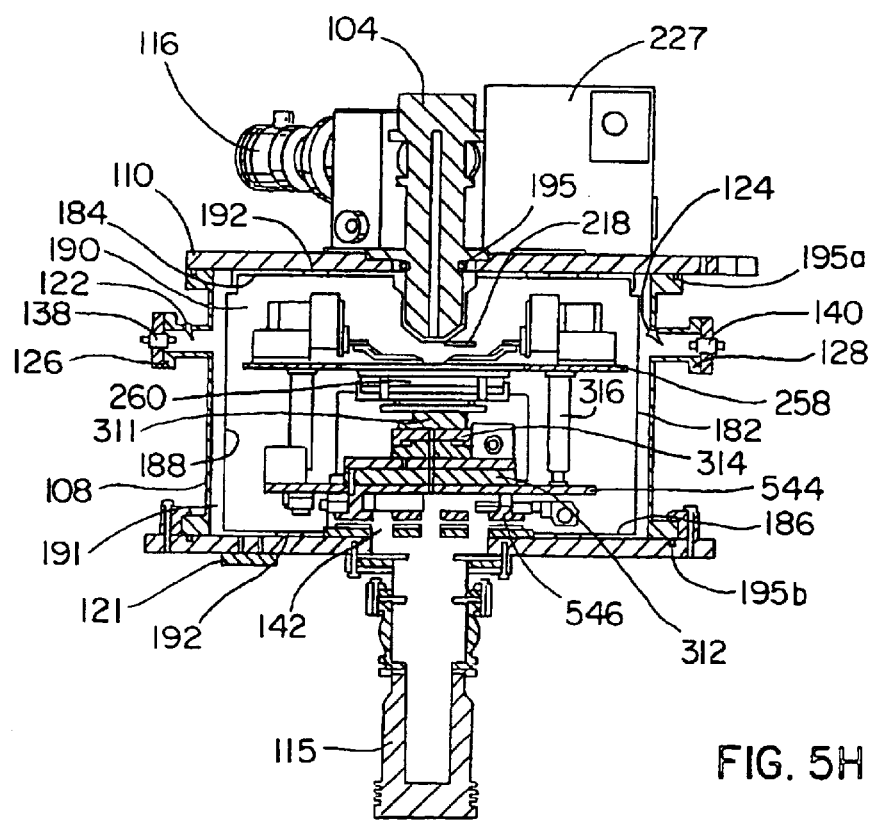
Figure 5G:
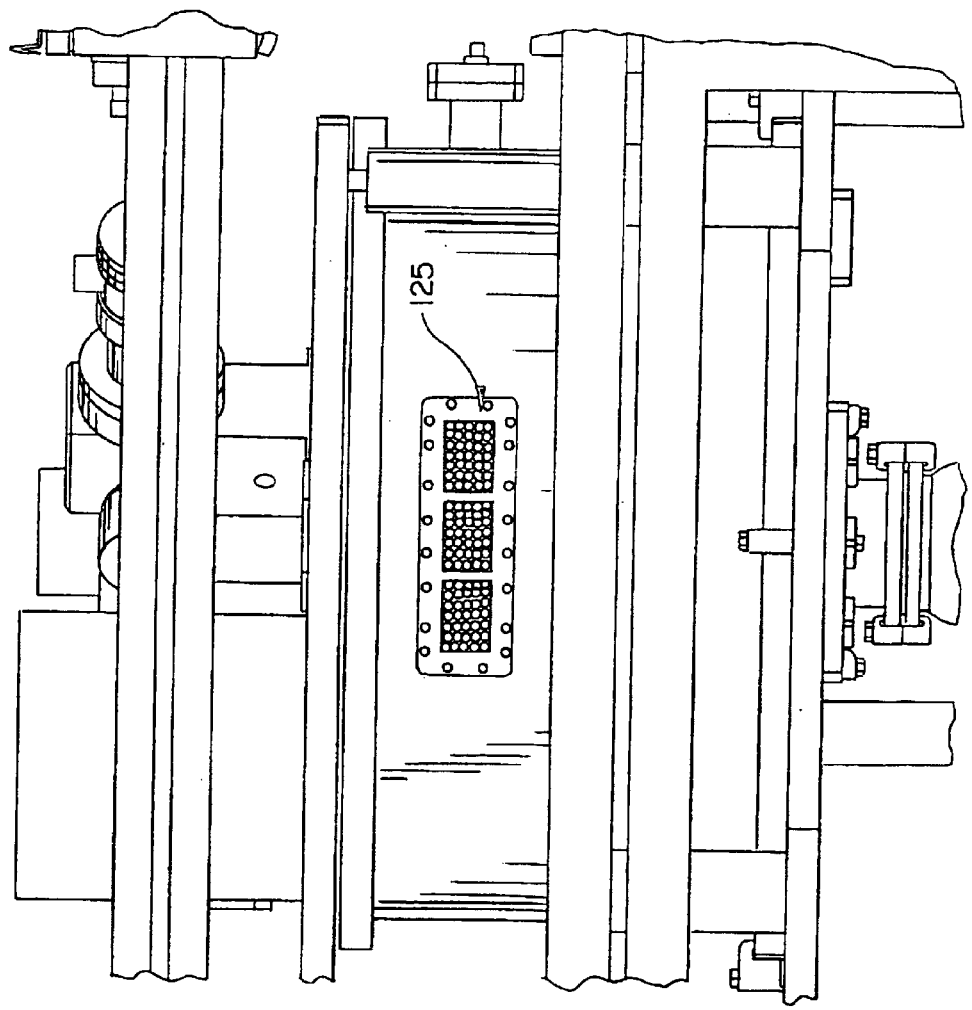
Figure 5I:
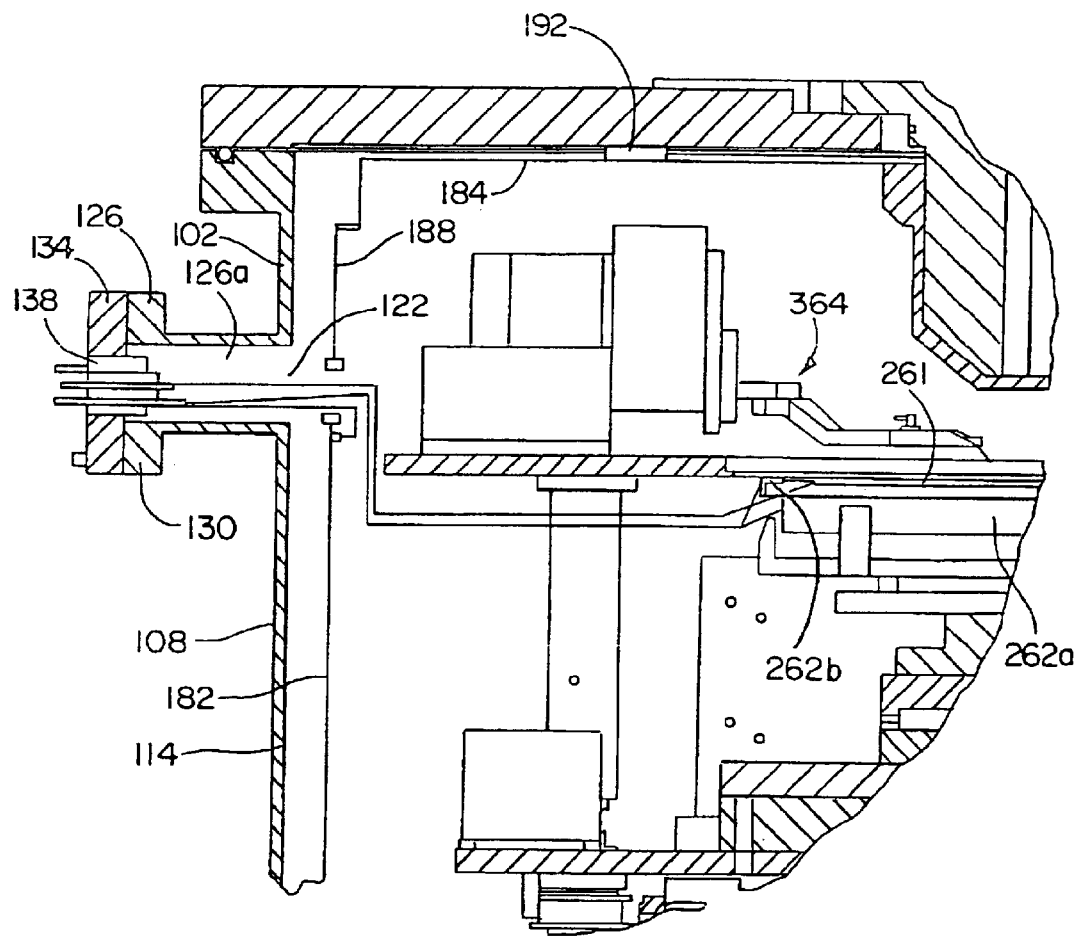
Figure 5J:
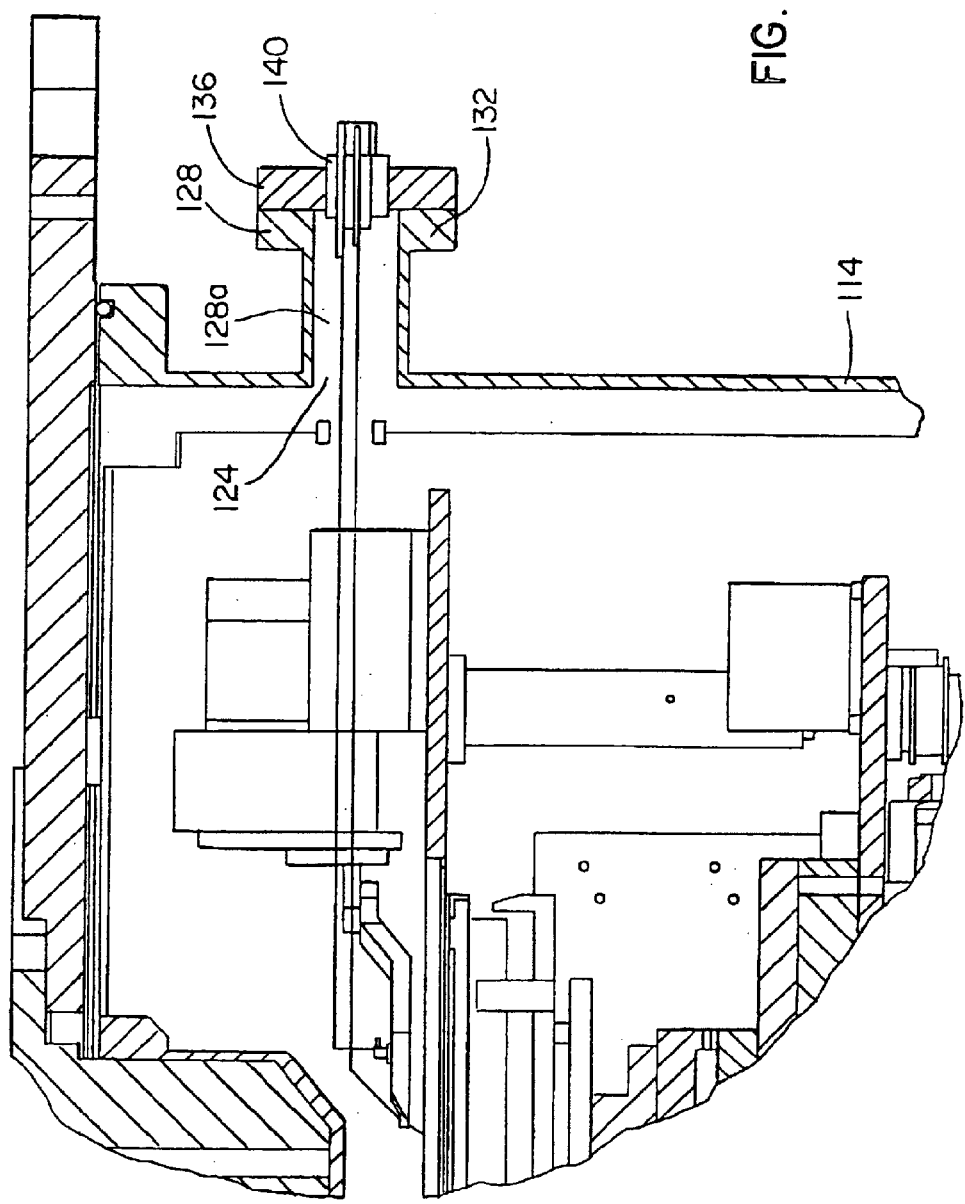

The feedthroughs can include flanged connector mounts 126 and 128 schematically shown in FIGS. 5H–J that are secured in the openings 122 and 124 and which include respective passages 126a and 128a extending outward from the sidewall 114 and into which electrical connectors 138 and 140 are secured. The mounts 126 and 128 have radially enlarged flanges or end portions 130 and 132, respectively, to which end caps 134 and 136 are mounted for sealing each passage about the connectors 138 and 140. In this regard, the end caps 134 and 136 can be drilled out to form central openings 134a centrally aligned with the respective passageways 126a and 128a to allow the connectors 138 and 140 to be inserted and mounted therein. Accordingly, access from the exterior of the housing through the passages 126a and 128a and to the interior vacuum chamber 190 is provided via the connectors 138 and 140 which are attached to the end caps 134 and 136. The connectors 138 and 140 allow leads to be passed from the exterior of the housing into the inner enclosure 190 while maintaining a vacuum-tight seal so that the vacuum state can be achieved within the housing 102. Accordingly, the preferred feedthroughs herein include the flanged access ports 126 and 128 and attached electrical connectors 138 and 140, although it will be apparent that other feedthrough constructions may be employed.

The end caps 134 and 136 form a vacuum-tight seal with the flange portions 130 and 132 as by a sealing ring or rubber grommet compressed therebetween for substantially preventing leakage from the ports 126 and 128. The flanged end portions 130 and 132 may be fastened to the end caps 134 and 136 via fasteners such as nuts and bolts which, when tightened, draw the end caps and flanged ends tightly against the rubber grommet and into compression to create a vacuum-tight seal between these components of the housing 102.

As will be appreciated specific configurations of the connectors 138 and 140 can vary significantly. In the preferred form, BNC/coaxial, triaxial, conduit and piping connectors are used as feedthrough connectors 138 and 140.

Figure 6:
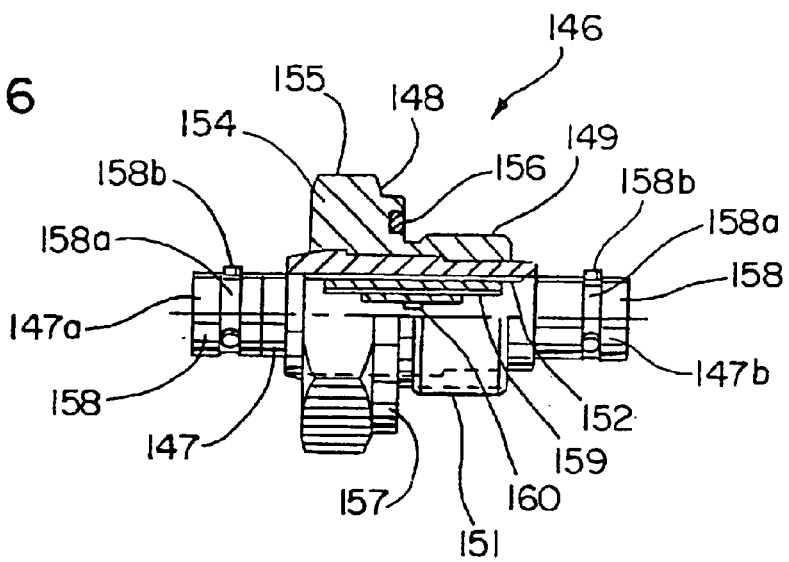
FIG. 6 is an elevational view, in partial cross-section, of a triaxial electrical connector which may be used for the feedthroughs mounted to the vacuum chamber.

For example, in FIG. 6, a triaxial-type connector 146 is shown for being fitted to the end caps 134 and 136 and respective end caps 134 and 136 in sealed relation thereto. The connector 146 includes an inner elongate triaxial shank 147 having an outer sleeve 148 adhered thereon as by epoxy. The sleeve 148 includes a threaded portion 149 having external threads 151 formed thereon. A stepped flange portion 154 of the sleeve 148 has a polygonal driving surface 155 for turning of the sleeve 148 and shank 147. An O-ring seal 156 is seated in a forwardly opening recess 157 formed in the sleeve flange portion 154 so that with the shank 147 inserted into the passageways 126a and 128a, the ring seal 156 is adjacent to or engaged with the outer sides of the respective end caps 134 and 136. An internally threaded jam nut (not shown) is screwed onto the external threads 151 of the threaded portion 149. The jam nut can be advanced axially along the sleeve 148 toward the flange portion 154 with appropriate turning of the nut. To compress the ring 156, the jam nut is screwed into engagement with the inner surface of the end caps for drawing the ring 156 into tight, clamping engagement with the caps 134 and 136.

The triaxial shank 147 has bayonet-type detent couplings 158 with annular grooves 158a and biased balls 158b seated therein provided at either lug end 147a and 147b thereof for being releasably connected to mating triaxial male connectors (not shown provided on external and internal leads 120a and 120b, respectively). To this end, the shank 147 has an outer shield conductor portion 152 and an intermediate guard conductor portion 159 spaced radially from shield portion 152 and insulated therefrom for being electrically coupled to corresponding shield and guard portions of lead connectors. A signal conductor portion 160 of the triaxial shank 147 extends centrally and axially within the shield and guard portions 152 and 159 and has a tubular construction for forming a female socket into which a corresponding male signal conductor of the lead connector is press fit. Once coupled, the shield, guard and signal conductors of the mating leads are electrically connected to form a triaxial connection therebetween.

The flanged ports 126 and 128 and attached end caps 134 and 136 are preferably conductive like the outer sleeve 149 of the connector 146. Further, the ports 126 and 128 are mounted to the double-walled housing 102 so as to be electrically connected to the housing outer portion 108. In this manner, the probe station 100 can be grounded via any of the electrically connected outer housing 108, ports 126 and 128, or the shield portions 152 of the electrical connectors 138 and 140. Similarly, the guard portion 159 of the connector 146 can be electrically coupled to the inner housing 182 so that the guard portion 159 and inner housing 182 can be driven to substantially the same potential as the signal line 160 to further isolate the signal from noise and dissipation as well as the vacuum chamber 190 from noise, thereby keeping the test area substantially free from electrical interference for accurate measurements at the low testing levels employed by the probe station 100 herein. As is apparent, common grounding and shielding can be employed for the housing 102 and the connectors 146. In the housing 102 shown in FIGS. 5H and I, the outer housing 108 is grounded (or shielded) and the inner housing 182 is guarded.

Figure 7A:
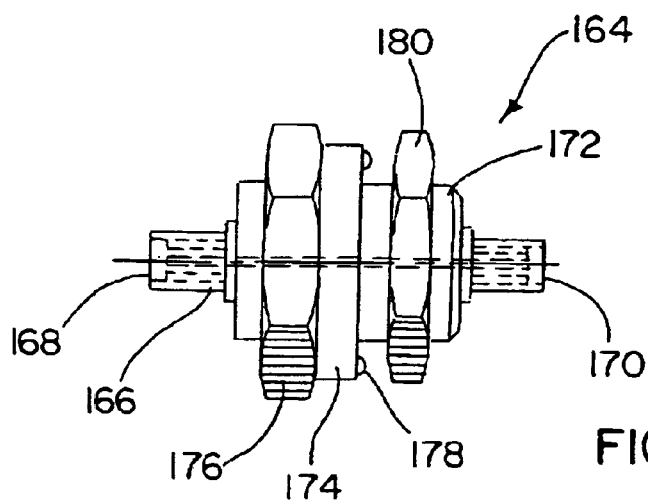
FIGS. 7A–B are elevational views of other connector which may be used for the feedthroughs mounted to the vacuum chamber.

In FIG. 7A, a coaxial-type connector 164 is shown having a coaxial shank 166 for being connected to coaxial connectors (not shown) on lead ends as by sockets 168 and 170 to create an electrically conductive coaxial connection therebetween. The remaining structure of the coaxial connector 164 is similar to the above-described triaxial connector 146. More specifically, the connector 164 has jam nut 180, threaded on a coaxial sleeve portion 172. The sleeve portion 172 further includes a radially enlarged stepped flange 174 having an outer polygonal surface 176 for screwing the sleeve 172 into tight sealing engagement against the end cap 134 or 136 to which it is mounted.

Figure 7B:
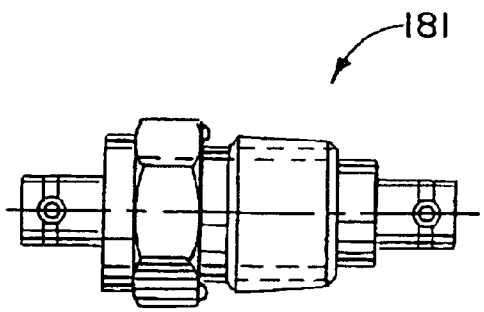
Figure 8:
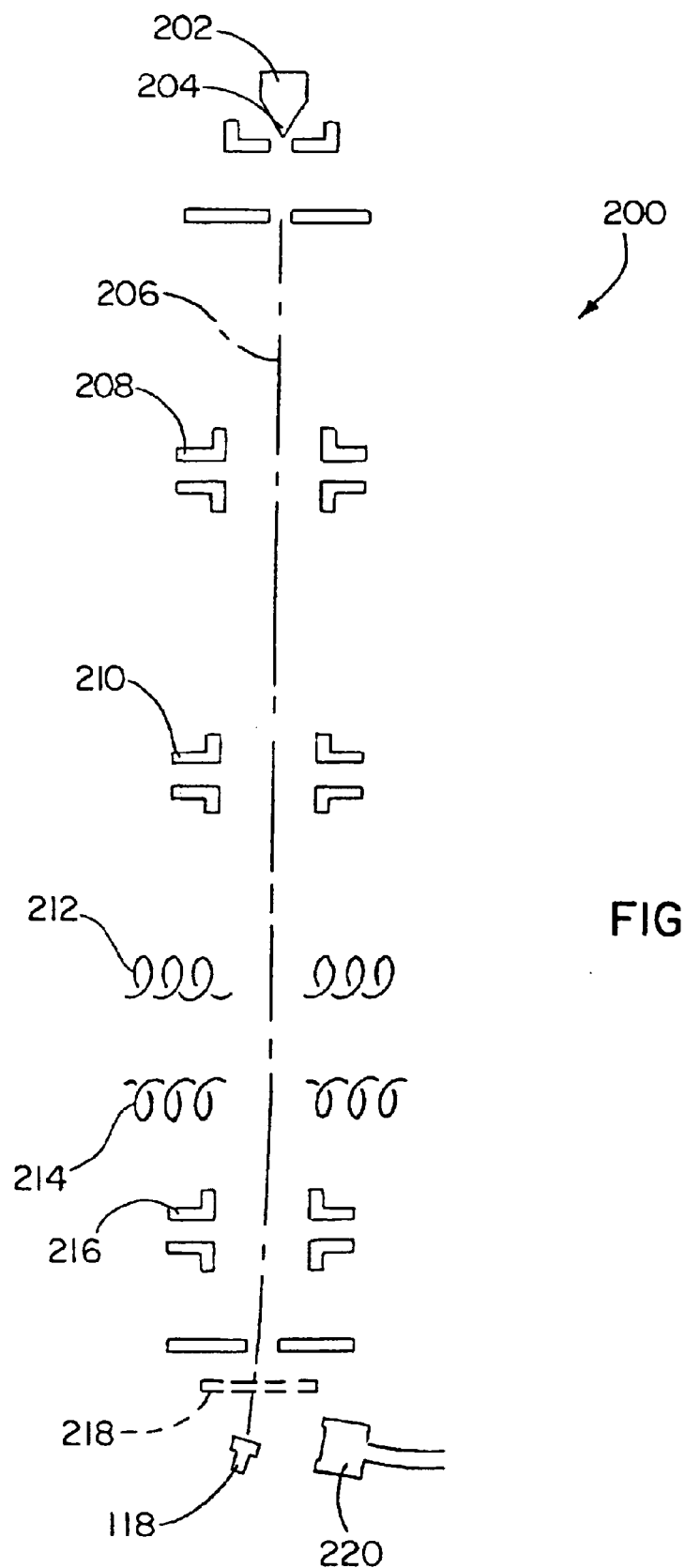
FIG. 8 is a schematic diagram of the scanning electron microscope of FIG. 5.

When mounted to the probe station housing 102, the threaded sleeve 172 is passed through the end cap opening 134a or 136a and the jam nut 180 is threaded onto the sleeve 172 on the opposite side of the end cap 134 or 136. The jam nut 180 is advanced axially along the sleeve 172 toward the flange portion 174 with appropriate turning of the nut 180 until a tight sealing engagement is made between the connector 164 and one of the end caps 134 or 136. As the sleeve 172 and nut 180 are tightened together, the sealing ring 178 is pressed between the flange 174 and the cap 134 or 136 thereby making a vacuum-tight seal therebetween. FIG. 7B is another form of coaxial connector identified generally by reference numeral 181. This connector 181 has a similar configuration to the above-described bayonet-type detent coupling of connector 146, with the exception of having coaxial conductors instead of triaxial conductors, (e.g., a coaxial shank vs. a triaxial shank).

Other forms of connectors may be used for feedthroughs 138 and 140 so long as they are capable of providing a vacuum tight seal capable of allowing chamber 108 to be pulled into a vacuum state. For instance, flat cable such as ribbon cable 120 shown in FIG. 5E may pass through a vacuum-tight connector such as the PAVE-FLEX connector manufactured by Pave Technology Company, Inc. of Dayton, Ohio, in order to connect circuitry from within the vacuum chamber 190 to a controller located outside the housing 102. In this regard, the feedthroughs 138 and 140 may consist of a disc-shaped insert through which a bulkhead is formed for allowing a flat cable to pass through the insert while maintaining a vacuum-type seal about the cable. By way of example and not limitation, the bulkhead may be s-shaped or z-shaped to assist in maintaining the vacuum-type seal and support a variety of cable types, (e.g., coplanar, microstrip, stripline, as well as single-strand, stranded, twisted pair, coaxial, triaxial, ribbon cable, and the like). Vacuum-tight, as used herein, does not necessarily mean that a hermetic seal must be reached, but rather means that the seal developed must be capable of allowing the housing interior chamber 190 to be pulled into a vacuum state. By way of example, but not limitation, the feedthrough electrical connectors 138 and 140 may create a seal that has a helium leak rate of less than $1 \times 10^{-7}$ cc/sec at one atmosphere.

The probe station 100 may be setup so that a bank of feedthrough connectors can be connected to openings 122 and 124, as shown in FIGS. 5A, B, D and E, with each connector being generally aligned in side-by-side fashion. Alternatively, the probe station 100 may be setup with multiple openings and passages, with each opening/passage having its own connector or feedthrough.

Other types of connectors are shown connected to the system 100 in FIG. 5E. With respect to access opening 119, a bank of integrated circuit headers 129 arranged in a three column/two row format is shown, which may provide electrical connections for various system utilities. With respect to access opening 125, a bank of cable feedthroughs 131 is shown to provide cable access to the vacuum chamber. By way of example, such as approximately one hundred and four coaxial cables 120 can enter/leave the housing 102 via connector 131 without affecting the pressure of vacuum chamber 190.

As mentioned, in order for the housing inner portion 182 to be driven as guard while the outer portion 108 is driven as shield, the housing portions 108 and 182 must be electrically isolated from one another. This electrical isolation can be achieved by using nonconductive material to space the housing portions 108 and 182 apart from one another. In a preferred form, nonconductive rod-shaped standoffs 192 are employed which maintain the housing portions 108 and 182 spaced apart from each other by gap 191. However in alternate forms of probe station 100, the nonconductive material can be sandwiched between the housing portions 108 and 182 throughout the probe station 100, or the housing portions 108 and 182 can consist of conductive coatings on a wall of insulation such as in the single walled construction discussed above.

Top wall portions 110 and 184 include aligned through openings within which the high resolution microscope 104 is mounted for observing and assisting in various probe applications. With respect to top portion 110 of housing portion 108, a vacuum-tight seal is made between it and the microscope 104, so that a vacuum can be pulled in the vacuum chamber 190. In a preferred form of probe station 100, an electrically insulative material, such as rubber, is used to form an O-ring 195 (FIG. 5H) which creates a vacuum-tight seal between the high resolution microscope 104 and the top 110 and can also serve to isolate the microscope 104 from the top 110. One reason for electrically isolating the microscope 104 from the top cover wall 110 is to allow the probe station 100 to be connected and/or wired in a variety of fashions. For example, with the microscope 104 electrically isolated from the top 110, either the microscope 104 or the top wall 110 may be connected to ground while the other is connected to a guard signal. This type of configuration may be desired for providing a guarded surface directly above the DUT 118 for creating optimal low noise testing conditions which will be discussed further below. Additional O-rings 195a and 195b are provided for creating a vacuum-tight seal between the portions 110, 112 and 114 of the outer housing portion 108.

Like the top wall 110, top wall 184 of the inner housing portion 182 also has an opening within which the scanning electron microscope 104 can be mounted so that the bottom portion 226 of the microscope 104 extends into the vacuum chamber 190 of the housing 102. An electrically insulative material is preferably used to isolate the metallic casing of the high resolution microscope 104 from the top wall 184. This material may also be used to perfect a vacuum-tight seal between the microscope 104 and top 184, if desired, or may simply be used to provide an additional or back up means for blocking out noise such as light. With such a configuration, the lower portion of the microscope 104 and the top 184 can be driven the same (e.g., both as guard or both as shield) to offer additional noise/interference protection. If both the microscope 104 and the top 184 are always to be driven to the same potential, it is not necessary to electrically isolate these items; however, a benefit to isolating the microscope 104 and the top 184 is that such a configuration allows maximum flexibility as to how the entire probe station 100 can be setup. For example, the probe station 100 may be setup so that neither the housing portions 108 and 182 nor the microscope 104 is driven as guard or shield. Alternatively, the probe station 100 may be setup so that each of the housing portions 108 and 182 and microscope 104 are used differently, such as doing nothing with the outer housing portion 108, connecting the inner housing portion 182 as shield, and driving the microscope 104 as guard. It also is not necessary to make a vacuum-tight seal between the high resolution microscope 104 and top 184. This is because the seal between microscope 104 and top 110 is sufficient to draw down the pressure in the interior of housing 102, (the vacuum chamber 190), to vacuum conditions. It may, however, be desirable to make the seal between top 184 and microscope 104 vacuum-tight to allow for additional housing configurations.

In a preferred form, the outer housing portion 108 is connected to ground in order to reduce the chance of electrical shock to a probe station user, and the inner housing portion 182 and the lower portion 226 of microscope 104 (located within chamber 190) are connected to a guard signal to minimize the amount of parasitic capacitance and EMI by minimizing the number of available conductors surrounding the DUT 118 and probe assembly 106 that can be charged via leakage current and electromagnetic fields. Thus, with this configuration the entire probe station 100 can be setup in a triaxial configuration with the DUT completely surrounded by guard and then shield which minimizes the amount and effect of noise or interference as described above. In another form, the system 100 is configured so that the outer housing 108 and microscope 104 are shielded, and the inner housing 182 is guarded. This setup avoids any problems that may be encountered when connecting the microscope 104 to guard, (e.g., problems with the electron beam encountered when applying a potential to the outer surface of the microscope 104).

As described, the top wall portions 110 and 184 of the outer and inner housing portions 108 and 182, respectively, collectively form a cover 194 for the probe station 100 which carries the high resolution microscope 104 therewith. As discussed previously, the cover 194 may be raised via a lift mechanism 196 so that the top portions 110 and 184 and microscope 104 can be lifted and retracted away from the remainder of inner chambers 108 and 182 and/or the remainder of housing 102. This shifting of the microscope 104 gives a probe station user access to the internal operating components including the probe assemblies 106 located within the chamber 190, and the various leads passing through the housing 102. The lift mechanism 196 may be powered by pneumatics or hydraulics to provide the necessary power to lift and retract the heavy combined weight of the cover 194 and high resolution microscope 104 that it carries.

In the preferred and illustrated form (FIGS. 5C and 23), the lift mechanism 196 includes a power or hydraulic cylinder 197 having an arm or ram actuator 198. A cam member 199 is attached between the arm and cover assembly so that operation of the arm 198 moves the cover 194. The cam member or coupling 199 has an arcuate cam track 199a formed along the side thereof within which a cam 201 a from an upstanding column portion 201 travels. The column 201 is fixed at one end to the surface of a support structure such as table 144, and has cam 201a fixed near its upper end. The arcuate track 199a is configured so that when the arm actuator 198 is shifted to its extended position, the cover 194 is lifted and then simultaneously lifted and pivoted away from the side walls 114 and 188 of the housing 102. In this manner, the microscope is automatically moved from its high resolution viewing position relative to the chucked specimen with the cover 194 seated on the side walls 114 and 188, (preferably in sealed relation therewith as previously described), to a retracted or non-viewing position so that the specimen is no longer in the high resolution microscope's field of view, and the interior of the housing 102 is accessible to an operator for system set-up procedures, additional probing with using the light microscope 105, additional testing, and/or maintenance.

The track 199a can be configured with a short vertical section at the beginning of the track so that the cover 194 travels in a straight up and down (or vertical) direction for a predetermined amount of time right after it starts opening (or just before it finishes closing). Thus, the cover 194 will travel vertically for a period of time prior to traveling in an angular direction upon opening, or for a period of time after traveling in an angular direction upon closing, to ensure that an adequate clearance is provided between the microscope 104 and the remainder of the probe station 100 and particularly the components located within chamber 190 (e.g., probe assemblies 106). A manual override mechanism may also be provided so that the cover 194 can be removed in cases of emergency or in power loss. In a preferred form such an override would consist of a removable crank handle which when inserted and turned, moves the cover 194 to its open position.

Figure 23:
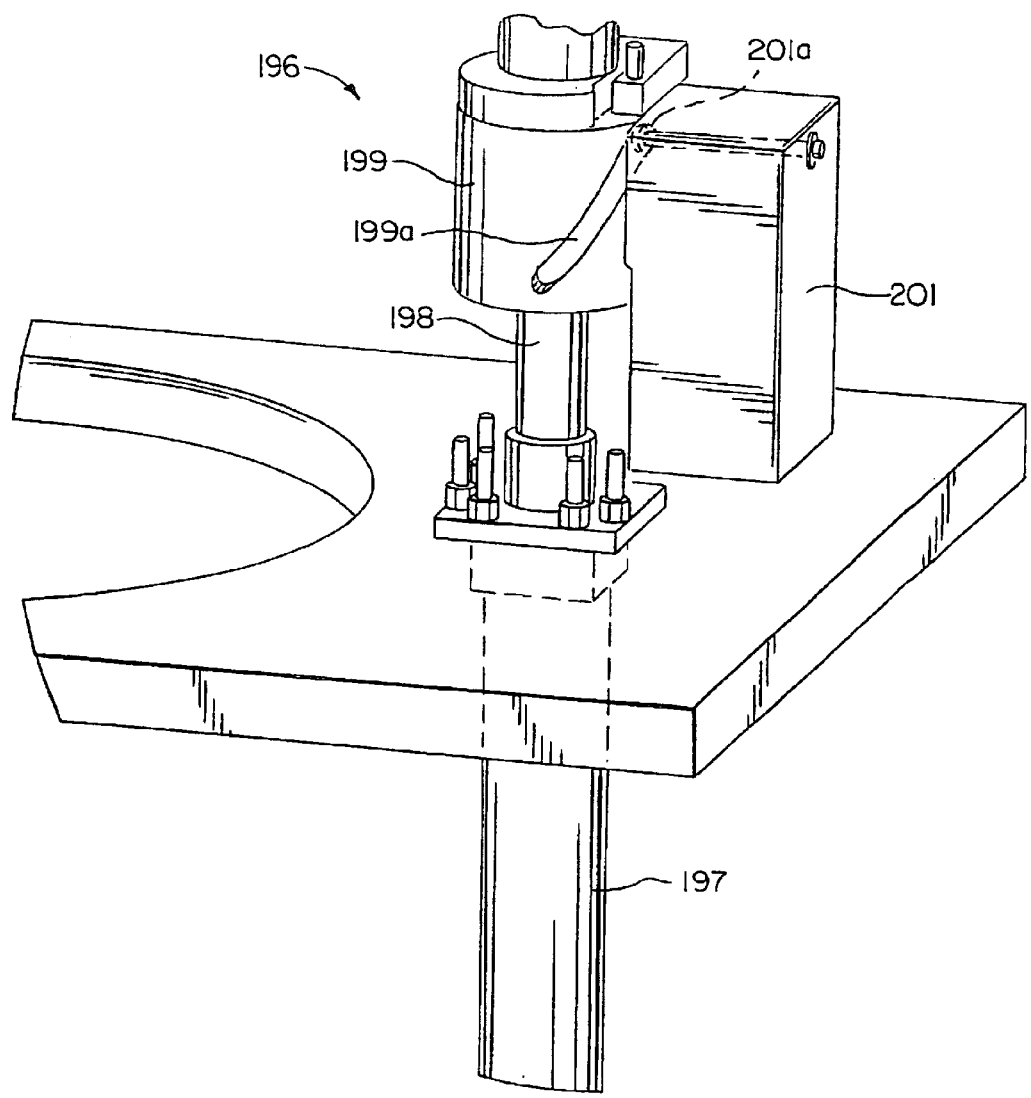
FIG. 23 is a drawing of the lift mechanism showing the hydraulic cylinder, arm cam assembly and track which the system uses to raise and lower the housing cover.

In alternate forms of system 100, the track 199a may be configured so that a period of vertical travel is provided for at the other end of the track 199a as well. Furthermore, the angular movement allows for the cover 194 to be opened/closed in a minimal amount of time. In alternate forms, the track 199a of system 100 may be setup as an angled track, an L-shaped track, or in other configurations providing various paths for the cover 194 to follow during its opening/closing. FIG. 23 illustrates one way in which the cam 201a and track 199a can be configured.

As shown in FIGS. 5A–D, F and G, the housing 102 contains locating members 192 including upstanding columns 192a connected, at their bottom end, to the support structure 144 and having tapered locating pins 193 projecting up from their upper end for ensuring the proper position of the cover 194 before allowing it to complete the last portion of travel required to close or seal the system 100. Such a design is desirable in that the last portion of travel, in which the cover perfects the vacuum seal and the microscope 104 is lowered downward very near the surface of carrier 250, is critical because failure to have proper alignment could damage the microscope 104, probe assemblies 106, and/or DUT 118. For example, if the cover alignment is off, the microscope 104 could damage its lens or damage a probe assembly 106 by coming into contact with one of the probe assemblies 106. Furthermore, such contact could cause the probe assembly 106 to move and damage the DUT 118. In the illustrated form, a properly aligned cover 194 is allowed to complete the last portion of travel required to close the system when the position orienting members 192 and pins 193 are aligned with openings 189 in the cover. More particularly, during the last portion of travel in the downward direction, the tapered pins 193 are inserted into opening 189 so that cover 194 can be completely closed.

Problems during the last portion of travel in which the cover perfects the vacuum seal between cover 194 and housing 102 via O-ring 195b could also result in making the vacuum pumps 115 and 116 work harder then they need to thereby waisting energy and/or prevent the vacuum chamber 190 from ever reaching its desired state or pressure. Thus, by providing locating members 192, the system 100 further ensures that the proper vacuum tight seal will be made when the cover 194 compresses the O-ring 195b against its lower surface and the upper surface of housing 102.

The above-described automated shifting of the microscope 104 between its viewing and non-viewing positions, as well as the position orienting features, are desired because high resolution microscopes are typically very costly, heavy, and inconvenient to move about. In FIG. 7, a schematic diagram of a typical scanning electron microscope (SEM) is shown generally at reference numeral 200. During operation of the SEM, an electron gun 202 emits electrons from a filament tip 204, such as a fine tungsten-wire filament, or from a sharply pointed wire attached to the filament tip 204. The emitted electron beam 206 is focused by lenses 208 and 210 and then deflected over the DUT 118 via upper and lower heavy deflection coils 212 and 214 and lens 216. The image of the DUT 118 is formed by scattering the electrons from beam 206 over the DUT 118 and collecting the electrons via electron collector 220. The denser or thicker portions of the DUT 118 in which the cover perfects the vacuum seal scatter more electrons than the thinner portions and will appear darker. Although the SEM is capable of generating high resolution images of objects with depths of focus that can produce an incredibly accurate three dimensional view of the DUT 118, the intensity of the electron beam 206 can often cause damage to the DUT 118 if left on for too long and/or affect or distort the probe readings taken from the probe station 100 by inducing noise into the system via the energy given off by microscope 104. This fact, however, must be balanced with the fact that longer SEM scanning periods result in higher resolution, noise-free, images.

Ideally, the probe station user would simply shut off the microscope during probing or testing of the DUT 118 in order to avoid any interference generated by the microscope. Unfortunately, however, high resolution microscopes such as microscope 104 can take several minutes to power back up for operation and reacquire (or focus on) the desired image. To improve cycle times and minimize electrical interference that may be generated by a constant "on" operation of the microscope 104 it is preferred that the system include an apparatus for reducing the duty cycle of the microscope 104, (e.g., reducing the ratio of operating time for the microscope 104 to the total elapsed time for the testing of the DUT). This apparatus provides a way in which unwanted irradiation of the DUT 118 can be reduced without having to turn the microscope 104 off. In a preferred embodiment this apparatus may consist of an optional shutter 218 which can block (or blank) the beam 206 of microscope 104 during testing thereby limiting the DUT's exposure while allowing the microscope 104 to continue to scan the DUT 118. In this way, the electron beam 206 is not continuously focused on the testing area during image acquisition procedures. The shutter 218 maybe positioned within the microscope 104 or external to the microscope 104, may take any shape or size, and may be made of any material so long as it is capable of blocking at least a portion of the electron beam 206 from damaging the specimen or DUT 118. For example, the shutter may be a disc located within the microscope that is capable of covering the entire lens 216 of microscope 104 so that none of the beam 206 reaches the DUT 118. Alternatively, the shutter 218 may be a revolving disc, located below microscope 104, with holes or slits located about the disc that block varying portions of the beam 206 as the disc revolves.

The shutter 218 may also be manual, semi-automatic or fully automatic. For example, the probe station 100 may be configured such that the probe station user must manually open the shutter 218 to receive a high resolution image of the DUT 118, or may require the user to manually close the shutter 218 in order to block the beam 206 to prevent damage to the DUT 118. However, due to the frequency with which the shutter must be open and shut in a manual shutter is not as desirable as a semi-automatic or fully automatic shutter. Alternatively the probe station 100 may be configured with a semi-automatic shutter 218 wherein the user has to activate a switch (not shown) indicating that the high resolution image is no longer needed, which in turn activates the shutter 218 to block at least a portion of the beam 206.

The probe station 100 may also be configured with a fully automatic shutter 218 which allows the DUT 118 to be exposed to the beam 206 for a predetermined amount of time and then activates the shutter 218 thereby blocking at least a portion of the beam 206. Since the probe station user only needs to see the microscope image while setting-up/positioning the probes, and does not need the microscope to be imaging (or emitting beam 206) onto the DUT during testing, a preferred form of probe station 100 uses the shutter to blank the beam 206 during testing to reduce the risk of damaging DUT 118 and/or reduce the chance of the microscope 104 affecting the testing/probing results. Thus it is clear that an actual method of operating the probe station 100 in such a way as to limit DUT exposure to beam 206 may be used to further improve the operation of the probe station 100. If desired, the probe station 100 may be setup to caption the last image of the DUT 118 prior to the shutter 218 being activated and/or setup to display the captured image during the time the shutter 218 is activated.

As seen best in FIG. 5, the high resolution microscope 104 of probe station 100 has a generally cylindrical or column shaped housing or casing including an upper portion 222 and intermediate portion 224 projecting upwardly from the cover 194. An electron gun is located in the upper portion 222, lenses and deflection coils in an intermediate portion 224, and a final lense and aperture located in a lower portion 226. As mentioned it is preferred that the microscope 104 include a shutter 218 which contains holes or slits such as every five degrees for reducing the duty cycle of the beam 206 of microscope 104 as discussed above. This configuration allows the probe station user to continually update the microscope image while minimizing the amount of damage to DUT 118. In addition, to further assist in reducing noise within chamber 190 and/or obtaining low current/low voltage readings, the shutter 218 may be configured such that it can be connected to guard or shield in keeping with the feasibility of the system configuration afforded by the present invention and as has been discussed previously. For example, the shutter 218 may be electrically isolated from the microscope 104 so that it may be wired to guard while the microscope 104 is shielded, or the microscope 104 and the shutter 218 may be electrically connected to one another in instances where both items will be connected in a similar fashion.

Figure 5K:
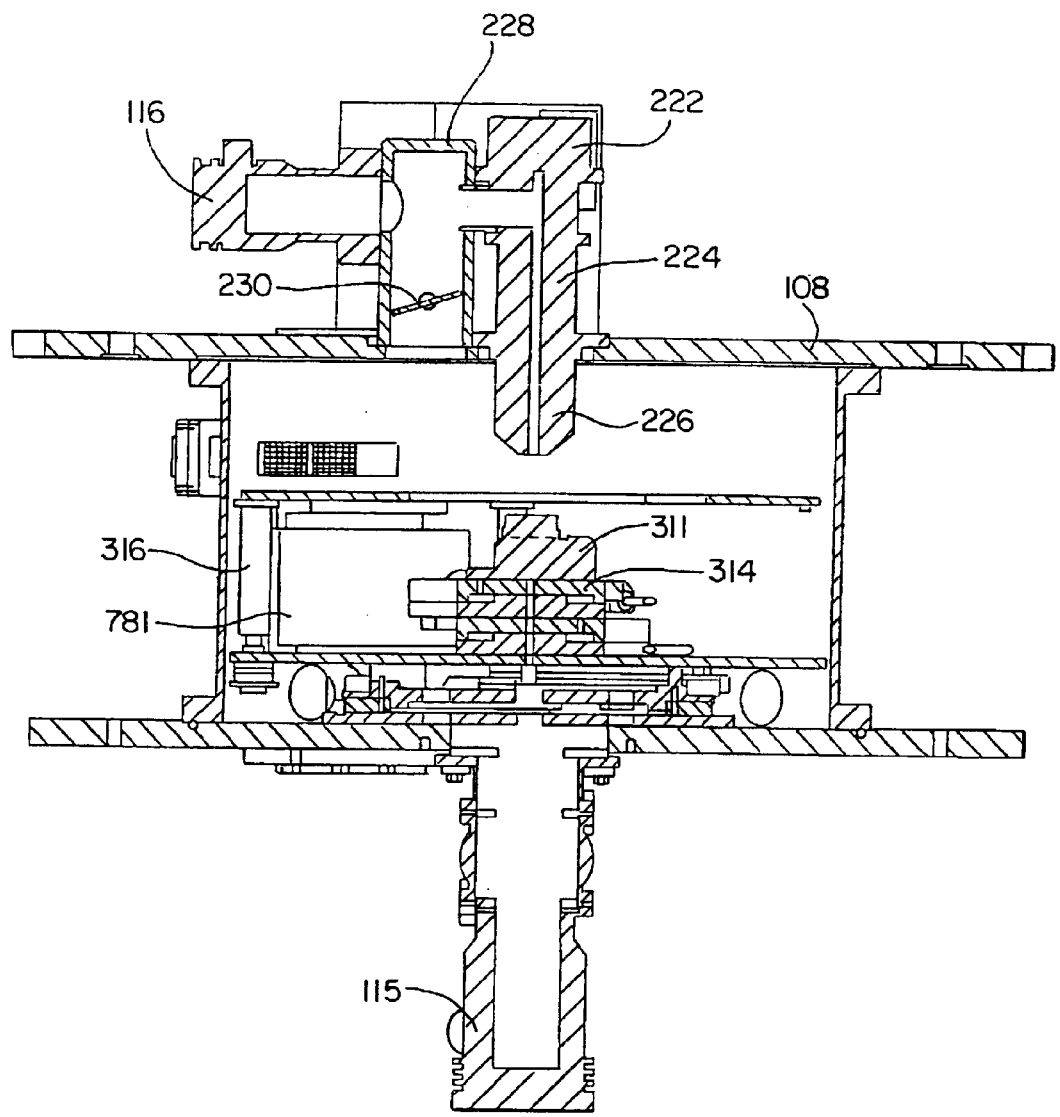

The microscope 104 is positioned so that at least part of the lower portion 226 extends below the tops 108 and 184 and into the chambers 108 and 182. A power supply 227 is located atop the cover 194 near the microscope 104 for supplying power to the same during high resolution probing with system 100. An electron collector 220 extends through the cover 194 near the microscope 104 and is positioned at an oblique angle to the plane of the cover 194 in order to collect the electrons from the beam 206 deflected off of the DUT 118 to provide a high resolution image of the target area. As shown in FIG. 5K, a column 228 is located adjacent the microscope 104, containing a variable vacuum pressure valve 230 which allows the vacuum pressure of the microscope column to be adjusted independent from the vacuum pressure of the chamber 190. The microscope vacuum pump 116 is connected to the column 228 along with a microscope column pressure/vacuum sensor 231. These components can be arranged in a variety of positions about the system 100, however, in a preferred form the electron collector 220 is positioned so that it will be located at the front of the system 100 when the cover 194 is closed. Such a configuration allows for additional probe assemblies 106 to be added along the rear side of the chamber 190 in clearance from the front mounted collector 220. The front mounting of the collector 220 also makes it easier for the system operator to access the probe assemblies 106, carrier 250, stages and motor drives, etc., as well as, determine where the probe assemblies should be positioned so that they do not interfere with the microscope 104, electron collector 220 and other components of the cover 194. This configuration also leaves the removable portion of the platen 258 free from components so that a system user can quickly and easily get access to the carrier 250, stages 311, 312, 314, 316 and platform 544 through opening 258*a*.

The portions 220, 222, and 224 of microscope 104 may also be electrically isolated from one another so that the probe station 100 can be configured in a variety of ways, (e.g., with some portions connected to ground, others connected to guard, etc.), as discussed above. For example, in one form the lower portion 226 is electrically isolated from the upper and intermediate portions 222 and 224 so that the lower portion 226 can be connected to a guard signal to further reduce noise/interference such as parasitic capacitance and EMI as discussed above, and the upper and intermediate portions 222 and 224 can be connected to ground to reduce the risk of electrical shock to a probe station user. Again, such a configuration allows the probe station to be connected in a triaxial arrangement having the DUT 118 surrounded by a guard layer formed by top 184, bottom 186, sidewall 188, and lower scope portion 226, and further surrounded by a shield layer formed by top 110, bottom 112, sidewall 114 and upper and intermediate scope portions 222 and 224. In a preferred form, however, the microscope 104 and outer housing 108 are shielded and the inner housing 182 and shutter 218 are connected to guard. Thus the DUT 118 will be surrounded by a guard layer and a shield layer in order to reduce noise and allow for optimal probing/measurement conditions.

Inside the housing 102 are the operating components of the probe station 100 for probing of the specimen including a carrier 250, (e.g., a chuck, fixed probe card, socket stage adapter and its respective socket cards, etc.), and a plurality of manipulators 252a, b, c, and d, each including conductive portions in the form of probes 256 for testing DUTs such as electronic components or specimens 118. In general, the carrier 250 is used to support the specimen 118 in a rigid and fixed position during testing. Preferably, the carrier 250 is capable of moving the specimen in the X, Y and Z directions. The manipulators 252a–d are mounted on a support or platen 258 which is located within the vacuum chamber 190 and includes a central opening which provides access for the probes 256 to the carrier 250 located beneath the platen 258. Although four programmable manipulators are shown, the system can be set up to handle additional manipulators. For example, in one form the system 100 may be setup using six manipulators having at least 10 nm resolution and 0.5 inches of travel in all axis In a preferred form, the platen 258 has an access panel which can be opened and/or removed in order to give the system operator access through opening 258a to support portions of the carrier 250, motor drive systems, and additional components located within chamber 190. In the embodiments shown in FIGS. 5D and 24, the access panel has been removed to show the opening 258a covered thereby.

The manipulators 252a–d operate to position their associated probes 256 about various conductive path indicia, or test points, located on the surface of the specimen 118. Prior to discussing further operation of the probe assembly 106, however, each component of the probe assembly 106 will be discussed in further detail below.

The carrier shown in FIGS. 5A–K and 14 is a chuck 260 which is generally circular in shape and is used for supporting the specimen or DUT 118 which is to be probed. The chuck 260 may range in complexity from simple single layer disk shapes to more complex multi-layered shapes. An advantage of using a multilayered configuration is that the noise reduction principles associated with the various shielding and guarding configurations discussed above with respect to housing 102 can be applied to the carrier 250 as well. For example, the chuck 260 can be configured in a coaxial or triaxial arrangement in order to minimize the effects of parasitic capacitance and/or EMI by reducing the number of available conductive surfaces which can be charged and protecting the DUT 118 against interference from external electromagnetic fields.

Figure 14:
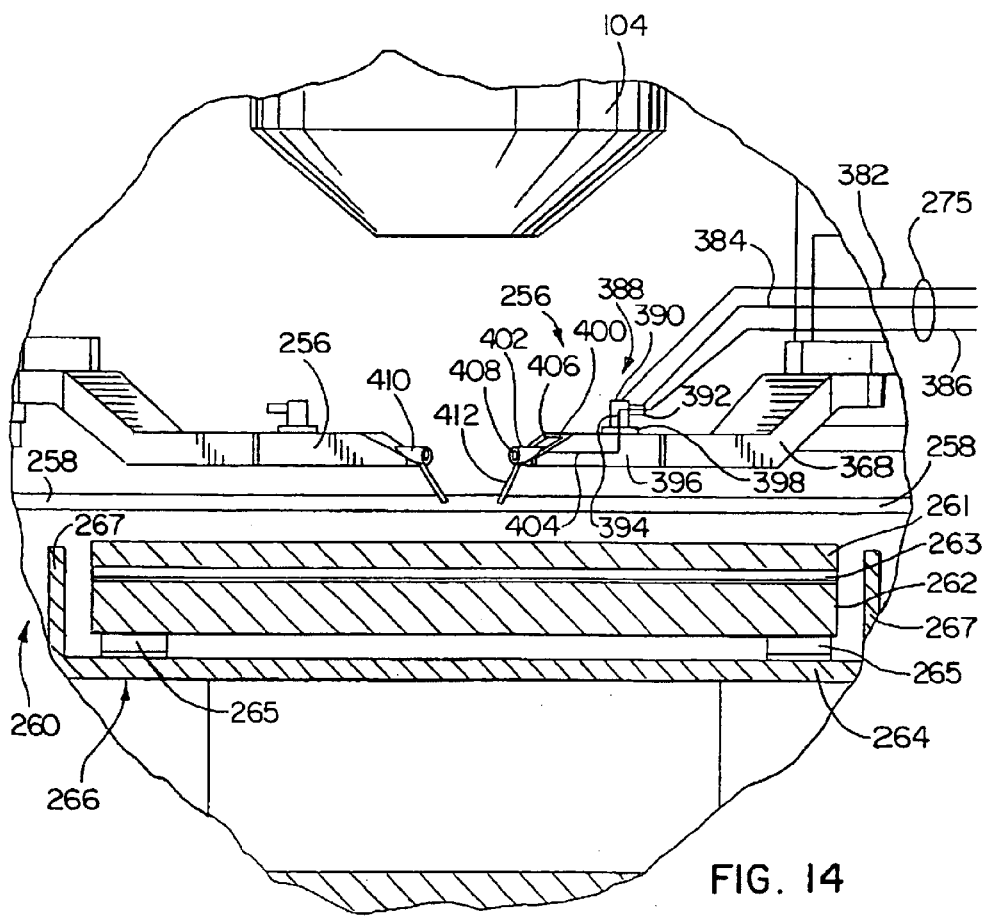
FIG. 14 is an enlarged schematic view of the high resolution probe assembly, showing the triaxial wiring configuration from one of the feedthroughs to one of the probe assemblies and showing an alternate chuck.
Figure 15A:
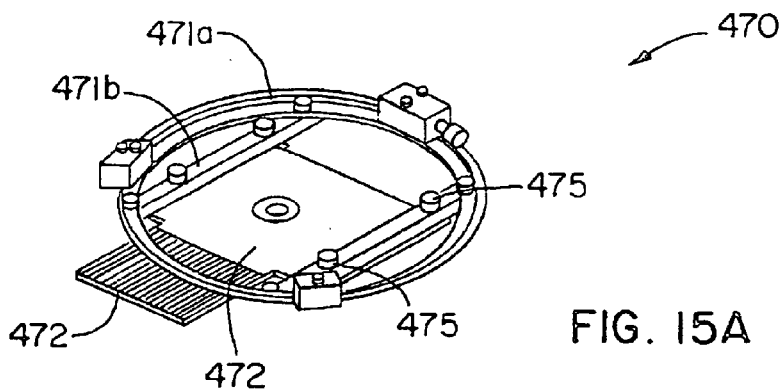
FIGS. 15A–F are perspective, front elevational and enlarged views of fixed probe card adapter which may be used in place of the probe assemblies of FIGS. 12 and 13.
Figure 15B:
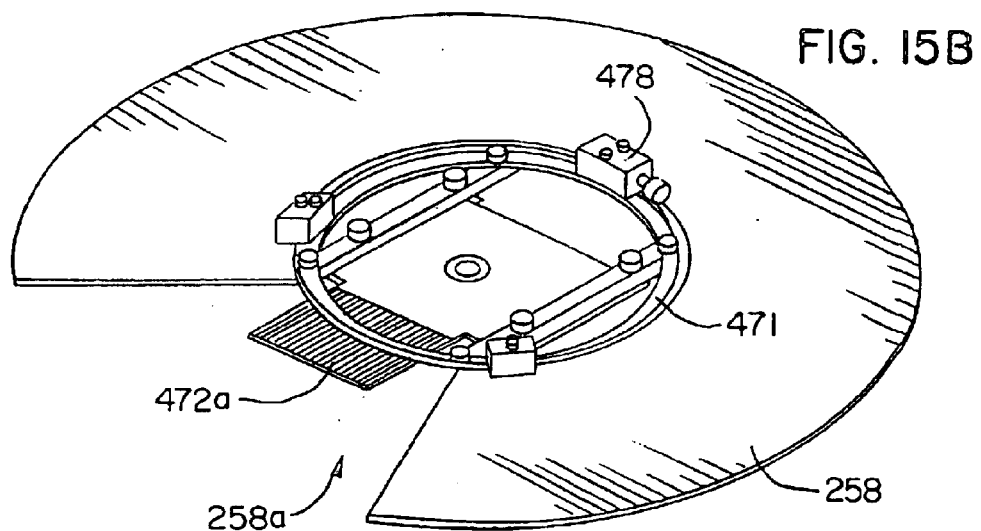
Figure 15C:
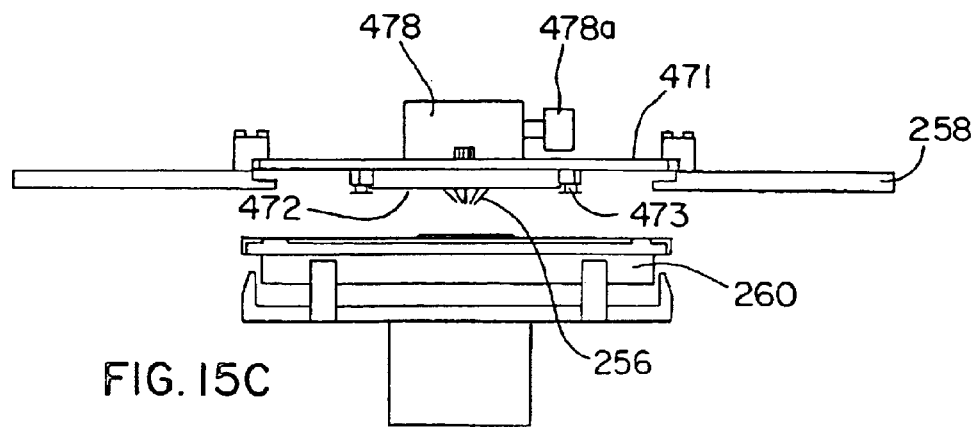
Figure 15D:
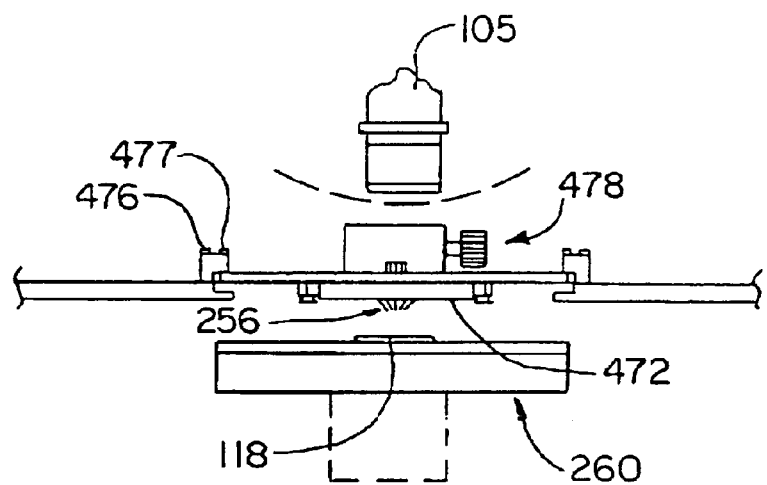
Figure 15E:
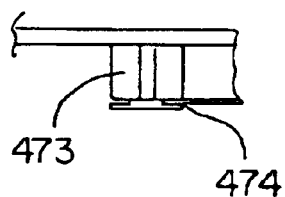
Figure 15F:
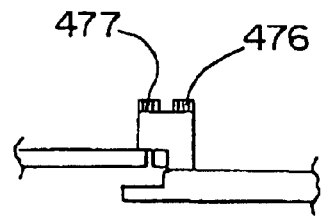

In FIG. 14, the chuck 260 is a triaxial chuck having a multi-layered disk shape consisting of a first conductive element 261, a second conductive element 262, and a third conductive element 264. The first conductive element 261 is generally circular in shape and is electrically isolated from the second conductive element 262 via a similarly shaped insulating plate 263. The second conductive element 262 is also generally circular in shape and is connected to the third conductive element 264 via insulative rods 265, which serve to electrically isolate the second conductive element 262 from the third conductive element. The third conductive element 264 is generally circular in shape, and has a bottom portion 266 which extends laterally below the second conductive element 262, and an annular side wall 267 which extends opposite the outer periphery of the first and second conductive elements 261 and 262.

In a preferred form, the first conductive element 261 and insulator 263 are combined into a ceramic puck having a platinum sputtered conductive outer layer with the ceramic portion serving as insulator 263 and the outer conductive layer serving as the first conductive element 261. Alternatively, the insulating plate 263 may be made of a non-conducting material such as TEFLON. The second conductive element 262 is made from a conductive metal such as cast aluminum, and the third conductive element 264 is made from a conductive metal such as stainless steel. The insulators 265 are made from a non-conducting material such as sapphire and can take any shape, such as a rod or a simple dielectric disc shape stacked between the second and third conductive elements 262 and 264.

As mentioned above, the multilayered chuck configuration assists the probe station 100 in conducting low noise probing by allowing the chuck 260 to be connected in a variety of configurations including those mentioned with respect to housing 102. For example, the chuck 260 can be connected in a triaxial configuration similar to the probe's connection to triaxial cable 275, wherein the first conductive element 261 of chuck 260 is connected to the center conductor or signal line, the second conductive element 262 is connected to guard, and the third conductive element 266 is connected to shield. Alternatively, the chuck 260 can be connected in a coaxial configuration wherein the first conductive element 261 is connected to the center conductor or signal and the second conductive element 262 and/or third conductive element 264 are connected to the outer shield line. Yet another configuration may have the second conductor 262 connected to shield and the third conductor 264 connected to guard. As should be apparent to one of ordinary skill in the art, the electrically isolated configuration of probe station 100, carrier 250 and probes 256 allows for a number of different wiring schemes to be implemented. This flexibility allows the system 100 to be configured in a fashion that best suits the type of testing to be done.

Figure 9B:
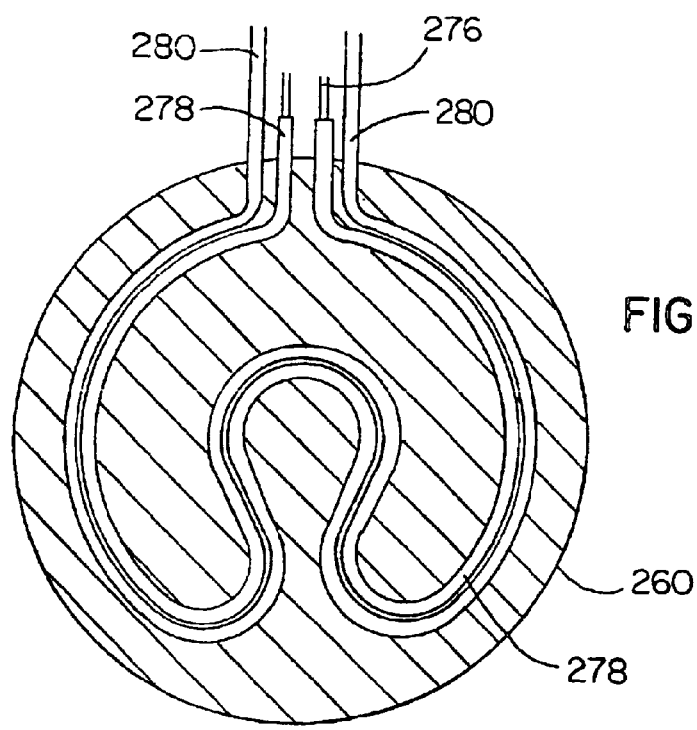
FIGS. 9A–B are elevational and plan views, in cross section, of a thermal chuck.
Figure 9A:
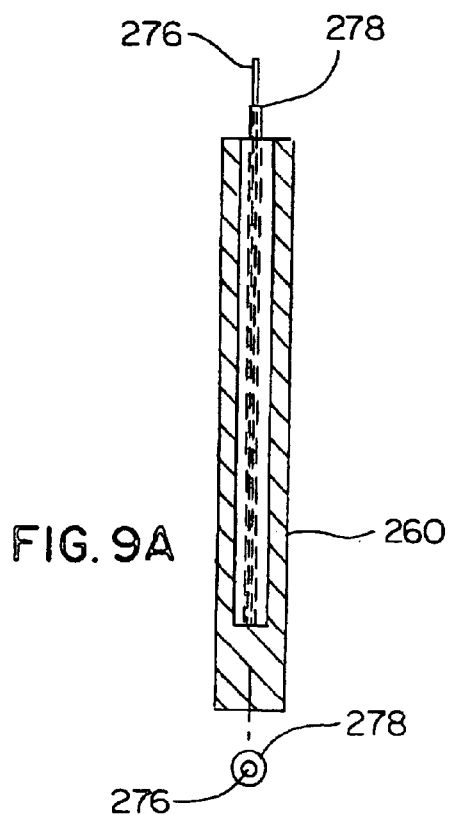

In addition to the variety of chuck configurations that can be used for carrier 250, the probe station 100 may also use chucks having any number of chuck features such as thermal capabilities. For example, the chuck 260 may be a thermal chuck which is capable of raising and/or lowering the temperature of the chuck 260, thereby allowing the DUT 118 to be tested at temperature. The ability to test at temperature allows the DUT 118 to be tested in simulated application conditions thereby allowing testing to more accurately reflect use conditions of the DUT 118. As can be seen in FIGS. 9A–B, the temperature of a thermal chuck may be raised above ambient temperatures via resistive wiring 276 which is placed within a metal sheathing 278 that is cast into one of the layers of the chuck 260. One of the benefits of conducting tests at temperature in a vacuum environment is that the test measurements will not be affected by environmental side effects from raising and lowering the temperature. For example, when the thermal chuck is lowered to temperatures well below ambient temperatures, frost will not occur due to the vacuum environment. Similarly, when the thermal chuck is raised to temperatures above ambient temperatures, humidity will not occur due to the vacuum environment.

In order to heat the chuck using the heating elements shown in FIGS. 9A–B, electrical current is run through wire 276 causing the wire 276 and sheathing 278 to heat up and radiate heat throughout the conductive elements 261 and 262. The conductive elements 261 and 262, in turn, radiate heat to the entire probe station 100, including the chuck surface and DUT 118. The more current that is run through the wiring 276, the more heat is generated due to the resistive nature of the wiring. Therefore, in order to increase the temperature of the probe station 100, the probe station user need only increase the amount of current that is being fed through the wire 276. In order to maintain the desired temperature for testing the DUT 118 at temperature, the chuck 260 has temperature sensors (not shown) which are capable of detecting the temperature of the probe station 100. In one form, the temperature sensor can be a thermocouple attached to the chuck 260. As the temperature of probe station 100 begins to fall below the desired testing temperature, more electrical current is applied to the wire 276, causing the wire to radiate more heat and increase the temperature of the probe station 100. As the temperature begins to rise above the desired temperature for testing, less current is applied to wire 276 causing the wire to radiate less heat.

The temperature of the thermal chuck shown in FIGS. 9A–B is lowered below ambient temperatures by passing a coolant or heat transfer fluid through conduit (or piping) 280 which is cast in one of the layers of chuck 260. Typically the coolant is a liquid or vapor and the conductive element within which the conduit 280 is cast is made of a good thermal conductor such as cast aluminum so that heat transfer can readily take place throughout the probe station 100 thereby allowing the vacuum chamber 190 to be raised or lowered to the desired temperatures. In order to lower the temperature of the probe station 100, the probe station user need only increase the amount of fluid being sent through the conduit 280 which in turn will lower the temperature of the probe station 100 via heat transfer. As discussed above, the chuck 260 may contain a temperature sensor such as a thermocouple to monitor and maintain the desired temperature of the chuck 260. As the temperature begins to raise above the desired probing temperature, more fluid is sent through the conduit 280 thereby lowering the temperature of the system. As the temperature begins to fall below the desired testing temperature, less fluid is sent through the conduit 280. In alternate forms of the chuck 260, the heating of system 100 maybe accomplished in a similar manner to the cooling described above, (e.g., passing heating liquid or vapor through tubes).

The thermal chuck may be configured so that the heating and cooling elements 276 and 280 are cast into the second conductive element 262 or into a combination of both the first conductor 261 and the insulator 263. For example, the heating and cooling elements 276 and 280 may be cast into a cast aluminum disc serving as the second conductor 262. Alternatively, the heating and cooling elements 276 and 280 may be cast into a ceramic puck having a platinum sputtered conductive layer as discussed above. In this configuration the ceramic serves as the insulator 263 and the platinum conductive layer serves as the conductor 261.

With the many alternatives and options discussed above regarding chucks, it should be clear that the type of chuck used with probe station 100 depends on what type of testing or probing is to be completed and what type of information is to be gathered, (e.g., is probing being done at ambient conditions or at temperature, is a triaxial chuck necessary or not, etc.). In alternate forms, the probe station 100 may be setup using any one of the chucks manufactured and sold by The Micromanipulator Company, Inc. More particularly, the probe station 100 may be setup using one of the chucks described in Micromanipulator's copending U.S. patent application Ser. No. 09/815,952 filed on Mar. 23, 2001, (the '952 application), which is hereby incorporated herein by reference in its entirety. For example, in a preferred form, the chuck 260 may be Micromanipulator's CHK 8000-A thermal triaxial chuck, which is one of the chucks disclosed in the '952 application. The CHK 8000-A can be configured for either coaxial or triaxial configurations, ambient or thermal applications, and offers a high level of performance for low noise probing.

As can be seen in FIGS. 5H–J and 10A–E, the CHK 8000-A chuck 260 includes central conductive element 268 deposited on an electrical insulator element 270 of ceramic. The central conductive element 268 is preferably of a metal material and may be deposited on the insulative element 270 via plasma discharge sputtering, electroplating or other suitable technique. An outer conductive element 269 is deposited along the periphery of the insulator 270 and is electrically isolated from the central conductive element 268 via a spaced arrangement. As shown in the plan view of FIG. 10B, the electrically isolated outer conductive element 269 forms a concentric ring about the central conductive element 268 with an insulative region therebetween. The outer conductive element 269 is also a deposited metal which, as illustrated, has a side portion that extends around the outer periphery of insulator element 270. Preferably, the outer conductive element 269 extends down along the entire periphery of insulator element 270, as shown, but it is also possible to terminate the conductive material at a location on the periphery above the bottom edge of the insulator.

In a preferred form, the uppermost surfaces of conductors 268 and 269 share the same plane and a portion of the insulator 270 fills the space between the conductive elements 268 and 269 to further isolate each element. The coatings of metal deposited on conductive elements 268 and 269 may be as thin as one micron, or thicker, without significant change in overall performance and in order to accommodate thermal expansion associated with the thermal chuck apparatus for operation over a temperature range of, e.g., −65 to +400° C., or beyond.

The insulator element 270 itself is supported on an intermediate conductive element 271, which consists of a disk-shaped aluminum alloy with cast-in heating and cooling elements and temperature sensors (not shown). As mentioned above, the heating elements are provided as electric resistive heaters, and the cooling elements comprise metal tubes connected to a source of liquid or vapor coolant. The temperature sensors are thermal couples which are connected to a temperature controller. The temperature controller monitors and controls the temperature of chuck 260 and/or probe station 100 by turning on and off the heating and cooling elements. If the controller is located outside of housing 102, the leads connecting the controller and the heating/cooling elements and thermal couples may pass through the feedthroughs 119, 121, 122, 123, 124, 125 and/or 126 as discussed above in order to maintain the vacuum state in the interior of housing 102.

In the thermal chuck 260 shown in FIGS. 10A–E, the heating and cooling elements are cast into the intermediate conductor 271, therefor the insulator 270 should be a good thermal conductor to transfer heat from the conductor 271 to the center conductor 268 and particularly to wafer 118. As discussed above, the central conductive element 268 and insulator element 270 may alternatively be replaced by a ceramic disk with cast in heating, and cooling elements, a temperature sensor, and a metalized outer surface. The ceramic portion of the disk serving as the insulator 266 and the metalized outer surface serving as the central conductor 262.

In chuck 260 of FIGS. 10A–E, the diameter of insulator element 270 is larger than that of the intermediate conductive element 271 to provide a greater insulative barrier between the outer conductor element 269 and central conductive element 268 in the radial or horizontal direction. Preferably, the amount of insulation provided radially between the conductors 268 and 269 is greater than or equal to the bulk thickness of the insulator 270. In other words, the concentric gap between the central conductive element 268 and the isolated outer conductive element 269 is preferably greater than or equal to the thickness of the insulator 270 to minimize electrical leakage or conductance, such as the EMI and parasitic capacitance discussed above, when testing at low femtoampere and high attoampere ranges. The diameter of the central conductive element 268 is typically that of the largest specimen 118 to be tested. For example, for an eight inch wafer and an outer conductive element 269 that extends radially 0.025 inches on an insulator and is 0.312 inches apart from the central conductive element 268, the overall diameter of the chuck insulator 270 should extend at least approximately 8.674 inches (8"+2×0.312"+2×0.025"). The intermediate conductive element 271 is preferably of larger diameter than the wafer diameter so that the effects of thermal losses to the atmosphere at the peripheral edge of the intermediate conductive element 271 are moved away from, and therefore minimized at, the edge of wafer 118. With such a configuration, improved temperature control and thermal uniformity are achieved by reducing the chance that the peripheral edges of wafer 118 will not be heated to the same temperature as the rest of the wafer 118.

Accordingly, the chuck apparatus 260 of FIGS. 10A–E includes a central conductive element 268 for supporting the DUT 118, an intermediate conductive element 271, and an intervening insulator 270 for positioning the central conductive element 268 above the intermediate conductive element 271. The chuck 160 also has an electrically isolated outer (or peripheral) conductor 269 consisting of a horizontally extending ring concentric with the central conductive element 268. The outer conductive element 269 may also extend vertically along the outer lateral edge of the chuck insulator 270.

The chuck 260 further includes a lower conductive element 272 which has a bottom portion 273 that extends laterally below the intermediate conductive element 271, and has an annular side wall 274 which extends opposite the outer periphery of the intermediate conductive element 271. The lower conductive element 272 is located below intermediate conductive element 271 and has a portion extending vertically around the side periphery of the intermediate conductive element 271. The lower conductive element 272 is connected to a hub of probe station 100 via hub adapter 279 which itself is connected to the lower conductive element 272 by nonconductive standoffs 281. The hub and hub adapter will be discussed in greater detail below.

As shown in FIGS. 10A–E, central conductive element 268 and the insulator 270 are circular, and the insulator 270 has a diameter greater than the diameter of the central conductive element 268 and that of intermediate conductive element 271. In this arrangement, the combination of the conductive elements 269 and 271 provide a line-of-sight barrier between the central conductive element 268 and the lower conductive element 272. When the chuck 260 is wired in a triaxial configuration with the central conductor 268 connected to signal line, outer conductor 269 and intermediate conductor 271 connected to guard, and the lower conductor 272 coupled to ground, the guarded line-of-sight barrier made up of conductors 269 and 271 serves to minimize the amount of leakage current and parasitic capacitance affecting central conductive element 268 and the DUT 118 which it supports. Thus, the center conductor 268 (and DUT 118) are effectively protected by a guarded layer (conductors 271 and 269) and then a shielded layer (conductor 272).

The larger diameter of insulator 270 provides for proper isolation between the center conductive element 268 and the outer conductive element 269. The outer conductive element 269 facilitates additional guarding around the side periphery of the test area made up of central conductive element 268 and/or DUT 118, and provides an electrical barrier between the test area and conductive components of the probe assembly located off to the side of the test area. The vertical sidewall 274 of lower conductive element 272 may extend further upward than shown in FIGS. 10A–E toward the test surface without negatively affecting the system's operational abilities because the guard conductor 269 reduces the risk of interfering capacitive effects between the test surface and the side wall 274 of element 272.

The lower element 272 is provided with insulative supports 277 for supporting the intermediate conductive element 271 above the laterally extending bottom portion 273 of lower element 272. In a preferred form of probe station 100, the supports 277 consist of sapphire rods 277 which extend into corresponding bores in the conductive elements 271 and 272, as shown. The bores in element 271 preferably extend to within 0.020–0.060 inches from the top surface of element 271. These measurements have been found to minimize the amount of vertical expansion associated with temperature variations of conductive element 271. Alternatively, or in addition to the sapphire rods 277, a plate of dielectric material may be provided in the space between conductive elements 271 and 272 in order to electrically isolate the elements.

As stated above, the test area (or test surface) of chuck 260 is located on the centrally located conductive element 268 and the DUT 118, when present. The diameter of the test surface is typically dictated by the size of the specimen to be tested. Typical specimens may include wafers that are approximately eight inches in diameter, although the chuck may be sized to accommodate any other wafer size, such as 25 mm–300 mm wafers or larger, and semiconductor integrated circuits or packaged parts. Also, while the invention is described with reference to a chuck, and chuck layers having circular peripheral configurations, chucks and chuck layers of other geometries, e.g., square, rectangular, oval, etc., may be constructed in accordance with the invention.

The chuck 260 of FIGS. 10A–E is wired in a triaxial configuration, in which the center conductor of a triaxial lead 275 is connected to the central conductive element 268 of chuck 260, and the middle (or intermediate) conductor of the triaxial lead 275 is connected as a guard connection to elements 269 and 271, and the outer conductor of the triaxial lead 275 is connected to element 272 and ground. In this arrangement, the conductive components of the probe station 100 may provide shielding from noise sources external and internal to the probe station 100. More particularly, the intermediate conductive element 271 and the ring-shaped conductive element 269 provide a line-of-sight barrier between the test surface and the shield element 272, thereby minimizing leakage currents and parasitic capacitances that may result between the test surface and the lower conductor element 272, while the lower conductor element 272 protects or shields the DUT from external EMI. By removing these forms of interference, this configuration increases the accuracy of probe readings taken by probe station 100. In addition, the intermediate conductive element 271 and the ring-shaped conductive element 269 are connected via the middle conductor of the triaxial lead 275 as a guard to provide a barrier between the test surface and the shield elements and to minimize leakage currents at the test surface. This wiring configuration can be seen more clearly in FIGS. 10D and E, in which the center conductor of triaxial cable 275 is connected to center conductor element 268 via line 286a and the guard of cable 275 is connected to outer conductor 269 via line 269a.

As should be apparent, the conductive elements 268 and 269 are fixed relative to each other such that the desired concentric registration between these elements may be maintained. Proper spacing of the conductive element 268 and the conductive element 269 is likewise maintained by the solid insulator 270 and portions thereof which separate elements 268 and 269. Accordingly, the desired isolation, capacitance and thermal characteristics designed into the chuck apparatus by selection of materials and dimensions are maintained throughout the life of the chuck.

Although the Model CHK 8000-A chuck is identified as a preferred embodiment, the probe station 100 may use any number of different chucks, including conventional ambient chucks, thermal chucks, low noise chucks, and the like.

Figure 11B:
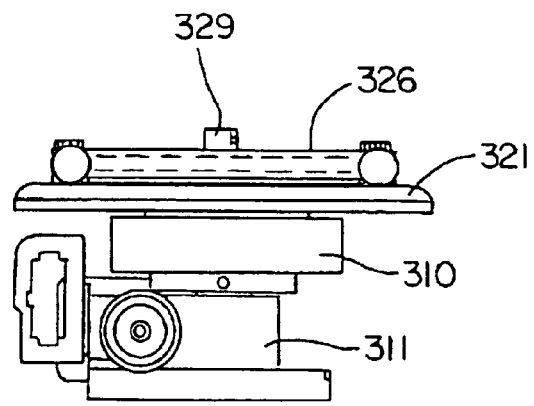
FIGS. 11A–B are perspective and side elevational views of a socket stage adapter used in place of a chuck for testing packaged specimens.
Figure 11A:
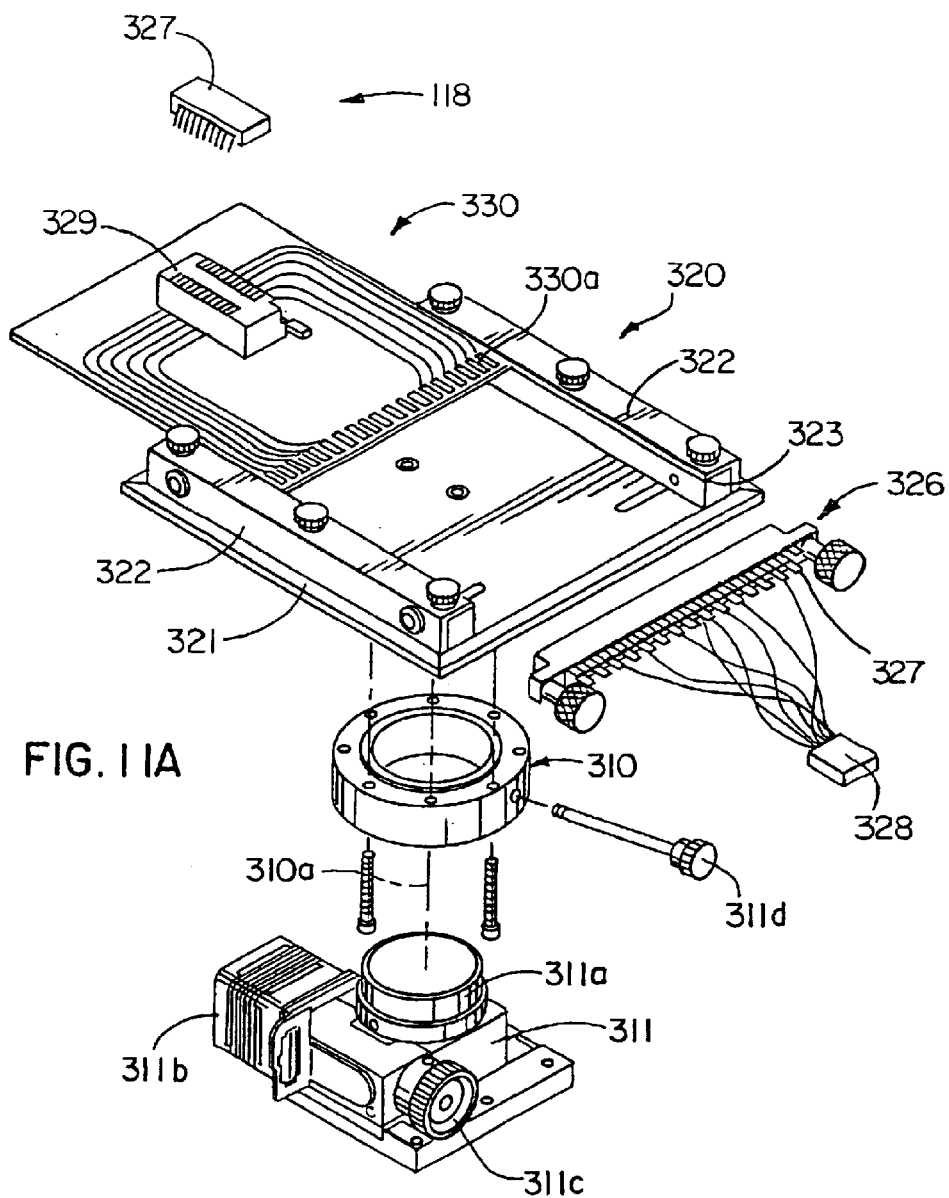

In other testing configurations, carrier 250 may be in the form of a socket stage adapter and socket card instead of chuck 260 as shown in FIGS. 11A–B. For example, the probe station 100 may be setup to use a socket stage adapter 320 and socket card 330 to conduct tests on packaged components, (e.g., components packaged in a dye). As shown in FIGS. 11A–B, socket stage adapter 320 has a generally thin base plate 321 having card retainer 322 extending therefrom. In the form illustrated the card retention mechanisms 322 are generally rectangular in shape and have guide channels 323 for guiding and retaining the socket card 330 in the socket stage adapter 320. Associated with the retention mechanisms 322 are fasteners 324 such as thumb screws for securely fixing the card 330 to the adapter 320 so that it can be probed.

Figure 10A:
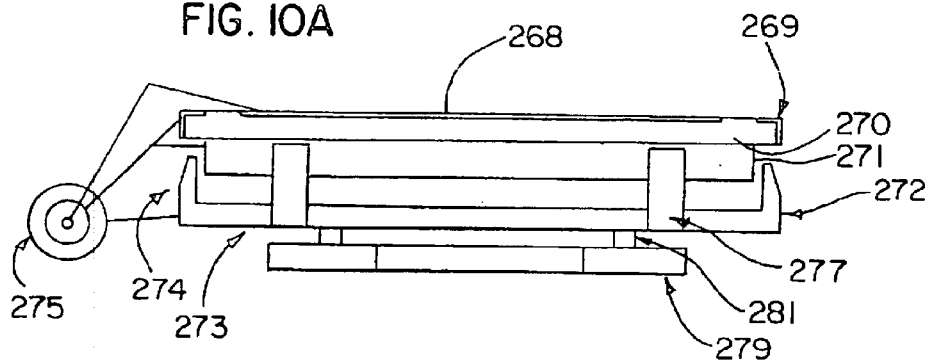
FIGS. 10A–E are elevational, plan, exploded and enlarged views of the triaxial chuck of FIG. 5.
Figure 10B:
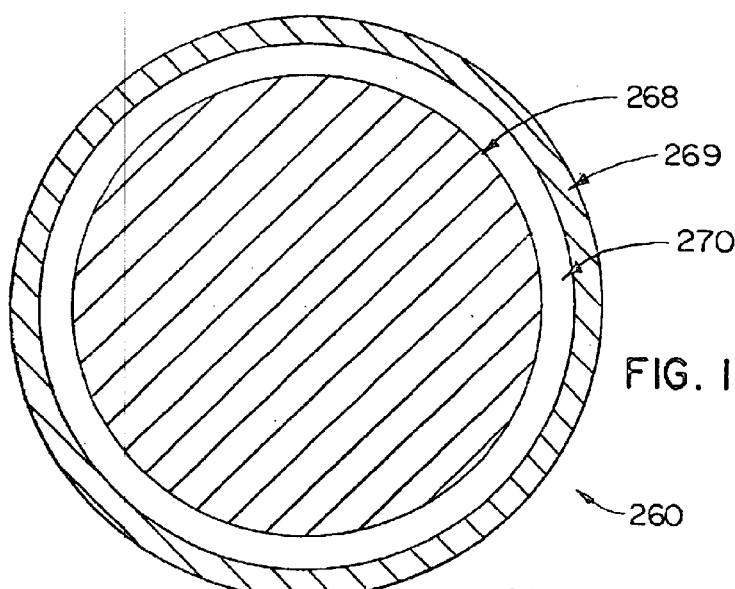
Figure 10C:
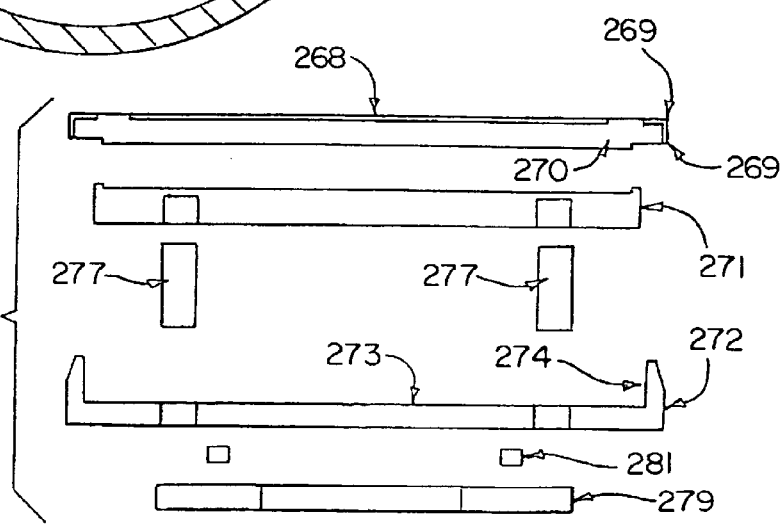
Figure 10D:
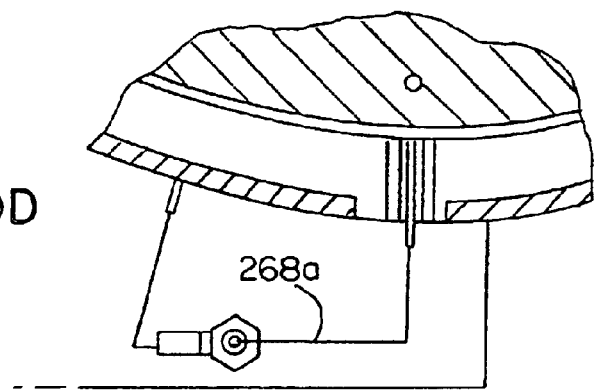
Figure 10E:
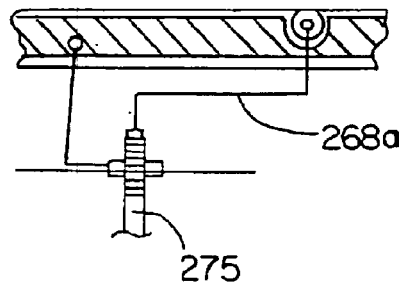

The socket stage adapter 320 has a hub adapter similar to hub adapter 279 shown in FIGS. 10A and C for chuck 260. The hub adapter is used to securely connect the adapter 320 to hub 310, thus making the adapter a carrier connected to system 100. In the illustrated form, adapter 320 is fastened to the hub 310 via bolts. The hub 310 is itself connected to the theta drive 311 of system 100, which allows the hub 310 and adapter 320 to be rotated about vertical hub axis 310a as needed or desired. A variety of theta drives are available offering different ranges of rotation (e.g., 0°–360°) and different resolutions. In a preferred form, the theta drive 311 is capable of rotating 100° with a resolution of 0.7 $\mu$m. In alternate forms, however, a theta drive capable of 360° rotation and better resolution may be desired. The theta drive 311 has a generally disk shaped driving member 311a, a motor 311b, and an optional fine adjustment knob 311c. The driving member 311a engages the hub 310 and is used to rotate the hub 310, and carrier attached thereto, as desired. The theta may be automatically adjusted via the motor 311b or manually adjusted via knob 311c. In a preferred form, both course and fine adjustments of the theta drive may be made remotely using the equipment controlling system 100 and additional fine adjustments may also be made via the optional adjustment know 311c. In alternate forms, the system 100 may be configured so that all theta adjustments are made remotely via a controller located outside of the chamber 190, or configured so that all theta adjustments are made manually from within the chamber 190.

The socket card 330 is typically made up of a printed circuit board (PCB) having an integrated circuit (IC) socket 329 electrically attached to the circuit located on the PCB. The leads of the packaged component 327 are inserted into the corresponding sockets of IC socket 329 and a securing bar 329a is adjusted to lock the packaged part 327 into the socket 329. An edge connector 325 is connected to the end of the socket card having a plurality of electrical contacts (or terminals) 330a from which an electrical connecting can be made with the circuit of the PCB. The edge connector 325 has a plurality of mating contacts or terminals 326 which the system operator can use to connect the packaged component 327 (once inserted into the socket 329) to various types of test equipment, indicated in FIG. 11A by reference numeral 328. The test equipment 328 may be located inside or outside of chamber 190; however, it is preferred that this equipment remain outside of chamber 190 particularly if the packaged part 327 is going to be tested at temperature so that such changes in environment will not effect the operation of the testing equipment and thereby taint the measurements taken by system 100. As discussed above, the leads connecting the test equipment 328 to the edge connector 326 may be fed into the vacuum chamber 190 using any of the access openings 121, 122, 123, 124, 125 and 127, as well as any of the connectors used therewith.

Once the socket stage and card have been connected to probe station 100, the integrated circuit dye package 327 can be tested and run as if it was installed in its actual end product. For example, if the component is typically operated in a high temperature environment, the environment of chamber 190 can be raised to that temperature and then probed to ensure that it is operating correctly and/or to determine why it is not operating as it should. Typically the upper portion of packaging 327 is removed via a process known as de-lidding in order to expose the conductive path indicia of the integrated circuit 327 so that additional testing/probing can be performed. More particularly, the upper portion of package 327 may be removed by acid so that probes 256 can be positioned about the conductive path indicia located within package 327 and the device can be probed.

In order to probe this device, the socket card adapter 320, hub 310, and theta drive 311, are moved about via X, Y and Z stages 312, 314 and 316 so that probes 256 can test (e.g., acquire and/or apply test signals) to desired portions of the IC 327. As will be discussed in further detail below, the probes 256 can be positioned onto the conductive path indicia by lowering the platen 258 via Z stage 316 and/or lowering the probes via manipulators 252a, b, c and d. If the system 100 is equipped with a theta drive 311, the adapter 320 and card 330 can be rotated via the theta drive 311 in order to assist the system operator in positioning the part 327 exactly where he or she wants it. Once the desired theta rotation has been reached, the system operator can lock the theta position via the theta lock knob 311d. The system 100 (or DUT 118) may also be tipped or tilted as needed via tilt mechanisms which will also be discussed further below in order to view the conductive path indicia better via microscope 104 or 105.

The probe assemblies 106 of FIGS. 5A, D, H–J and 12A include manipulators 252a–d which operate to position their associated probes 256 about various conductive path indicia or test points located on the surface of the specimen or DUT 118. Each manipulator 252a–d is mounted on a base 350 which is in turn attached to the platen 258. Some forms of manipulators utilize magnetic mounting bases or vacuum/suction mounting bases to attach the manipulators to the platen 258. For example, the mounting bases 350 may be made out of magnetic material which is capable of securing the manipulators 252a–d to a platen 258 made out of magnetically attractive material such as metal. In a preferred form, the manipulators 252a–d are hard mounted (e.g., bolted) to the platen 258 in order to provide maximum stability for precision probing.

Slidingly coupled to the mounting bases 350 are the manipulator block body assemblies 352 which include the control or adjustment mechanisms that are used to position the probes 256. The manipulators 252a–d utilize screw drive adjustment mechanisms having threaded shafts driven by motors capable of precisely positioning probes 256, such as by a stepping motor, servomotor or the like. The position adjustments for manipulators 252a–d may be made automatically via a controller, such as a computer, which operates X, Y and Z position adjusting mechanisms 354, 356 and 358 in order to adjust the probes 256 in the X, Y and Z directions, respectively. More particularly, the motors of position adjusting mechanisms 354, 356 and 358 may be operated to rotate their associated screws thereby causing blocks 354a, 356a and 358a to slide back and forth in the X, Y and Z direction respectively. The block portions 354a, 356a and 358a of the block body assembly 352 have slide bearing surfaces and guides which allow for relative sliding movement of the block portions upon actuation of the mechanisms 354, 356 and 358.

Figure 12B:
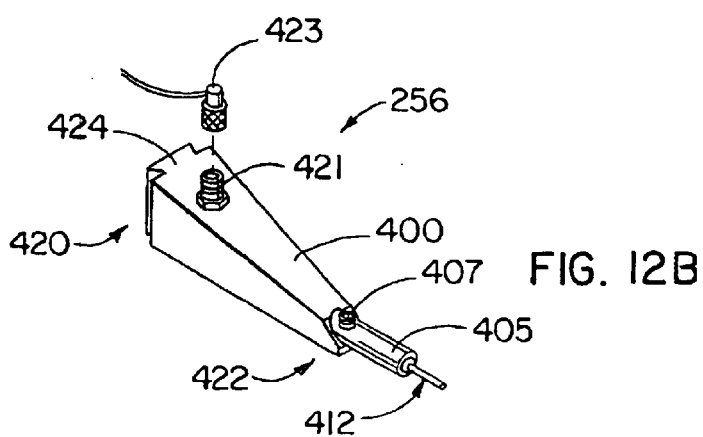
FIGS. 12A–C are perspective, enlarged and cross sectional views of a probe assembly used in the high resolution analytical probe station.
Figure 12A:
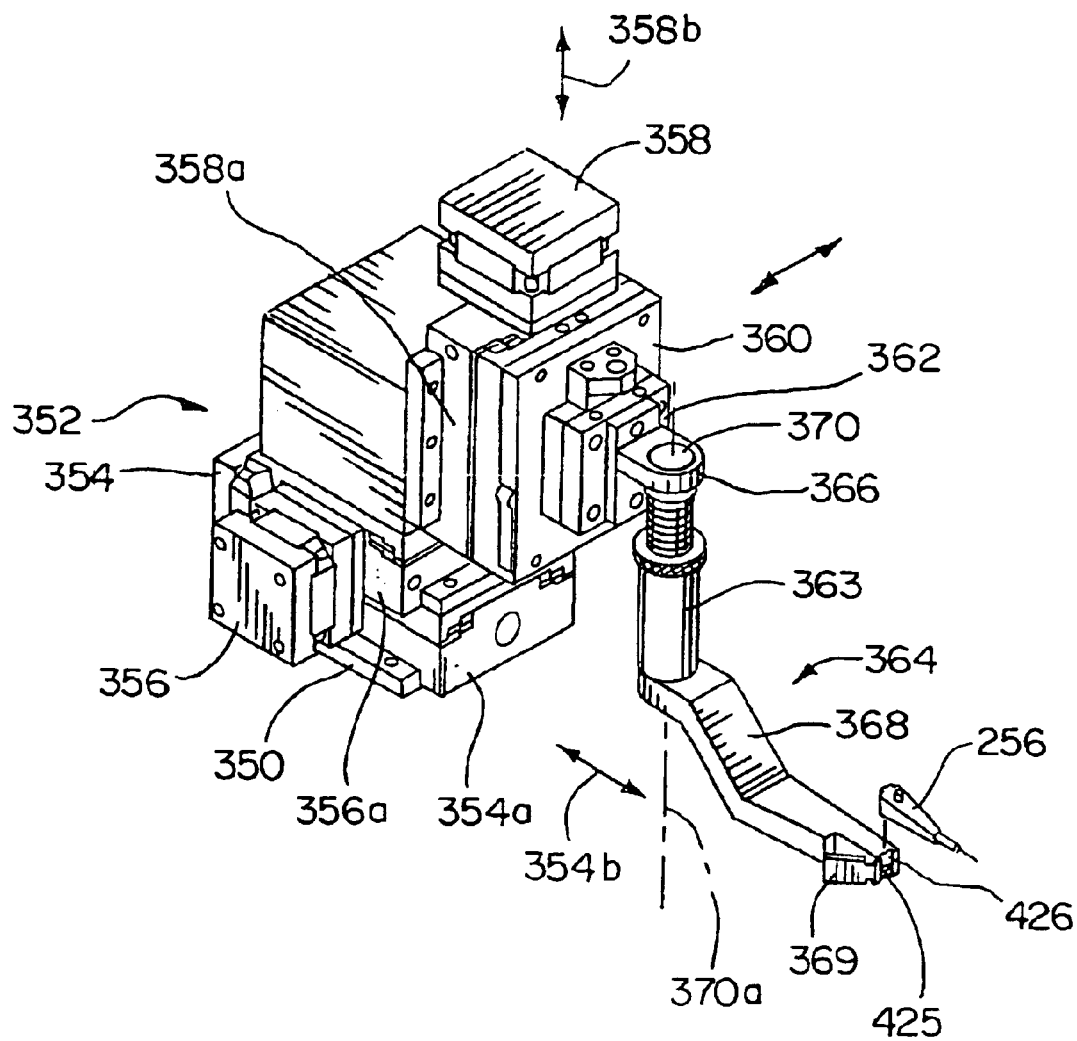

In FIG. 12A, actuation of the X-adjusting mechanism 354 causes the corresponding screw drive to be driven or rotated thereby moving block 354a, along with the remaining portions of the manipulator assembly that rest on block 354a (e.g., Y-adjusting mechanism 356, Z-adjusting mechanism 358, manipulator arm support plate 362, extension 363, arm assembly 364, and probe 256). This movement translates into moving the face 360 of the manipulators 252a–d forward or backward in the direction identified by arrow 354b. A portion of the cavity within which the screw of the X adjustment screw drive mechanism is rotated can be seen in block 354a of FIG. 12A. The Y-adjusting mechanism 356 causes its corresponding screw drive to be rotated thereby moving block 356a, along with everything resting thereon (e.g., the Z-adjusting mechanism 358, manipulator arm support plate 362, extension 363, arm assembly 364, and probe 256). This movement translates into moving the face 360 left and right as identified by arrow 356b. The Z-adjusting mechanism 358 causes its corresponding screw drive to be rotated thereby moving block 358a, along with everything connected thereto (e.g., manipulator arm support plate 362, extension 363, arm assembly 364, and probe 256). This movement translates into moving the face 360 up and down in the direction identified by arrow 358b.

Figure 12C:
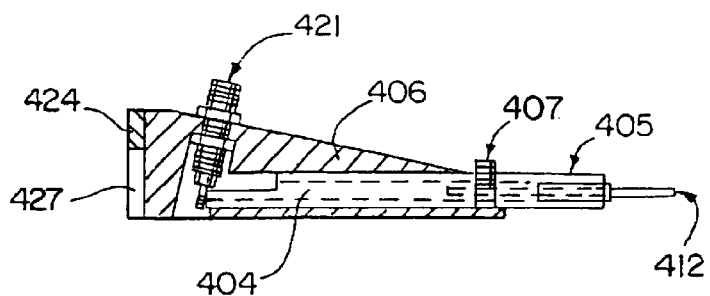

In FIGS. 12A–C, the support plate 362 is attached to the face 360 for mounting the arm assembly 364 to the manipulator. The arm assembly has members 366 and 368 that project out forwardly from the manipulator assembly and connect to the probe 256. In a preferred form, the probe 256 is connected to lower member 368 via a probe retaining mechanism such as spring clip 369, and the arm assembly 364 includes an adjustment mechanism 370 positioned at the joint connecting upper and lower members 366 and 368, respectively. The adjustment mechanism 370 is used to pivotally adjust the lower member 368 about vertical axis 370a with respect to the upper member 366, which is fixed to support plate 362. In the form illustrated in FIG. 12A, arm extension 363 is used to increase the lower reach of the arm assembly 364. More particularly, the arm extension (or collar) 363 is used to separate arm members 366 and 368 by a desired vertical distance. In the illustrated embodiment, extension 363 does not alter the ability to pivotally adjust lower member 368 with respect to upper member 366 and is attached to the upper and lower members via a screw and/or bolt relationship.

Once the manipulators have positioned the probes 256 in the desired locations, the probes 256 will be placed into contact with the DUT 118 and testing/probing will begin. The actual placement of the probes on the DUT 118 may involve the use of a variety of motion control mechanisms and sensors, and will be discussed further below with respect to the operation of probe station 100.

Figure 13A:
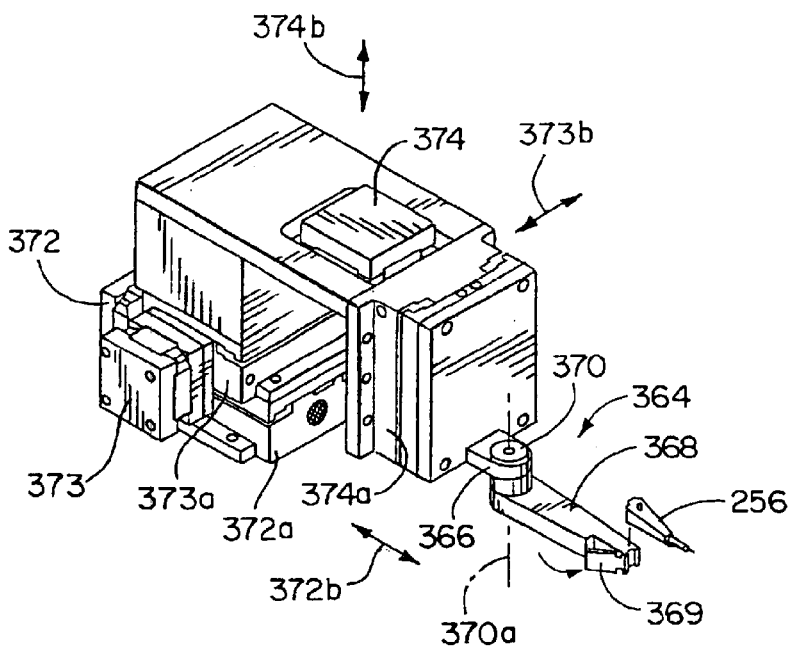
FIGS. 13A–C are perspective, enlarged and cross sectional views of an alternate probe assembly showing a manipulator and a probe with slide assemblies operable to shift the probe in X, Y and Z directions.
Figure 13B:
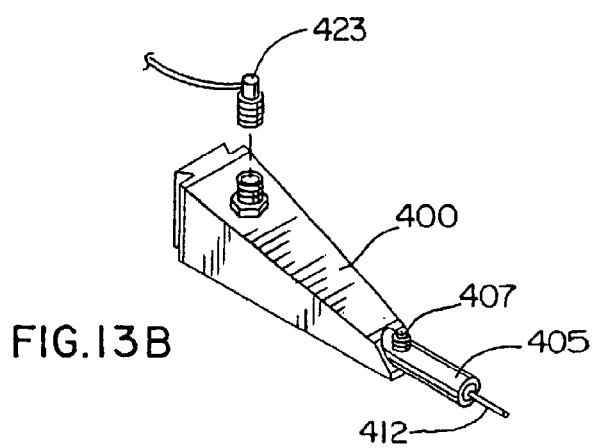

The manipulators 252a–d, shown in FIGS. 5A, D, H–J and 12A, are Micromanipulator Model 900VM manipulators. At 0.01 microns, the 900VM manipulators offer very high manipulator resolution and features such as an indexed rotational nose piece, probe arm with fast tip changing capacity, and stable mounting with preset stable mountings. As mentioned above, however, a variety of different probes and manipulators may be used with system 100. For example, another form of manipulator is illustrated in FIG. 13A and is identified generally by reference numeral 371. This manipulator offers a low profile which may be desirable in a variety of applications, including light microscope probing as well as high resolution microscope probing. The low profile manipulator 371 has X, Y and Z position adjusting mechanisms 372, 373 and 374, which operate similar to those discussed above with respect to FIG. 12A. Unlike the manipulator from FIG. 12A, however, manipulator 371 has an extended block portion within which at least a portion of the Z-adjustment mechanism 374 is recessed. This allows for a lower clearance or profile and allows for the arm assembly 364 and probe 256 to be extended out further from the base of the manipulator.

The arm assembly 364 of manipulator 371 is similar to that described earlier in that in contains two members 366 and 368 that project out from the manipulator. The probe 256 is also connected to the lower member 368 in a similar fashion (e.g., probe retention mechanism 369). Just as in FIG. 12A, the arm assembly 364 also contains an adjustment mechanism 370 positioned at the joint connecting upper and lower members 366 and 368. The adjustment mechanism 370 is used to pivotally adjust the lower member 366 about vertical axis 370a with respect to the upper member 366 which is fixed to the manipulator.

In addition to using a variety of manipulators, the system 100 may also use a variety of probes 256. For example, the manipulators 252a–d may use one of the triaxial probes depicted in FIG. 14, or may use any one of a variety of different probes, such as the coaxial probes illustrated in FIGS. 5A, D, H–J, 12A–C and 13A–C, RF/Microwave probes, etc. As mentioned above, the probe assemblies 106 also include probes 256, which are used to acquire and apply test signals to the DUT 118 during testing. The probes 256 are mounted to the lower members 368 of the manipulator arms 364 and are positioned according to the procedures discussed above with respect to the manipulators 252a–d. For optimal probing, triaxial probes which contain a center conductor surrounded by a guard conductor and a shield (or ground) conductor can be employed. The triaxial configuration of probe station 100, including its components such as the carriers 250 and probes 256, minimizes noise and allows for more accurate testing of the DUT 118 by shielding the DUT 118 from external EMI and reducing the effects of parasitic capacitance and other interferences via a blanketing guard layer. The triaxial probes of FIG. 14 are schematically shown connected to a triaxial lead or cable 275. The triaxial cable 275 of FIG. 14 has a shield (or outer) line 382, a guard (or intermediate) line 384, and a signal (or inner) line 386 which are electrically isolated from one another via insulative material. The insulative layers or sheathing of lead 380 have been removed in order to more clearly show the three conductive lines 382, 384 and 386 in this schematic view. The lead 275 is connected to probe 256 via a threaded stub connector 388, which is generally cylindrical in shape and includes three conductive portions, including outer portion 390, intermediate portion 392, and inner portion 394, which are also electrically isolated from one another via an insulative material. With the triaxial lead 375 connected to connector 388, the conductive portions 390, 392 and 294 are electrically connected to shield, guard, and signal lines 382, 384 and 386.

The connector 388 is connected itself to the main body 396 of probe 256 at base 398. The main body 396 of the probe includes an outer conductor 400, intermediate conductor 402 and inner conductor 404, which correspond, and are electrically connected to, the conductive portions 390, 392 and 394, respectively. Thus, when the triaxial lead 375 is connected to connector 388, the outer conductor 400 is connected to the shield line 382, the intermediate conductor 402 is connected to the guard line 384, and the inner conductor 404 is connected to the signal line 386.

As can be seen in FIG. 14, the first (or outer) insulator 406 electrically isolate the outer conductor 400 from the intermediate conductor 402, and a second (or inner) insulator 408 electrically isolates the intermediate conductor 402 from the inner conductor 404. The outer conductors 400 and first insulators 406 generally are rectangular in cross-sectional configuration and taper in toward the exposed end of intermediate conductor 402, (e.g., taper in towards the probe tip which is located on the side opposite the manipulator arm 364). The intermediate conductor 402 and second insulator 408 are generally annular in cross-sectional configuration and protrude out from the distal terminal ends of the first insulator 406 and outer conductor 400.

The intermediate conductor 402 and second insulator 408 further include concentric apertures 410 which define a passageway within which probe tip 412 may be substantially rigidly inserted. The probe tip 412 is a needle-like conductor which, when inserted into the aperture 410, makes electrical contact with inner conductor 404 thereby electrically connecting the tip 412 to signal line 386. In order to electrically isolate the probe tip 412 from the intermediate conductor 402, the concentric aperture of the intermediate conductor 402 is made larger in diameter than the aperture in the second insulator 408, which results in separating the probe tip conductor 412 from the intermediate conductor 402. In a preferred form, inner insulator 408 has a threaded bore located in its end. The bore intersects with the passageway defined by aperture 410 of insulator 408 so that a set screw can be threaded into the bore and tightened against the probe tip 412. This configuration allows the probe tip 412 to be fastened to the probe, but also offers the ability to release and replace the probe tip 412, when desired, without having to replace the entire probe 256. In alternate systems, the probe tip 412 may be press fit or friction fit into the passageway defined by aperture 410, and may be equipped with a preloaded spring feature to assist in the removal of the tip 412 when desired.

The apertures 410 may be angled in a variety of ways in order to give the probe tip 412 the desired angle with respect to the DUT 118, (or angle of attack). This configuration allows the probe tip 412 to be angled so that it can be placed one right next to the other without interfering with other probes and structures. This configuration also allows for various hard to reach portions of the specimen 118 to be probed. For example, the probe tips may be angled at varying angles so that more probes can be positioned near one another on the DUT.

In alternate forms of system 100, the probes 256 may be wired or configured coaxially as shown in FIGS. 5I–J, 12B–C, and 13B–C. In these illustrations, the outer conductor housing 400 of probe 256 has a first end 420 designed to couple the probe 256 to the manipulator arm 364, and a second end 422 from which the probe tip 412 and needle extends. The first end 420 contains a dovetail flange portion 424 which engages a mating recess 426 in lower member 368 of the manipulator arm 364. In order to provide for quick and easy replacement of the probe 256, the manipulator arm 364 includes a release mechanism, such as a spring loaded latch in the form of spring clip 369, which engages the dove-tail flange portion 424 of the first end 420 when released, and disengages when depressed or squeezed (e.g., causing the spring to be compressed). More particularly, when probe 256 is to be inserted onto manipulator arm 364, the user depresses the release mechanism 369 to provide clearance for sliding the dove-tail flange portion 424 down into the mating recess 426 until it is received fully within the mating recess 426. Releasing the spring latch 428 allows it to pivotably return to the spring loaded securing position with its forward end pushing the rear flange portion 424 of the probe tightly against the surfaces of the recess 426 so that the probe housing 400 is tightly and securely frictionally held in the mating recess 426.

A stop may be provided so that the user can more easily determine when the probe 256 is fully inserted into the recess 428. For example a lip may be provided on the bottom of recess 426 which will prevent the dove-tailed flange portion 424 from sliding completely through the mating recess 428 from top to bottom. In another form, a detent mechanism such as a spring loaded ball and socket may be used to assist the user in determining when the probe 256 has been fully attached to the arm 364. In the form shown, a lug 425 is provided on the surface of the recess 426 which is guided into rear channel 427 on the probe and prevents the probe from being inserted further once the lug 425 engages lip 429.

Figure 13C:
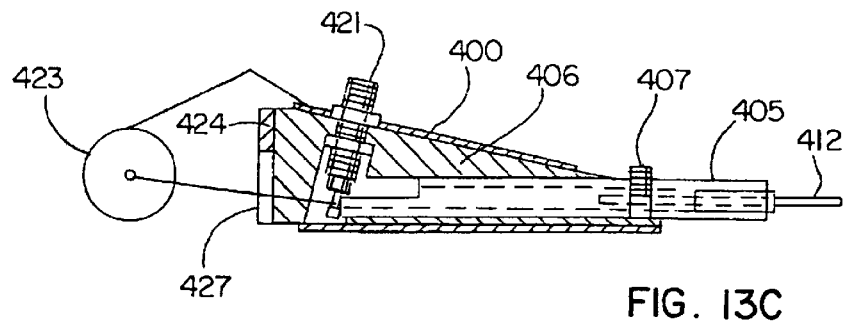

In FIGS. 5I–J, 12B–C, and 13B–C, threaded stub connector 421 is provided for connecting the probe 256 to coaxial lead 423, thus electrically coupling the outer conductor 400 to the shield line of the lead 423 and the inner conductor 404 to the signal line of lead 423. A schematic view of this coaxial connection is illustrated in FIG. 13C. As shown in FIGS. 12C and 13C, the inner conductor 404 of probe 256 is connected to the signal line of connector 423 and to the probe tip 412, and will acquire and/or apply test signals from/to the DUT 118 via probe tip 412. In the embodiments illustrated, a probe holder 405 is inserted into the probe and provides the electrical connection by which the signal line of connector 423 and probe tip 412 are connected. A clamp or set screw 407 is provided for securing the probe tip 412 into the probe holder 405.

Figures 16, 17:
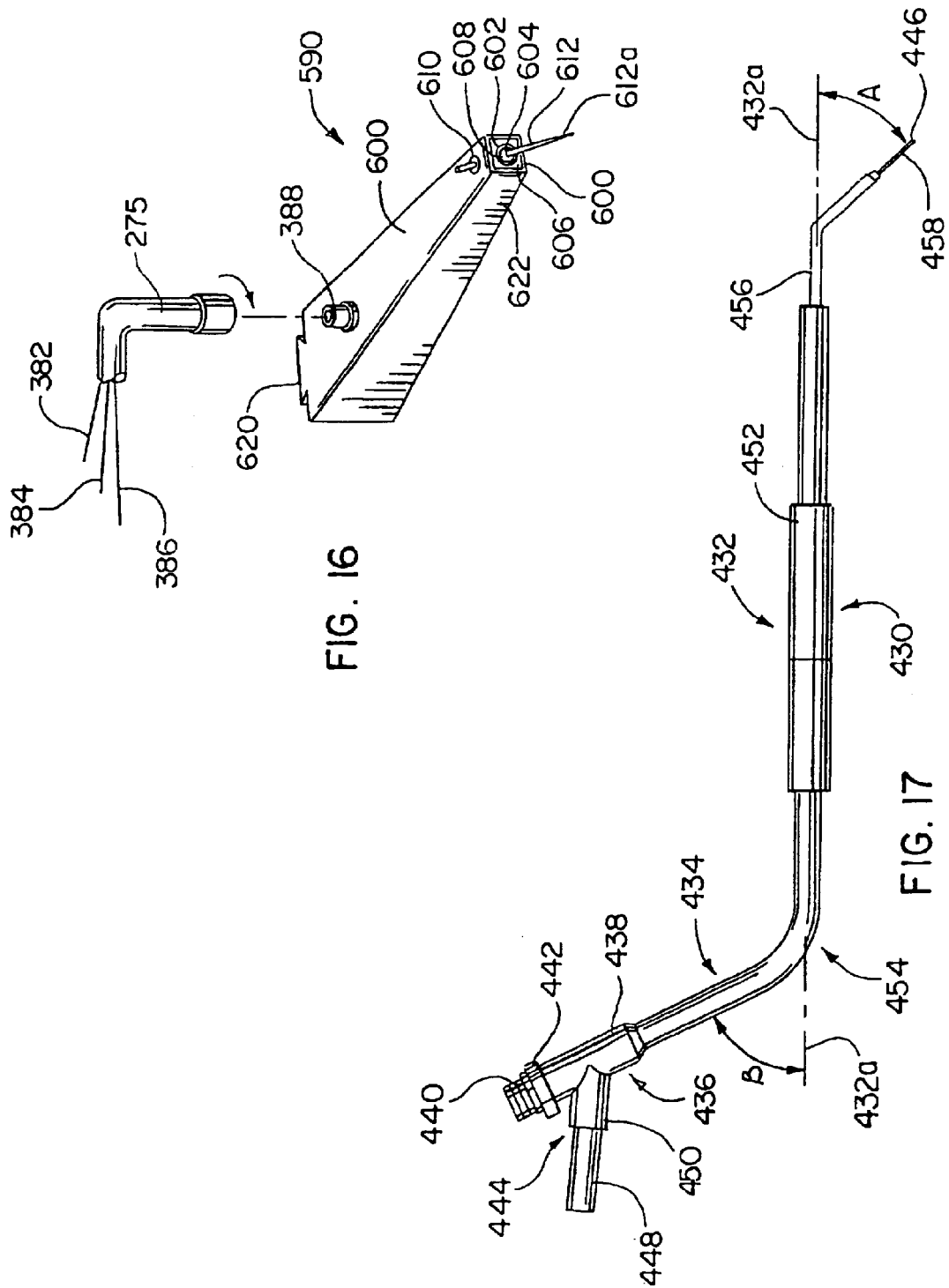
FIG. 16 is an enlarged view of an alternate probe, showing extended cladding on the probe with the probe wired in a triaxial configuration.
FIG. 17 is a side elevational view of an alternative probe having a detachable probe tip portion and showing an extended guard conductor keeping unguarded exposure of the signal conductor to a minimum.
Figure 18:
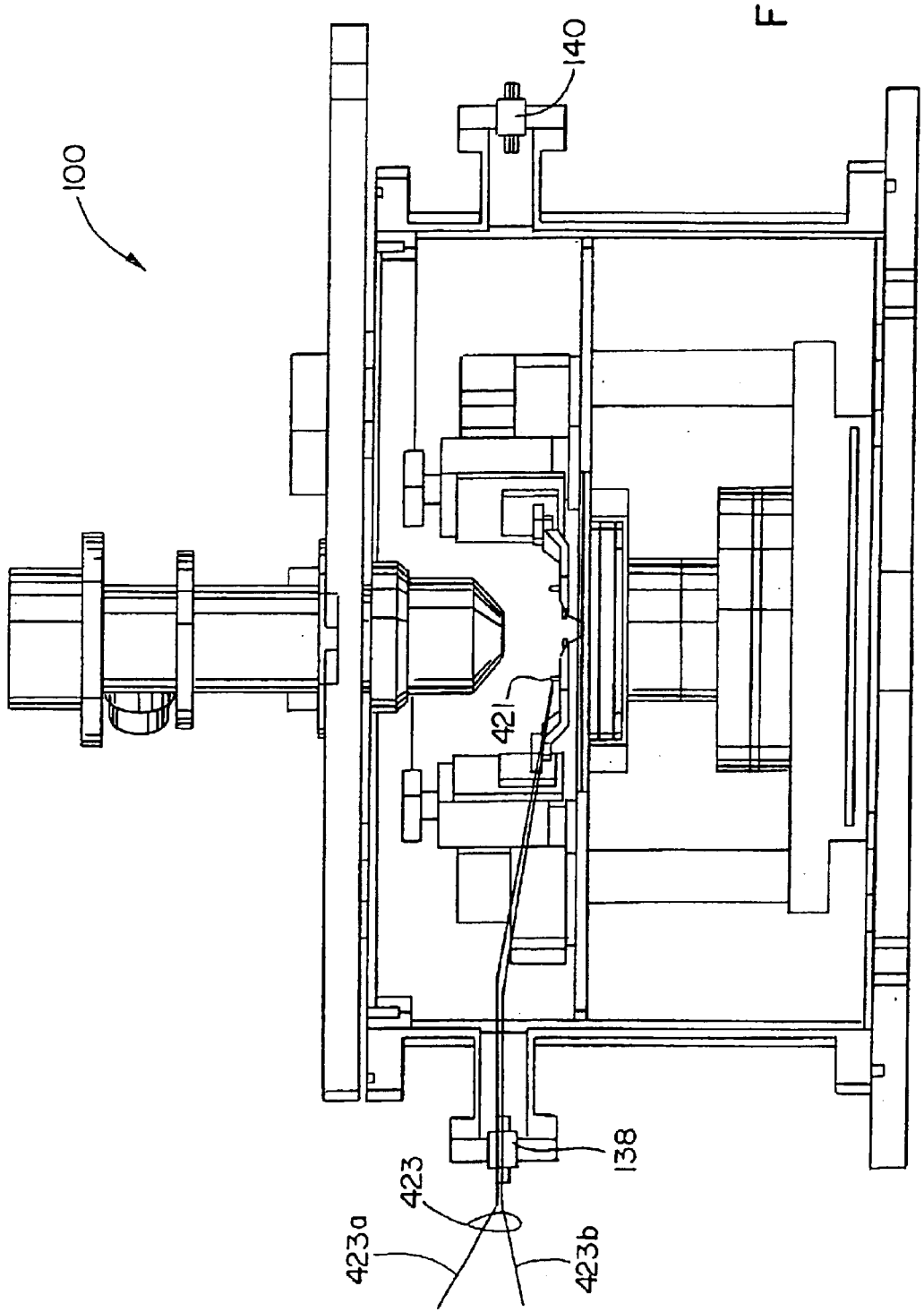
FIG. 18 is a schematic elevational view of the high resolution probe station showing the probe station setup in a coaxial configuration.

Another form of probe, as shown in FIG. 16, may be used with system 100 which can reduce the amount of surface charge and/or delay its build-up by shielding the exposed insulative surfaces of the probe. This probe 590 can be configured for either coaxial or triaxial system configurations (or wiring schemes) and is similar to the probe discussed above and illustrated in FIGS. 5I–J, 12B–C, 13B–C, and 14, with the exception of having an extended portion of conductor 600 (or cladding). More particularly, probe tip 612 is inserted into the passageway defined by apertures 610 of probe 600 in order to make an electrical connection between the probe tip 612 and the inner conductor 594. As mentioned above, the passageway defined by concentric apertures 610 passes through outer and intermediate conductors 600 and 602 and the first and second insulators 606 and 608, and determines the angle (or angle of attack) with which the probe tip extends from the probe 590. The probe tip 612 is electrically isolated from the conductors 600 and 602 and is preferably angled at a thirty degree angle of attack to the left or right, or a ninety degree angle of attack in which the probe tip extends straight down or vertically from the probe 590.

With the configuration shown in FIG. 16, the probe tip 612 can be easily replaced by simply withdrawing the tip 612 from the passageway defined by aperture 610 and inserting a new probe tip in its place. As mentioned above, such a configuration allows for disposable probe tips 612 to be used and can save the probe station user from having to buy entire probes when tips go bad, as by excessive wear or breakage.

Another advantage to this configuration is that the triaxial configuration of the probe, (e.g., inner conductor surrounded by intermediate conductor, surrounded by outer conductor), is allowed to remain present very near the DUT contact end 612a of the tip 612 of probe 590. This not only assists with minimizing the effects of noise on probe readings for the reasons discussed above with respect to the chuck 260 and housing 102, but also serves to prevent the unwanted charging of insulators 606 and 608 by the beam 206 emitted from the high resolution microscope 104. For example, the probe from FIG. 16, when compared to the probes of FIGS. 5, 14 and 15, has an extended portion of the outer conductor (or cladding) 600 which covers or shields the intermediate conductor 602 and inner conductor 604 closer to the probe tip end 612a. This extension (or extended cladding) allows more of the center/innermost conductor to be guarded and/or shielded, depending on the wiring scheme used, (e.g., coaxial, triaxial, etc.).

More particularly, the emitted beam 106 of the high resolution microscope 104 has the tendency to induce a charge on all of the surfaces the electrons scatter over. When insulators or dielectrics such as insulators 606 and 608 are exposed to the beam 106, they too may develop a charge which can distort the readings taken from the DUT. The extended cladding of outer conductor 600 serves to reduce charge buildup on the insulators 604 and 606, and thereby improves the system's measurement capabilities. For example, if charge is allowed to buildup on the insulators 606 and 608, the readings taken from the signal line 386 or signals applied to lines 386 could be affected by the added charge from the insulators thereby distorting the test results taken during probing. As such, the additional cladding can be used to block or shield the insulators 604 and 606 and/or drain the built up charge away from the signal line 386 via grounded outer conductor 600. Thus the measurement capabilities are improved, and noise and other interferences are reduced, by allowing a triaxial connection scheme to remain present very near the tip of the probe.

In view of the probe tip replacement capabilities discussed above, and in order to reduce the time necessary for replacement and to increase the accuracy of the probes 256 and 590 once a new tip 412 or 612 has been inserted, a probe presetting station may also be used. In such cases, the probe 256 or 590 may be placed on a fixed link similar to the manipulator arm 364, so that the replacement probe tip 412 or 612 can be adjusted to ensure that it is in the same relative position as the previous probe tip and to ensure that it is the same relative length of the previous probe tip, (a process referred to as probe tip refresh). Once the probe tip refresh is complete, the probe 256 or 590 may be re-inserted onto the manipulator 252a–d so that testing can commence. Since the probe tip 412 or 612 is now very near the same position with respect to the probe 256 or 590 as the previous probe tip, the probe station user will spend significantly less time getting the probe station 100 ready to test/probe.

Like the chuck 260 and housing 102, the probes 256 and/or 590 can be setup and wired in a variety of ways, preferably with either a triaxial configuration or a coaxial configuration. In the typical triaxial configuration, shown in FIGS. 14 and 16, a triaxial lead (or cable) 275 is connected to the probe lead connector 388 so that the outer, intermediate and inner lines 382, 384 and 386 are electrically connected to the outer, intermediate and inner conductors 400, 402 and 404 of the probe 256. In the typical triaxial configuration, the outermost conductor and line, 400 and 382, are coupled to ground (or grounded), the intermediate conductor and line 402 and 384 are coupled to a guard signal, and the innermost conductor and line 404 and 386 are coupled to the center line signal. FIG. 14 further shows how this triaxial configuration compliments the triaxial configuration of the entire probe station 100 and assists in conducting low current/low voltage probing with minimal amounts of noise by showing how the DUT 118 is surrounded, (e.g., above, below, and around), by a triaxial arrangement. For example, below the DUT 118 is chuck 260 having first conductive element 261 coupled to the signal line, second conductive element 262 connected to the guard line, and third conductive element 264 connected to ground. Above the DUT 118, are probes 256, which have outer conductors 400 connected to ground, intermediate conductors 402 connected to the guard line, and inner conductors 404 connected to the signal line. Around the entire probe assembly 106 is second chamber 182 and lower portion 226 of microscope 104 (or alternatively shutter 218) which may be coupled to the guard signal, and are themselves surrounded by first chamber 108 and upper and intermediate portions 222 and 224 of probe 104 which may be connected to ground.

In the coaxial configuration shown in FIGS. 5J, 12B–C, 13B–C, 18 and 19, a coaxial lead (or cable) 423 is connected to the probe lead connector 421 so that the outer conductor 423a of the lead 423 is connected to the outermost portion (or housing) 400 of probe 256 and the innermost conductor 423b of the lead 423 is connected to the innermost line 404 of probe 256. More particularly, the outermost conductor and line 400 and 423a are coupled to ground (or are grounded), and the innermost conductor and line 404 and 423b are coupled to the center line signal. In alternate coaxial wiring schemes, where a triaxial probe is used, both the outer conductor and the intermediate conductors 400 and 402 may be connected to ground. In yet other schemes, as shown in FIG. 5I, a triaxial cable may be connected to internal coaxial cables which are connected to various components within chamber 190. In such configurations the internal coaxial cables may be connected such that the outer conductor is connected to the guard conductor of the triaxial cable (as shown in FIG. 5I), or the outer conductor may be connected to the outer conductor of the triaxial cable.

Figure 19:
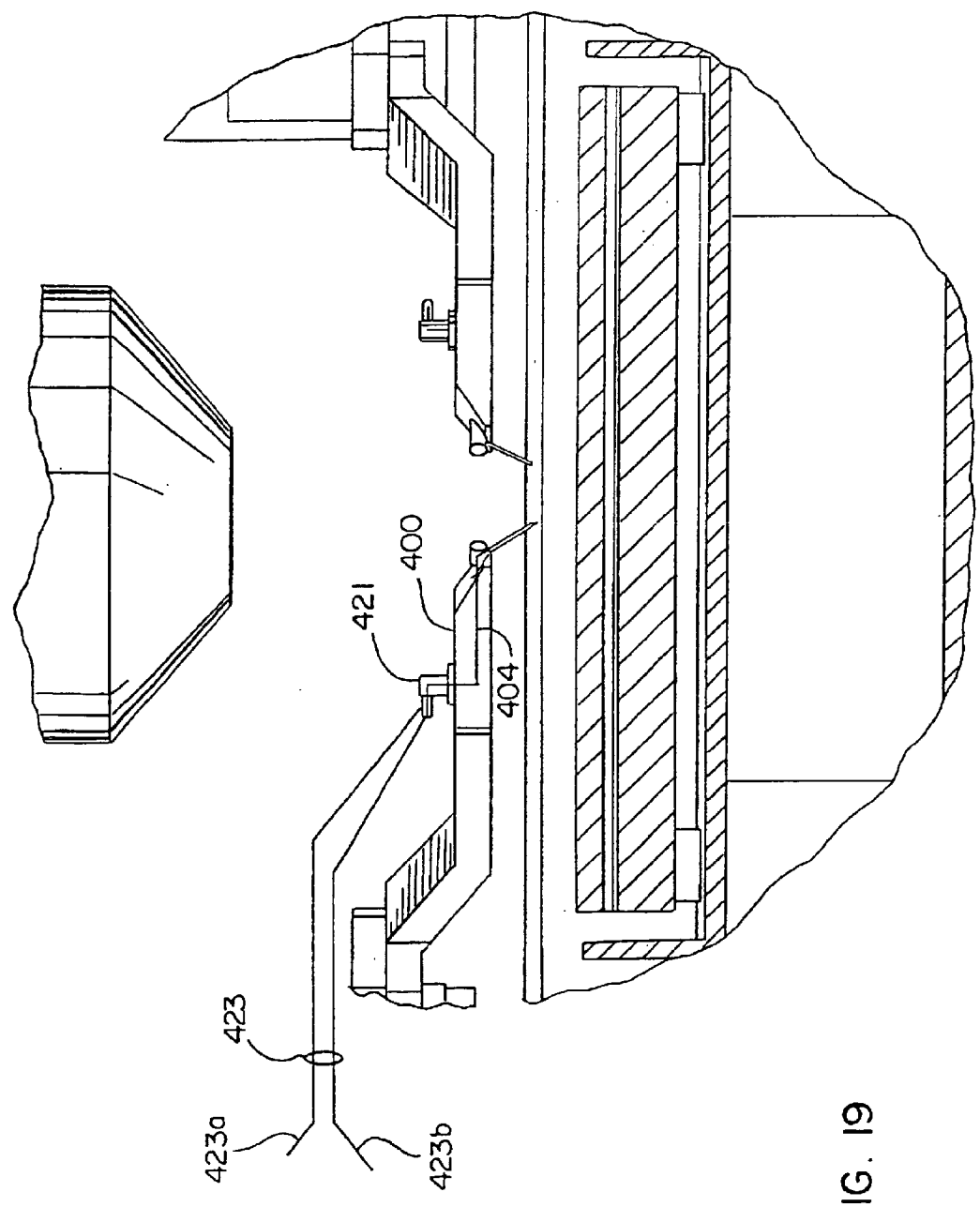
FIG. 19 is an enlarged schematic view of the high resolution probe assembly of FIG. 18, showing the coaxial configuration from one of the feedthroughs to one of the probe assemblies.

FIG. 19 shows how coaxial configuration of probes 256 would compliment a coaxially configured probe station 100 and how such would assist in conducting low current/low voltage probing with minimal amounts of noise by surrounding the DUT 118, (e.g., above, below, and around), by a coaxial arrangement. For example, below the DUT 118 is chuck 260 which, in a coaxial configuration, has first conductive element 261 coupled to the signal line, and second and third conductive elements 262 and 264 connected to ground. Above the DUT 118, are probes 256, which could be configured coaxially by having outer and intermediate conductors 400 and 402 connected to ground, and inner conductor 404 connected to the signal line. Around the entire probe assembly 106 is first and second chambers 108 and 182, and upper, intermediate and lower portions 222, 224 and 226 of microscope 104 which may be coupled to ground.

As mentioned previously, any number of wiring schemes could be used for each of the components of probe station 100. For example, the innermost conductor and line 404 and 386 could be coupled to the signal line and the outermost conductor and line 400 and 382 could be coupled to the guard line. In a preferred form of probe station 100, the system and all of its components are setup in a triaxial configuration due to the added protection such configurations offer with respect to shielding and preventing interference such as noise and parasitic capacitance. In addition, those conductors used for shielding, e.g., outer probe station housing 108, third chuck conductor 264 and outer probe housing portion 400, and those used for guarding, e.g., inner housing 182, second chuck conductor 262, and intermediate probe conductor 402, can be electrically connected together to provide an integrated approach to the shielding/guarding configurations of the probe station 100.

In other forms of probe station 100, other types of probes may be used. For example, the probe station 100 may use a triaxial probe similar to the one disclosed in U.S. patent application Ser. No. 09/815,952, filed on Mar. 23, 2001, which is hereby incorporated herein by reference in its entirety. FIG. 17 shows a side view of one embodiment of such a probe, which is identified generally at reference numeral 430. In the embodiment shown, the probe 430 of the invention has a main horizontal section 432 that extends along longitudinal axis 432a and a rear section 434 that extends upward at an angle B to the axis 432a. By way of example and not limitation, the angle B can be approximately 65°. The angled section extends to an integral connector assembly 436 which provides an electrical connection to the female connector of a triaxial lead (or cable) for electrically connecting the probe 430 to test instrumentation. Connector assembly 436 includes a conductive outer body 438, which is made of a conductive metal such as gold plated brass. The conductive outer body 438 includes threads 440 on its outer surface at an end thereof adjacent enlarged portion 442 for mating with the connector of the triaxial cable. Shank 448 extends from the connector assembly 436 in a direction approximately parallel to longitudinal axis 432a for being attached to a connector of a manipulator to thereby permit precise adjustment of the probe tip end 446 relative to conductive path indicia on the DUT 118. The shank 444 includes shank portion 448 extending from base portion 450, and is welded to the outer body 438 of connector assembly 436 at a beveled end of the base portion 450. By way of example, and not limitation, the horizontal section 432 of probe holder 430 can extend approximately 2.375 inches in length from the terminal end of insulator member 452 to bend 454, and the rear section 434 of the probe holder 430 can extend about 1.25 inches from the bend 454 to shoulder 442.

The probe tip 456 has a bent configuration so that the projecting portion 458 may have a predetermined angle of attack toward a specimen or DUT 118. The probe 430 has a main horizontal section 432 that extends along longitudinal axis 432a of the probe 430 for positioning of the projecting portion 458 adjacent the DUT 118 remote from the manipulator the probe 430 is attached to. The projecting portion 458 can define an attack angle A of approximately 45° with the axis 432a. The user may wish to change the attack angle to accommodate the physical space limitations of the probe station and spacial orientation of integrated circuits present in a given test application. The detachable connection with which probe tip 456 is connected to probe 430 permits probe tips of different attack angles to be quickly and conveniently interchanged by the user when a different attack angle is desired. Probe tips having attack angles from 45° to 70° have been found to be suitable for many test applications, although attack angles can be tailored to angles outside this range as may be necessary in certain test setups.

The probe station 100 may also be equipped with a probe touchdown sensing mechanism 460 so that the probes 256 do not damage the DUT and/or conductive path indicia during testing. This is particularly true when it comes to testing/probing expensive DUTs such as 300 mm wafers. In order to prevent such damage from occurring, the probe station 100 may use touchdown sensing mechanisms that are capable of sensing when the probes 256 have made sufficient contact with the conductive path indicia to conduct the necessary testing or probing. This type of touchdown sensing can be achieved by mechanical means or by electronic means. One type of mechanical touchdown sensing mechanism that may be used is disclosed in U.S. Pat. No. 4,956,923, issued to Pettingell on Sep. 18, 1990, which is hereby incorporated herein by reference in its entirety. According to this touchdown sensing mechanism, when the probe tip is lowered into engagement with the target circuitry 118, a contact block is moved out of engagement with a lower terminal or screw causing the normally closed set of contacts to open, and eventually moving the contact block into engagement with another contact causing the normally open set of contacts to be closed. This touchdown sensing mechanism also serves as a force control which allows the force with which the probe point touches the DUT 118 to be adjusted to either require less force for sensing or require more force for sensing depending on what type of sensitivity is desired for a particular application.

In another form, the touchdown sensing mechanism 460 of probe station 100 may use an electrical signal sensing mechanism. In a preferred form, this is accomplished by connecting the touchdown sensing mechanism between the probes 256a–d and the test/measurement equipment 464.

Figure 20:
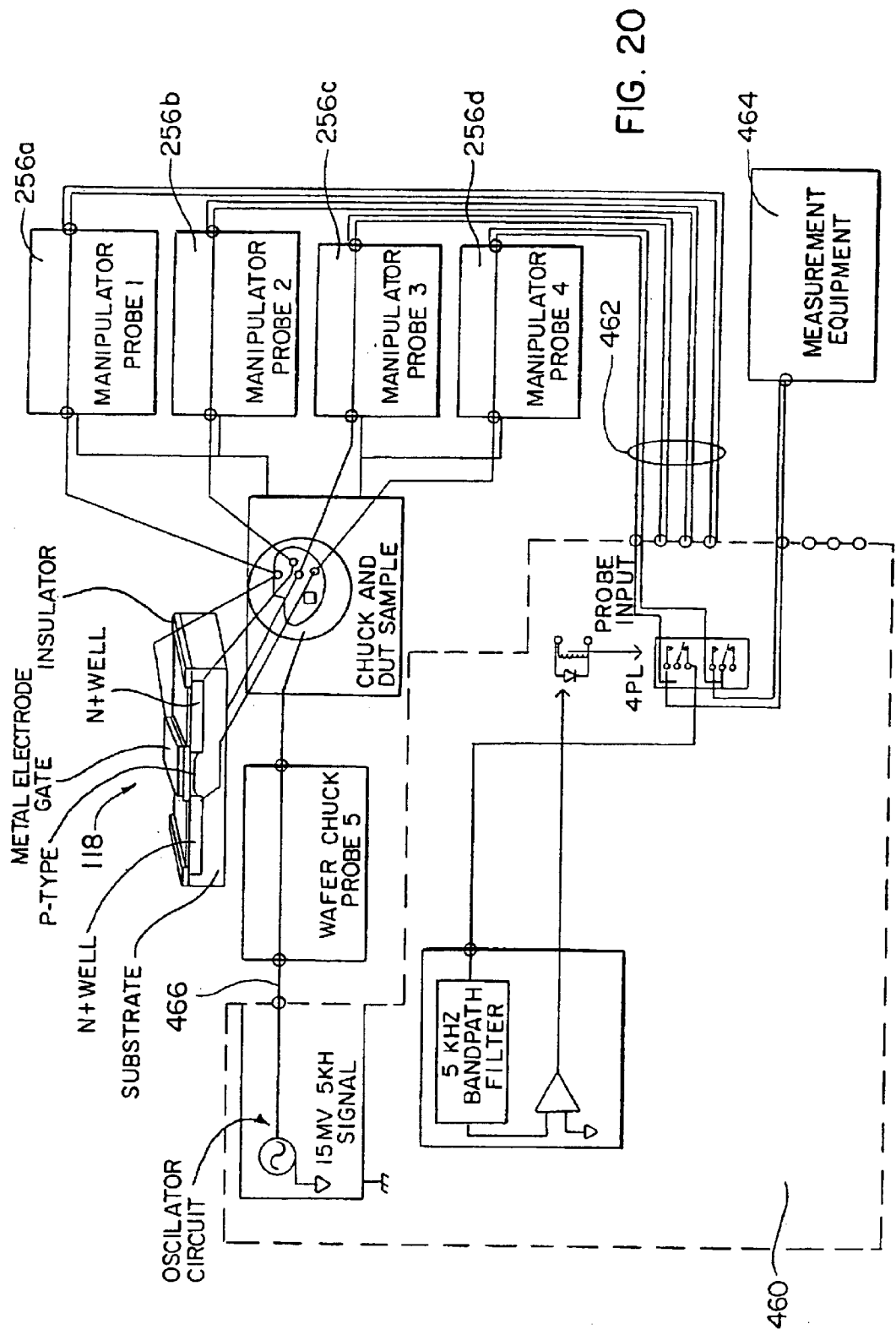
FIG. 20 is block diagram of an electronic touchdown sensing mechanism for sensing engagement of the probes with the specimen.

The sensing mechanism 460 applies a carrier signal to the specimen 118, and begins moving the probes 256 into contact with the specimen 118 until they make electrical contact with the specimen 118 and begin sensing or detecting the carrier signal applied to the specimen 118. To move the probes 256*a–d* and DUT 118 into contact, the system 100 may raise the carrier 250, or lower the probes 256 via the platen 258 and/or the z-stage 316. Once the touchdown sensing mechanism 460 senses the carrier signal through one of the probes, it stops sensing for the carrier signal with that probe because sufficient contact (or touchdown) has been made between that probe and the conductive path indicia (or target) of the DUT 118. In a preferred embodiment, as shown in FIG. 20, the contact sense module 460 is connected to the inputs 462 of probes 256*a–d* and associated manipulators 252*a–d*, test/measurement equipment 464, and the DUT 118 (and/or chuck 260). The probes 256*a–d* are themselves electrically connected to various conductive path indicia on the DUT 118. The sense module 460 supplies a low frequency carrier signal 464 with a very low amplitude, (e.g., a 5 kHz sine wave at 15 mV), to the DUT 118 via a probe. At this point, the sense module 460 begins monitoring the remaining probe inputs looking for a rapid change in potential. When the module 460 senses the sine wave through a measurement probe, indicating sufficient contact or touchdown has been made, the module 460 energizes a light emitting diode (LED) associated with that probe, emits an audible alarm indicating the signal has been detected, and switches the output of the probe that has detected the signal from sensing to output. Once all of the probes have made sufficient contact with the DUT 118, the module 460 stops outputting the carrier signal.

In a preferred form of contact sense module 460, the system operator will "reset" the module 460 causing it to reconnect/output the carrier signal to the probes 256*a–d* in order to confirm that touchdown has been made. If the carrier signal is sensed on all of the probes again, the oscillator output signal will be disconnected and probing may begin. If the module 460 does not sense contact on any, or all, of the probes 256*a–d*, an inspection of the probes 256*a–d* should be conducted to determine if the probes 256*a–d* are no longer capable of maintaining good contact with the DUT 118, (in which case tip replacement should be performed), and/or to determine what, if any, other problems may exist. Once sufficient contact or touchdown has been detected, the contact sensing module 460 relinquishes control/monitoring of the probe inputs to the test/measurement equipment 464 so the system operator can begin probing the DUT 118.

The contact sensing module 460 may also include an optional sensitivity control which allows the system operator to adjust the module 460 from less sensitive settings to more sensitive settings when desired. When adjusted to a less sensitive setting, the module 460 will take longer to detect probe touchdown. When adjusted to a more sensitive setting, the module 460 will react quicker to probe touchdown to ensure that only the lightest contact is made between the probe and the DUT 118. Thus, a less sensitive setting is appropriate when testing a more durable specimen, whereas a more sensitive setting should be used when testing a fragile specimen. When the module 460 is set for maximum sensitivity, however, it is more susceptible to noise and may erroneously signal touchdown prior to good contact being made with the DUT 118.

The contact sensing module 460 may be configured such that it is a stand-alone device, or may be integrated into the control systems of system 100. In addition, the contact sensing module 460 may be setup so that touchdown is achieved via a fully automated process, a fully manual process, or a combination of the two.

The form of electrical touchdown sensing described above is a combination of automated processes and manual processes in that it allows the module 460 to automatically detect the initial touchdown of the probes 256*a–d*, and thus relies on the system operator to manually initiate a reset procedure in which the module confirms proper touchdown. In alternate forms of sensing, the manual confirmation step may be done automatically. In yet other forms, the system operator may lower the probes 256*a–d* manually until touchdown is detected by receipt of the carrier signal.

Depending on the type of testing needed to be done, the probe station 100 may be setup using a very basic probe consisting of a single conductor with which test signals can be applied or acquired, while in other applications, the probe may consist of a more complex probe, such as the low current/low voltage triaxial probes discussed above, or high frequency probes capable of applying and acquiring high frequency test signals. In other instances the probe station 100 may be setup using probe cards and their respective probe card holders or adapters. For example, the probe station 100 may be setup to use a fixed probe card and a fixed probe card adapter to conduct a final wafer test on an integrated circuit prior to the circuit being packaged. Typically, the fixed probe card includes a card made of ceramic or fiberglass, which defines an opening (usually in the center of the card), and has a plurality of probes positioned around, and extending into, the opening so that the probes will make contact with bonding pads located about the perimeter of each integrated circuit die located on the wafer. The fixed probe card is placed in an adapter or holder which positions the probe card over the DUT. Typically the probe card adapter features easy load and unload controls, planarization adjustment controls, and theta adjustment controls, for making setup and use as easy as possible. Once positioned, the plurality of probes extending from the probe card are used to acquire and apply various test signals to the bonding pads located on the wafer or DUT so that the device can be checked prior to being broken out and packaged. Typically, the testing of the DUT will involve a full diagnostic check to make sure the circuit will operate as it is suppose to once it is packaged.

An example of a fixed probe card and a fixed probe card adapter assembly is illustrated in FIGS. 15A–F and is identified generally by reference numeral 470. The assembly 470 includes a probe card adapter 471 which has a generally circular shaped framework consisting of an outer ring portion 471*a* and an inner card holding portion 471*b*. The assembly 470 also includes probe card 472, which is retained by card holding portion 471*b* and has a plurality of probes 256 extending downward from a centrally located opening in the card 472. The card holding portion 471*b* has two rectangularly shaped supports 473 which form channels or side guides 474 extending the length thereof and within which at least an outer side edge portion of card 472 is held. In the form illustrated, the supports 473 are connected to the lower surface of ring portion 471 a via fasteners such that they depend from the ring 471*a* toward the carrier 250, and the guides 474 are formed from a lower T-shaped portion of the supports 473. With this configuration, each support 473 contains two channels or guides 474 and can therefore by used universally on either side of the probe card 472 and/or either side of the ring portion 471*a*.

Once the card 472 has been inserted into the guides 474, a plurality of card retainers such as thumb screws 475 may be used to secure the card fixed into the adapter 471. The adapter 471 is itself secured to the platen 258 via additional securing mechanisms or fasteners such as screws 476, and includes planarity adjustment or screw mechanisms 477 which may be used to tilt, tip or level the adapter 471 with respect to the DUT 118 and/or surface of chuck 260. In a preferred form, the planarity adjustment mechanisms 477 are used to make course adjustments to planarity.

The adapter 471 may also be configured such that rotation or adjustment of the card 472 can be made while the card is secured by the adapter, as shown in FIGS. 15A–F. In a preferred form, this rotation is achieved by the ring portion 471a by having a stable or static outer rim from which the adapter is connected to the platen 258, and having a movable inner rim from which the card holding portion 471b is connected. The rotation of the card 471 and inner rim is controlled by theta adjustment mechanism 478, which causes the inner rim of adapter 471 to rotate within its outer rim by turning the knob 478a of theta adjustment mechanism 478. The knob 478a operates a geared transmission which translates the knob rotations into movement of the inner rim of adapter 471.

When installed on system 100, the assembly 470 may be connected to various test equipment in a similar fashion to that of the socket stage adapter and socket card discussed above. More particularly, leads from the various test equipment, and/or an edge connector, can be connected to the plurality of terminals or contacts 472a located on the edge of the card 472. Each contact 472a is connected to at least one of the plurality of probes 256 and can allow the system operator to apply the desired signals, (e.g., current, voltage or data) and/or receive resultant information to/from the DUT 118. In this way, a variety of different testing or probing can be accomplished with system 100.

The components of the system 100 may be moved about and operated in a variety of fashions. In a preferred form, the system 100 includes motion control mechanisms 540 (FIGS. 5H, 24A–C, 25A–B, 26A–B and 27) which may include X, Y and Z drives, as well as tilt/tip mechanisms 542. The control mechanisms 540 and 542 shown in FIGS. 5H, 24A–C, 25A–B, 26A–B and 27, allow the DUT 118 to be moved about below the platen 258 so that the probes 256 can reach, and the microscope 204 can view, the various conductive path indicia of the DUT. Similar to the motor control mechanisms discussed above with respect to probe assemblies 106, mechanisms 540 include motor driven screw drives which are used to move the platform 544 and/or the carrier 250 about below the microscopes 104 and/or 105 thereby simulating microscope movement 104 over the DUT 118.

The platform 544 is generally rectangular in shape and is operably connected to the carrier 250 via the Theta, X and Y drive stages 311, 312 and 314, and to the platen 258 via Z drive members 316 which extend upward from the platform 544 to the platen 258. More particularly, the platform 544 is designed as a base or stage to which the X, Y and Z drives 312, 314 and 316, the theta drive 311, the carrier 250, platen 258 and probe assemblies 106 are supported or connected.

Figure 25A:
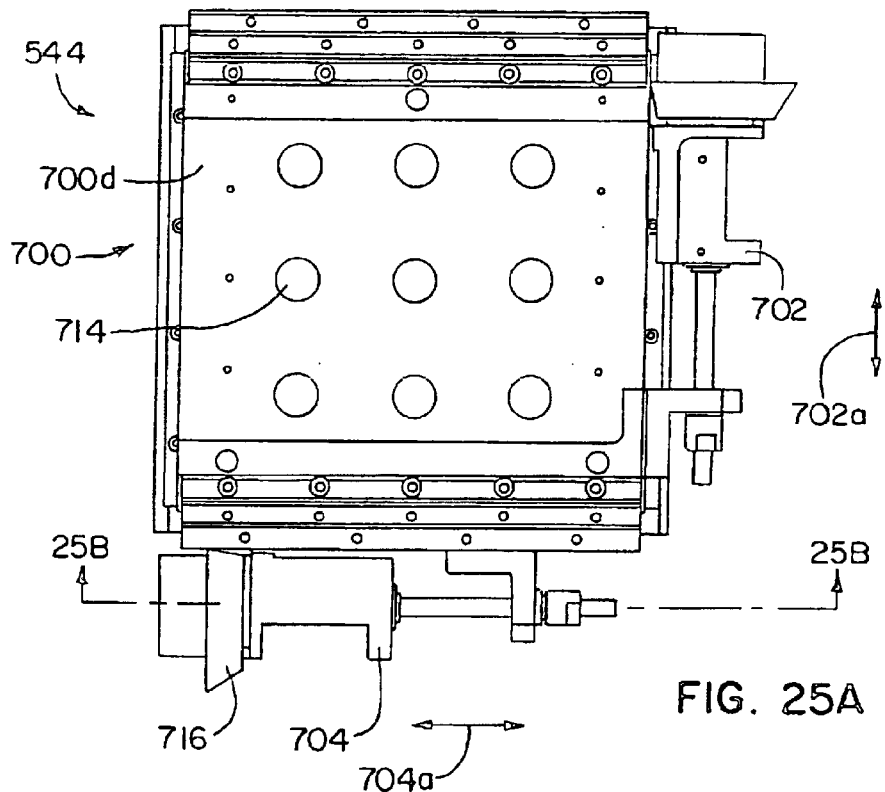
FIGS. 25A–B are top plan and side elevational views, shown in partial cross section, of the X and Y stage for the system platform (the platform stage)
Figure 25B:
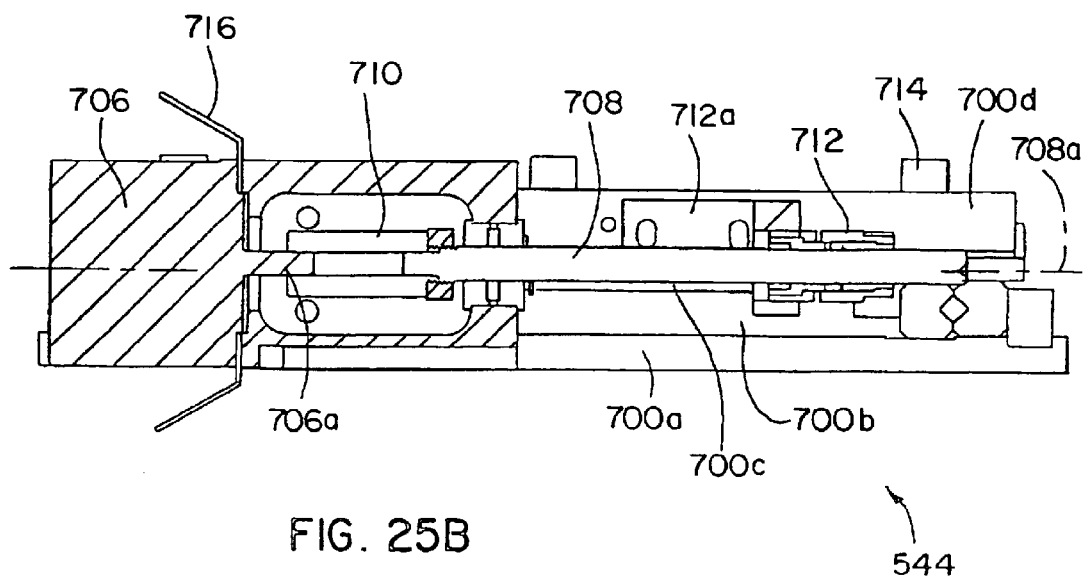

As shown in FIGS. 25A–B, the platform 544 can be driven in the X and Y direction via motor and screw drive assemblies 702 and 704, respectively. Operation of the X axis stage drive 702 moves the bed 700 of the platform in the X-direction indicated by arrows 702a. Operation of the Y axis stage drive 704 moves the bed 700 in the Y-direction indicated by arrows 704a. This movement is achieved by using the motor to rotate a lead screw to a nut attached to the bed 700 and threaded onto the screw. Rotation of the motor in one direction causes the lead screw to move the nut, along with the bed 700 attached thereto, towards the motor. Rotation of the motor in the other direction will cause the lead screw to move the nut and bed 700 in a direction away from the motor. This configuration allows for movement of the carrier 250, manipulators 252a–d, and probes 256 by simply moving the platform 544, and allows the microscope 104 to remain primarily stationary which, as discussed above, is advantageous due to the expense, size, and difficulty in moving the microscope 104. In FIG. 25B, which is a cross sectional view taken along line A—A in FIG. 25A, the Y axis stage drive 704 is shown having motor 706 connected to lead screw 708 via coupling 710. Nut 712, which is connected to bed 700 via mounting bracket 712a is threaded onto the screw 708. The bed 700 has a lower guide member 700a upon which an upper slide member 700b is shifted. The mounting bracket 712a connects the nut 712 to upper member 700b so that linear movement of the nut 712 along the rotating screw 708 will shift the upper member 700b along the screw axis 708a extending in the Y-direction. As motor 706 rotates its output shaft 706a, lead screw 708 is rotated causing the nut to travel along the screw 708 either closer to, or farther from, motor 706.

In the present high resolution probing station 100, the vacuum chamber 190 is desired for the preferred scanning electron microscope 104 to minimize interference with the electron beam it generates for obtaining high resolution images of the DUT 118. With the low vacuum pressures, however, thermal expansion of the materials of the components employed in the chamber 190 is exacerbated due to the substantial absence of a heat conducting medium, e.g. atmospheric air, for dissipating any heat that may be generated therein. In particular, the aforedescribed drives for the platform stages situated in the vacuum chamber generate heat upon operation of their motors. This heat is conducted to the connected screw drives, which can create imprecision in the movements to be controlled thereby. Further, heat generated by motor operation can radiate to metallic components in the chamber increasing their temperature. Because of the often very small movements that are usually desired in the chamber, any derivation such as due to thermal expansion of the screws, nuts or brackets is to be avoided. Thus, the preferred high resolution probing station 100 has stage drive systems that are well-suited for use in the present vacuum chamber 190 to provide high precision movements of these stages therein.

Preferably the motion control mechanisms and drives of system 100 are constructed of materials having low coefficients of thermal expansion such as ceramic in order to insulate the mechanisms/drives from the heat generated by operation of the motors in the vacuum chamber 190 and particularly to minimize the amount of material growth that is experienced by the positioning equipment due to this heat. In the Y axis stage 704 shown in FIG. 25B, a ceramic coupling 710 is used to keep the heat generated by motor 706 from conducting or transferring to the lead screw 708. This insulates the lead screw 708 from heat conducted thereto by the motor 706 which could cause the screw to expand resulting in unwanted movement of the stage and components attached thereto, (e.g., the platform 544).

In the form illustrated, the lead screw 708 is also constructed of heat insulating material such as jewels like single crystal sapphires or rubies, or ceramics having very low coefficients of thermal expansion. This composition further keeps the heat of the motor from causing thermal expansion in the lead screw 708 and growth thereof and attendant unwanted platform movement due to such thermal expansion. Additional components of the drive mechanism, such as motor mounts, bearings and bearing mounts, nuts, brackets, and the like, can be constructed of similar heat insulating materials in order to further insulate the stage and drive mechanism from heat and unwanted movement.

The drive mechanism of FIG. 25B also has a radiation shield 716 positioned between the heat generating motor and the lead screw 708 and other driven components for deflect the radiated heat or energy created by the operating motor back toward the housing walls, which are better able to handle a buildup of heat due to their exposure to the outer atmosphere. More particularly, the radiation shield 716 is made from stainless steel and forms a ringed collar about the motor which is angled for optimal deflection of the unwanted heat or energy.

As shown in FIGS. 25A–B, the upper slide member 700b of bed 700 has standoff columns 714 extending therefrom which are connected to the lower surface of platform 544 and are used to create clearance between the lower surface of the platform 544 and the outer housing of motor 706. Thus, with such a configuration, the platform drive assemblies can be positioned directly below the platform 544 for space conservation in the chamber 190. Once connected, the platform 544 and X and Y stage drive assemblies 702 and 704 allow the system operator to move the carrier 250, manipulators 252a–d, and probes 256 by simply moving the platform 544 so that the desired specimen can be quickly positioned below the microscope 104 or 105.

Figure 24A:
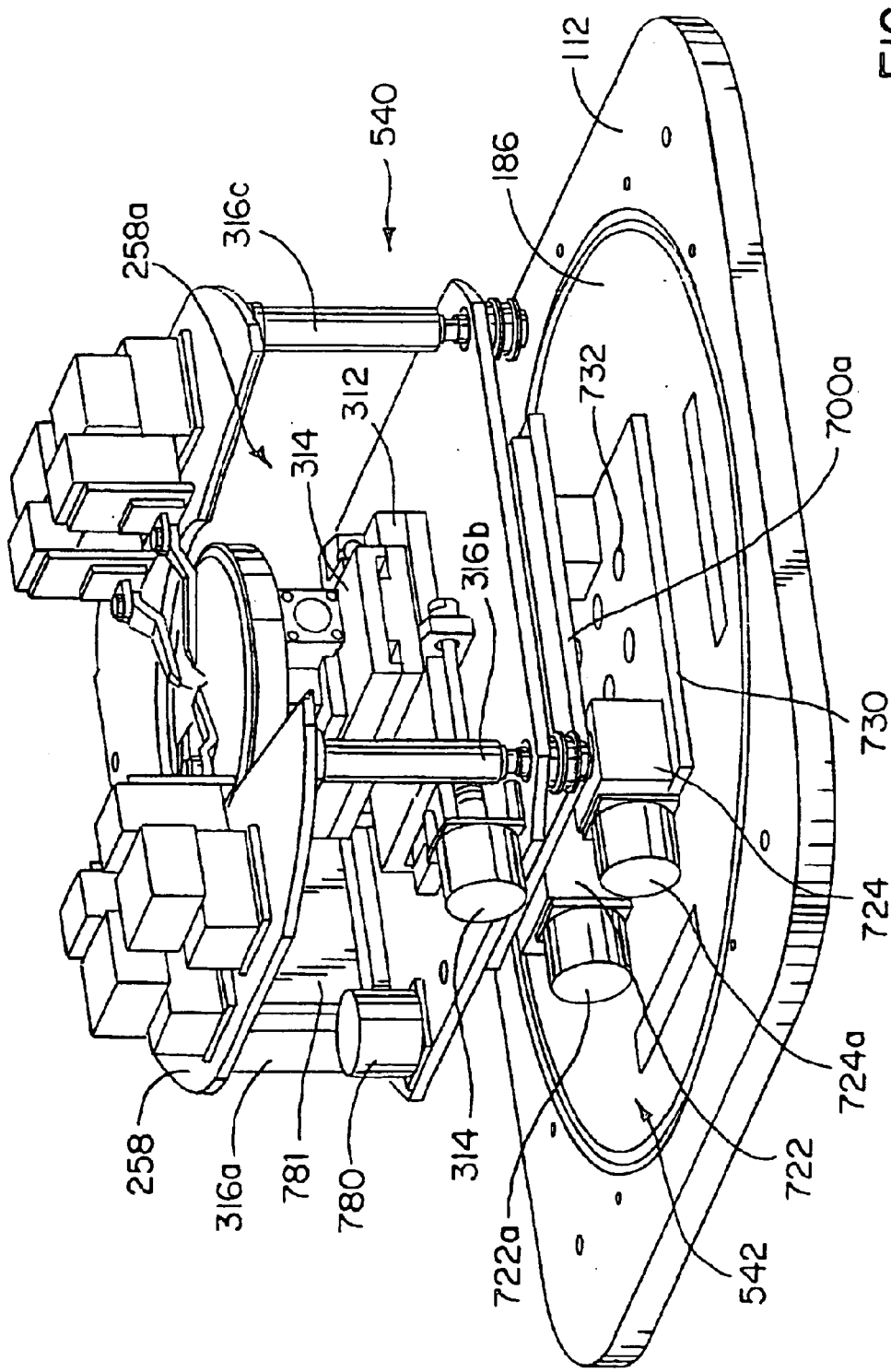
FIGS. 24A–C are perspective, front elevational and right side elevation views of the probe station located within the high resolution analytical probe station housing, showing the housing floor and the tilt/tip mechanisms.
Figure 24B:
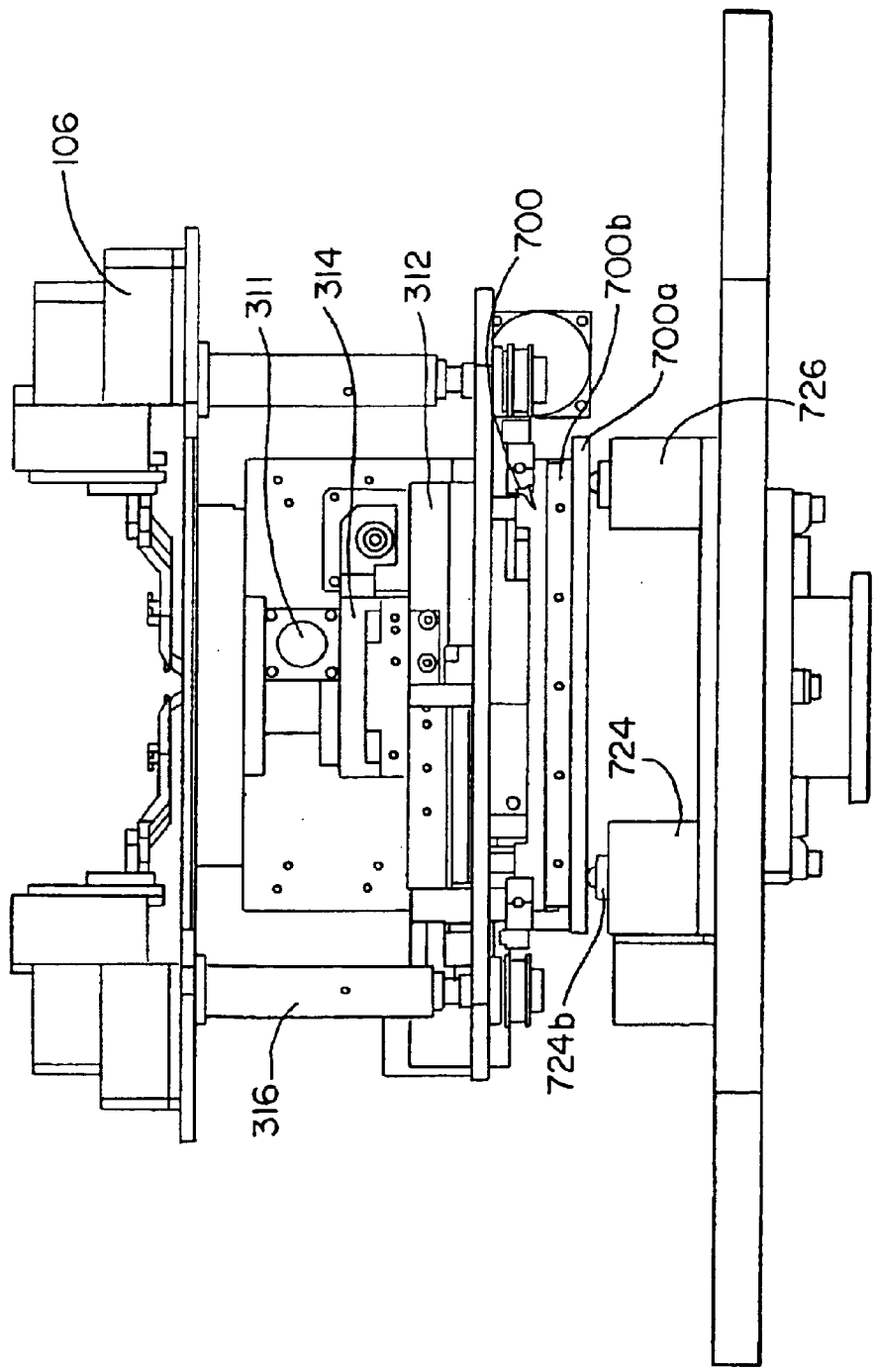
Figure 24C:
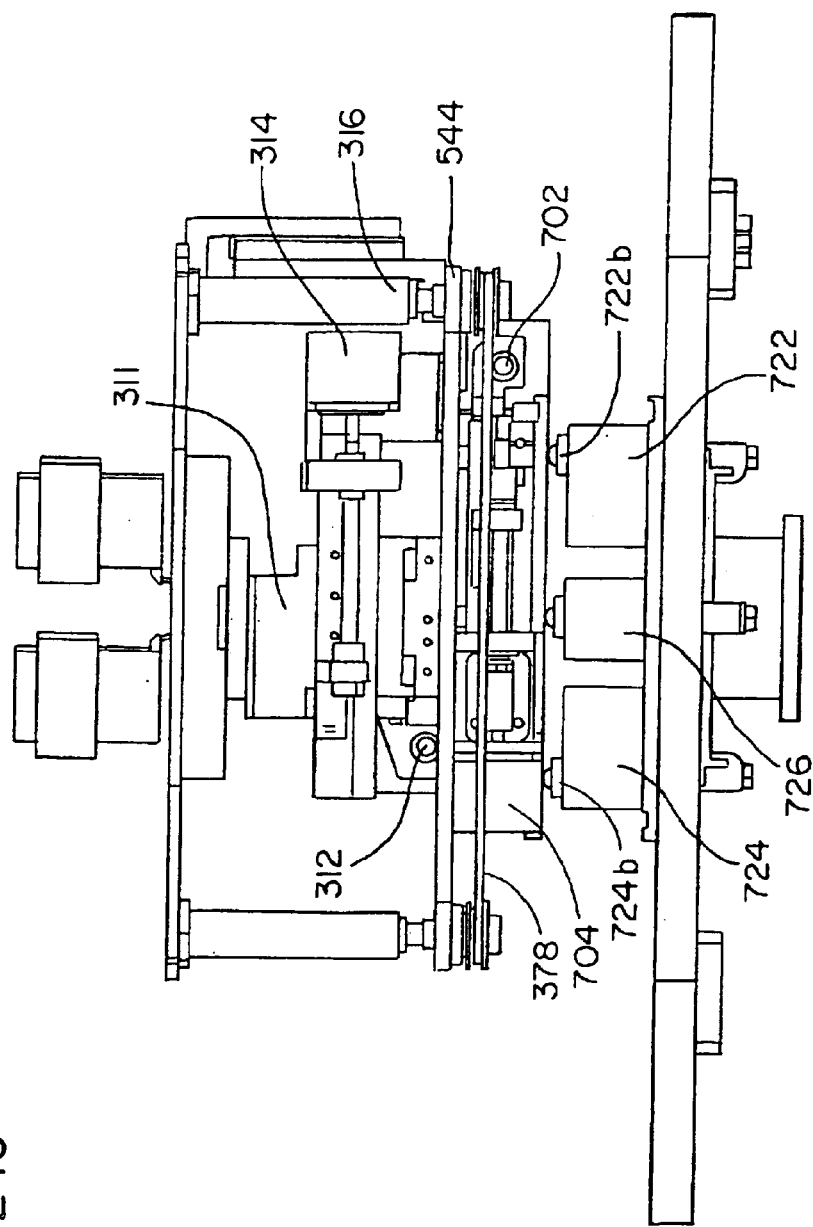

The lower guide member 700a of bed 700 is further connected to the tip/tilt control mechanism 542, as best shown in FIGS. 24A–C. This tilt/tip motion control mechanism allows the platform 544, along with the theta drive 311 and X, Y and Z drives 312, 314 and 316, and the platen 258 and probe assemblies 106, to be tilted and/or tipped in desired directions so that optimal views of the DUT 118 or placement of probes 256 may be had.

The tilt/tip motion control mechanisms 542 includes three separate bearing pivots 722, 724 and 726 spaced about the bottom of the housing 102 below the platform 544. In a preferred form, the pivots 722 and 724 have motor driven support bars 722b and 724b for raising or lowering their respective lower guide member portions independent of one another. The third pivot, pivot 726, is a fixed pivot or gimble which is not capable of raising and/or lowering its respective lower guide member portion. Since pivots 722 and 724 are motorized, pivot 726 does not need to be motorized in order to tilt/tip the platform 544 and its connected components in the desired manner. For example, if a system operator desires to tilt the platform 544 shown in FIG. 24B down to the left, the operator need only lower the support bars of the pivots 722 and 724. Alternatively, if the system operator desires to tilt the platform 544 down to the right, they would raise the support bars of the pivots 722 and 724 until the desired amount tilting has been reached. The pivots 722, 724 and 726 are positioned in triangular manner so that any desired tilting/tipping can be achieved. With such a configuration, any two pivots can form an axis about which tilting or tipping can be performed. The selected operator of motors 722a and 724a determine about which axis the platform 544 will be tilted.

In order to provide the maximum amount of tilting, the support bars of pivots 722 and 724 are preferably at mid travel when the platform 544 is parallel to the floor or base walls 112 and 186 of housing 102. With such a configuration, the platform 544 can be tilted up or down in equal amounts by pivots 722 and 724. The support bars preferably have rounded end portions for connecting to the lower guide member 700a in a ball and socket type fashion for smooth pivoting engagement therebetween.

The pivots 722, 724 and 726 are mounted to a lower support plate 730 which in turn is mounted to the floor of housing 102. Given the lower support plate's proximity to the floor of the housing 102, and the vacuum pump openings 142 located therein, a preferred form of the lower support plate 730 includes openings 732 which correspond to pump openings 142 and assist air flow in chamber 190 and minimize the amount of time it takes for vacuum 115 to pump air out of chamber 190. The lower support plate 730 is preferably of such a height to provide clearance for the pivot motors 722a and 724a from the floor of the housing 102.

In alternate forms of system 100, the lower guide member 700a may be connected to an upper support plate for the tilt/tip mechanism 542 in order to provide additional clearance for motors and/or in order to provide a more compartmentalized system 100. For example, an alternate form of system 100 is shown in FIG. 5H in which tilt/tip mechanisms 542 have been removed to reduce the size of housing 102 and system 100.

Figure 26A:
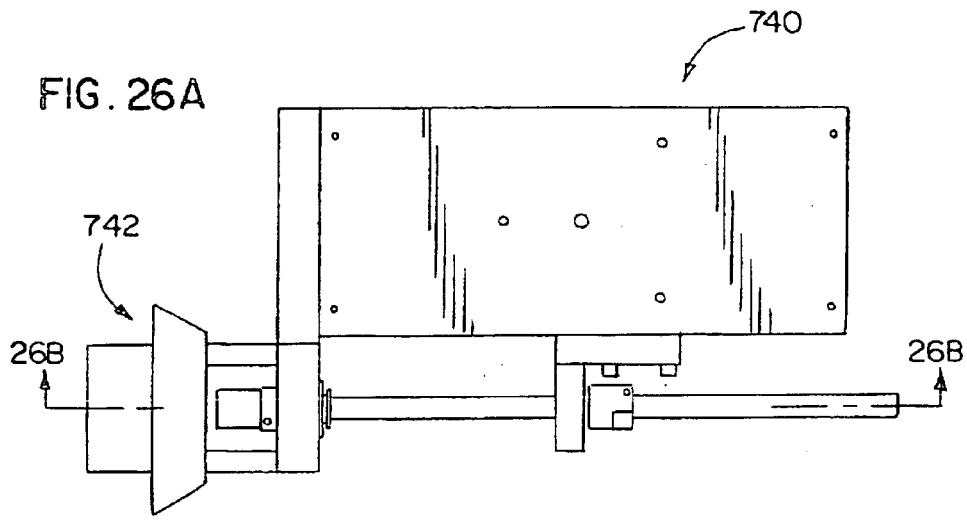
FIGS. 26A–B are top plan and side elevation views, shown in partial cross section, of the X stage used for translating the carrier in the X direction.
Figure 26B:
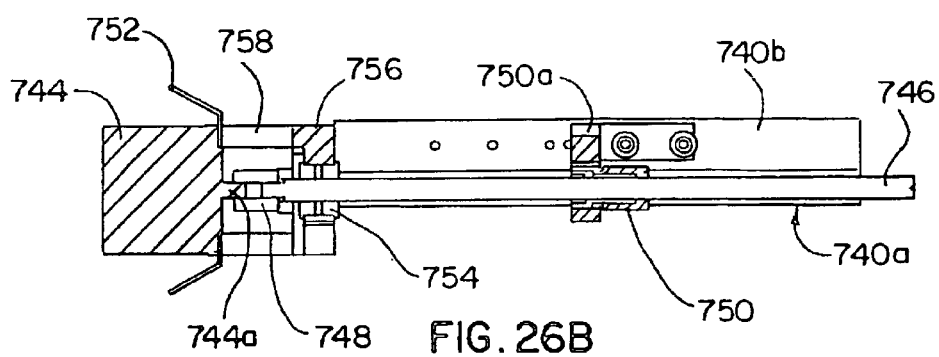

Positioned atop the platform 544 is the X drive (or stage) 312, which may be used to move the carrier 250 along its X axis. Movement of this stage 312 also results in movement of the Y stage 314 and the theta drive 311 carried thereby. As shown in FIGS. 26A–B, the X drive 312 is similar in construction to the platform drive or stage discussed above (e.g., X and Y drives 702 and 704). The X drive 312 has a stage (or bed) 740 upon which the Y drive 314 is mounted, and has a drive mechanism 742 for translating the stage 740 back and forth along the X axis. The stage 740 is comprised of a lower guide member 740a upon which an upper slide member 740b travels. The drive mechanism 742 consists of a motor 744 connected to lead screw 746 via coupling 748. Operation of the motor 744 rotates its output shaft 744a, which rotates coupling 748 and lead screw 746. Rotation of the lead screw 746 causes nut 750 to travel along the screw shift closer to or farther from motor 744. The nut 750 is connected to the upper slide member 740b via nut mounting bracket 750a. When the lead screw 746 is rotated in one direction the nut 750 is moved toward the motor 744 thereby causing the upper slide member 740b of x-stage 740 to travel in the same direction and parallel to the lead screw 746. When the lead screw is rotated in the opposite direction, the nut 750 is moved away from the motor 744 thereby causing the upper slide member 740b to travel in the same direction as the nut and parallel to the lead screw 746.

In order to reduce or minimize the effect heat has on the X drive 312, the drive has been constructed similar to the platform drives 702 and 704 discussed above. More particularly, radiator shield 752 is connected to motor 744 in order to block or hinder the amount of heat or infrared energy generated by motor 744 from radiating to other portions of the drive mechanism 742 and system 100. In a preferred form, the shield is angled at its radially outer positions back toward the housing side wall 188. In this way, radiation is directed generated by heating of the motor 744 operating in the vacuum chamber 190 to the side wall 188. The side wall 188 has a great mass of metal material relative to other system components in the housing 102 to better absorb and conduct heat throughout its entire extent. Further, heat from the side wall 188 can be conducted to outer side wall 114 which can dissipate external heat to the atmosphere.

To further assist in reducing or minimizing the effects of heat on system 100, and particularly on drive mechanism 742, the lead screw 746 is connected to the motor output shaft 744*a* via a ceramic coupling 748. This removes the metal-to-metal contact between screw 746 and shaft 744*a* and hinders the heat transfer from the motor 744 to the screw 746. To further reduce heat transfer and its effects on the motion control mechanism 312, the screw 746 may be made from an insulating material such as a jewel like ruby or sapphire, or a ceramic or other insulative material.

The bearing 754 used with screw 746 may also be made of an insulative material in order to minimize the effect heat has on drive 742. Likewise, bearing mount 756 and motor mount standoff 758 may also be constructed of such insulative materials. The use of such materials for drive assembly 742 minimize unwanted shifting of the drive components affecting their precision movements of the carrier 250. The low coefficient of thermal expansion of ceramic ensures minimum of thermal expansion of these drive components. Although ceramic motor mount standoff 758, bearing mount 756 and bearing 754 were not mentioned above with respect to the platform drive systems, such features can also be utilized in these drive assemblies to achieve a similar beneficial result.

Coupled to the X-stage 312 is Y-stage 314, which rests atop the X-stage and allows the carrier 250 to be translated back and forth in the Y direction or axis. Movement of this stage also results in the movement of theta drive 311. As can best be seen in FIG. 24A, the Y stage 314 is very similar in construction to the X-stage 312 discussed above, however, the Y-stage 314 is mounted such that movement of the carrier 250 is in a direction perpendicular to that of the direction traveled by the X-stage 312. The Y stage 314 has a drive mechanism 760 which consists of a motor operated screw drive identical to that of the X stage drive mechanism 742. Heat protection similar to that mentioned above with respect to the X stage 312 can be implemented in the Y-stage 314 and is present in a preferred form of the high resolution vacuum probing 100 herein.

In order to make system 100 more effective for probing large specimen such as 300 mm wafers, the X and Y stages 312 and 314 maybe designed with enlarged beds or stages or support structures in order to minimize the amount of Y-stage 312 overhang from the X-stage 312. This prevents deflection that can occur if too large of an overhang is created which results in shifting of the carrier 250 and specimen falling out of focus. For example, if system 100 is being used to view/probe a large specimen and the Y stage 314 is translated to an extreme end in the Y direction, the combined weight of the carrier 250, theta drive 311 and specimen 118 may be enough to cause the Y-stage to deflect down at the end furthest from the X-stage 312 creating enough movement in the testing surface to place the specimen out of focus with the microscope 104 or 105. In order to avoid this, the width of the X-stage 312 is preferably increased to accommodate the full extent of y-axis movement thereby avoiding overhang, and/or additional support structures may be added off to the side of the X-stage 312 in order to provide support to the Y-stage 314. An example of the latter would be to configure the nut and nut mounting bracket shown in FIG. 24A so that it also serves as support for the Y stage 314 when translated out beyond the side of the X stage.

Figure 27:
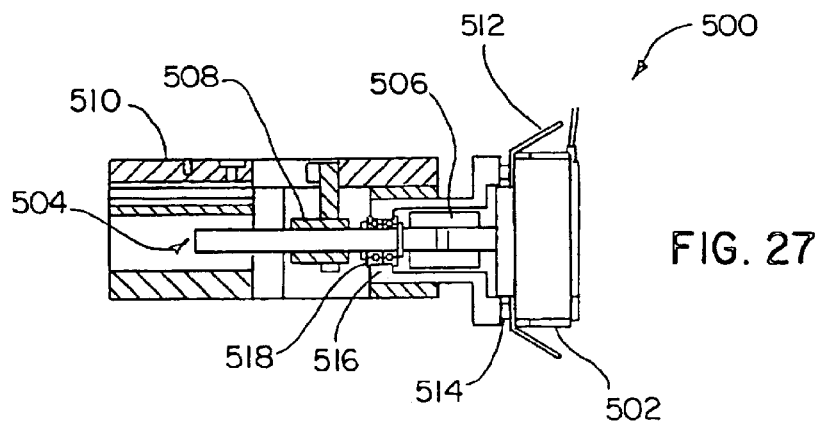
FIG. 27 is a side elevational view, shown in partial cross section, of a stage drive mechanism for a manipulator.

Before discussing the Z stage 316, it should be noted that the concepts of the motion control mechanisms discussed thus far are generally applicable to any of the motion control mechanisms of system 100, such as those used in conjunction with the manipulators 252*a–d*. For example, an adjustment mechanism for any of the X, Y and Z stages of manipulators 252*a–d* is shown in FIG. 27. According to this illustration, the adjustment mechanism (which is referred to generally by reference numeral 500) includes a motor 502 which is coupled to isolated lead screw 504 via insulative shaft coupling 506. As discussed previously any insulator may be used for coupling 506 so long as it contains the desirable thermal properties, i.e., low coefficient of thermal expansion, for handling the heat generated and/or radiated within chamber 190. When the screw 504 is rotated in a first direction, the nut 508 is moved farther away from the motor 502 causing motion plate 510 which is attached to nut 508 to also move away from motor 502 in the direction defined by the axis of screw 504. When the screw 504 is rotated in the opposite (or second) direction, the nut 508 and motion plate 510 are moved closer to the motor 502.

The manipulator adjustment mechanism 500 may also utilize the thermal protection concepts discussed above with respect to other motion control mechanisms. For example, in FIG. 27, radiator shield 512 is used to deflect and/or hinder radiation of heat/energy from motor 502. The motor 502 is also isolated from the remainder of the drive mechanism 500 by isolating spacers 514. In addition, a thermal bearing insulator 516 is used to isolate bearing 518 from the rest of the mechanism 500. Alternatively, in other forms of system 100, a ceramic bearing may be used with the adjustment mechanism 500.

Turning now to FIGS. 24A–C, the Z stage 316 preferably includes four column shaped members 316*a, b, c* and *d* that have screw drives for raising and lowering the platen 258 with respect to platform 544 therebelow. More particularly, each column 316*a–d* has a sprocket 770 which is located below the platform 544 and is connected to a lead screw 772. The lead screw 772 passes through an opening in the platform 544 and supported by bearing 774 thereunder. A nut 776 is threaded onto the screw 772 and connected to the sleeve portion that makes up the majority of column shaped members 316*a–d*. When the motor operates to rotate sprocket 770 and lead screw 772, the nut 776 and its attached sleeve or column are moved closer to or farther from the sprocket 770. For example, when the sprocket 770 and lead screw 772 are rotated in one direction, the nut 776 and sleeve are moved away from the sprocket thereby raising the platen 258. When the sprocket 770 and screw 772 are rotated in the opposite direction, the nut 776 and sleeve are moved closer to the sprocket thereby lowering the platen 258. Thus, the Z drive 316 operates to raise and lower the platen in the Z direction or axis.

The sprockets of the column members 316*a–d* are connected to one another via a driven member such as a belt or chain 778 (FIG. 24C). The driven member 778 is connect to, and driven by, the single motor 780 which can best be seen in FIG. 24A. In this way, only one motor is needed to operate the Z drive 316, and each column member 316*a–d* will raise or lower the platen 258 simultaneously in equal amounts. In alternate forms of system 100, however, each column 316*a–d* could be configured having its own motor or drive mechanism and with each column member being operable independent of the others. With such a configuration, the Z drive 316 could be used not only to raise and lower the platen in the Z direction, but also to perform tilt/tip functions similar to those discussed above with respect to tilt/tip drive mechanisms 542.

A Z-shape guide and slide 781 is positioned near the back of the chamber 190 and is attached to the platform 544. This guide/slide 781 is similar in construction to the guide and slides discussed with respect to X and Y drives 312 and 314 and operates to guide the Z drive mechanisms 316a–d in a straight up and down (or vertical) manner to ensure that no lateral movements are made which might affect the positioning of the DUT 188.

The motion control mechanisms of system 100 maybe operated and configured in a variety of ways in order to provide any number of desired movements. For example, the platform 544 may be used for coarse adjustments of the carrier 250 and DUT 118, while more precise (or fine) adjustments may be made via the X, Y, and Z stages 312, 314 and 316 of the carrier 250. The motion control mechanisms 540 of platform 544 may be used to generally position the desired portion of the DUT 118 and carrier 250 under the microscope 104 or 105, (e.g., general X and Y positioning), while the X, Y and Z stages 312, 314 and 316 of carrier 250 maybe used to actually position the probes 256 on the desired conductive path indicia of the DUT 118, (e.g., fine X, Y and Z positioning).

The fine positioning of the DUT and carrier typically involves using the X and Y stages 312 and 314 of chuck 260 to position the DUT 118 in the appropriate X and Y positions and then using the Z stage 316 to raise the DUT 118 into contact with the probes 256 and/or lower the probes 256 into contact with DUT 118 via the Z position adjustment mechanism 358 or 374 of manipulators 252a–d.

In alternate forms of probe station 100, the probes 256 may be capable of positioning themselves, (e.g., probes with internal motor driven joints), however, such a configuration is less desirable than the configurations discussed above because it introduces additional noise making components, which are very near to the probes 256, thereby increasing the risk of noise or other interference affecting the acquired and applied test signals. As with the X, Y and Z stages 312, 314 and 316, the screw drive motion control mechanisms 540 may use a variety of types of motors, such as linear motors, stepper motors, servo-motors, or the like, as long as they are capable of providing the desired translation of the platform 544 (including platen 258, carrier 250, manipulators 252a–d, probes 256).

As mentioned above, the tilt/tip mechanisms 542 also position the DUT 118 under the probes 256 and microscope 104. For example, these mechanisms 542 may be used to position probes 256 on the DUT in a desired fashion, to assist the user in "seeing" probe-touchdown on the DUT, or simply to allow the user to observe the probes 256 making contact with the DUT 118 from an angle other than vertical.

The probe station 100 may also be setup with environmental controls 550 which operate to control the temperature and atmosphere within the housing 102. Such controls 550 may be used to conduct "at temperature" testing or to obtain specified atmospheric conditions in order to more accurately test how a DUT 118 will operate in its actual application environment. The environmental controls 550 may also be used to minimize the effect any of the components within housing 102 may have on the probing/testing of the DUT 118. For example, a temperature control system 552 is shown in FIG. 21 which consists of a network of fluid carrying tubes 554 that are used heat up or cool down the temperature within housing 102 and/or the various components therein.

In a preferred form of probe station 100, the tubes 554 carry a coolant, such as cold water, throughout the inner chambers 108 and 182 in order to cool down the probe station 100. The tubes 554 rely on heat transfer principals to remove unwanted or excessive heat generated by the motion control mechanisms 540, stages 312, 314, 316, manipulators 252a–d, and carrier 250. Such a system 552 is particularly desired in vacuum environments because vacuum environments are excellent thermal insulators in that there is nowhere for the heat generated by the system to go. This built-up heat can have deleterious effects on the probe station and/or its components. For example, the probe station 100 may be setup using a thermal chuck 260 which is used to test a wafer 118 at temperatures slightly above ambient temperatures. While testing the wafer 118 at temperature, the motors used to move the chuck 260, the manipulators 252a–d, the platform 544 may begin to generate heat due to their use. Without a temperature control 552, this motor-generated heat may raise the temperature inside housing 102 to a level above that which the wafer 118 was to be tested at and may cause inaccurate readings to be taken when conducting the probing of the specimen 118. However, by providing a temperature control system 552, the motor-generated heat may be accounted for and removed from the probe station 100 so that the wafer 118 can be tested at the appropriate temperature. Another negative effect of component-generated heat is that it can affect the operation of the probe station equipment. For example, excessive temperature within housing 102 has been shown to cause the probes 256 to vibrate or wobble. Such motion in the probes 256 not only makes it more difficult to operate the probe station 100 because of difficulties in placing the probes 256, but also may prevent the probe station 100 from being used to probe various specimens 118 such as very small wafers having minute conductive path indicia because any type of vibration may make it impossible to position and maintain the probes 256 on the desired indicia.

The temperature control system 552 also allows the probe station 100 to maintain a desired temperature within housing 102 by accounting for the fact that components, other than those specifically meant to supply heat such as a thermal chuck 260, may end up generating heat over time themselves. Although the network of fluid carrying tubes (or lines) 554 shown in FIG. 21 should be sufficient to dissipate any unwanted heat, additional lines carrying fluid about the carrier 250, manipulators 252a–d, probes 256 and motion control components may be employed to control the temperature of each device and/or assist in controlling the temperature within housing 102.

Given the various types of testing that may be performed and various types of carriers 250, manipulators 252a–d, and probes 256 that may be used by probe station 100, it is foreseeable that these components may be swapped in and out of the probe station 100 quite frequently. As such, the probe station 100 may equip the components and/or the leads connecting the components in such a way that they can be quickly and easily removed and re-installed. For example, in FIG. 21, the electrical leads 120 that run to each device may include detachable interconnections 560 located proximate to the device so that the operator does not need to spend time installing, uninstalling and/or reinstalling corresponding leads 120 every time he or she wishes to swap in and/or out a device. The detachable interconnections 560 may be located at a variety of positions about the leads and lines. Furthermore, the components of the probe station 100, such as the carriers 250, manipulators 252a–d, probes 256, etc., may contain lead connections or ports that allow for quick and easy installation, removal, and/or reinstallation of the leads 120 connected to that component. In a preferred form, detachable interconnections 560 are located on the leads 120 proximate to the carrier 250, manipulators 252a–d, and probes 256, as well as proximate to the feedthroughs 138 and 140, and proximate to the controllers used to operate the probe station 100. Ideally the carrier 250, manipulators 252a–d, and probes 256 contain lead connections or ports which further allow for quick and easy installation, removal, and/or reinstallation of the leads 120.

While the above description of probe station 100 discussed the basic structure of the probe station, including its housing 102, high resolution microscope 104 and probe assembly 106, the following will discuss the setup and operation of the probe station 100 and provide additional details regarding the software used to operate the probe station. The probe station 100 is a high resolution analytical probe station that is capable of conducting low voltage/low current testing in a low noise environment. More particularly, the probe station 100 is connected to a controller, such as a processor or network of processors, which operate, monitor, and collect data from the probe station 100. Preferably the controller consists of a personal computer, as mentioned above, having a monitor 572 and video imaging capabilities. The controller is connected to the various components of the probe station 100, (e.g., theta drive 311, X, Y and Z drives 312, 314 and 316, carrier 250, probe assemblies 106, etc.), via leads (or lines) 120 passing through feedthroughs 138 and 140. Feedthroughs 138 and 140 allow vacuum tight seals to be made with the housing so that the housing portions 108 and 182 can be pulled into a vacuum state. As discussed above, the leads/lines may consist of triaxial cables 275, coaxial cables 423, thermocouples, and piping or conduit for such things as wire, vacuum lines, air lines, and/or environmental controls 550 such as fluid carrying tubes 554.

Additional leads 120 may be connected from the controller or other supporting equipment, such as air tanks, vacuum pumps, temperature controllers, etc., directly to other portions of the probe station 100. For example, microscope operating leads may be connected directly from the controller and the mains power supply to the microscope 104. In addition, vacuum lines may be connected directly from a vacuum pump to pump passages 142 and 144 of housing 102.

The probe station 100 tests the specimen 118 by positioning probes 256, via the controller, over various conductive path indicia located on the surface of the specimen 118 and uses the probes 256 to either apply or acquire a variety of test signals to or from the DUT 118. More particularly, the controller operates motion control mechanisms 540 and tilt mechanisms 542 to position the platform 544 and the associated carrier 250 so that probes 256 are generally above the desired conductive path indicia to be probed (or target area). The controller further operates X and Y position adjustment mechanisms of manipulators 252a–d, and X and Y stages 312 and 314 of probe assemblies 106, to position the probes 256 above the target area. Then the controller raises the carrier 250 via Z stage 312 of probe assembly 106, and/or lowers probes 256 via Z position adjustment mechanism 358 of manipulators 252a–d, until the probes 256 have made sufficient contact with DUT 118 to conduct the desired testing. In a preferred form, the controller is connected to a contact sense module 460 and stops the motion control mechanisms when sufficient probe touchdown has occurred. This prevents the DUT 118 from being inadvertently damaged by probes touching down with excessive force.

The environmental control system 550 monitors and/or controls the environment, including the temperature, humidity, vacuum state, etc., within housing 102 so that it is set at, and remains at, the desired setting for testing the DUT 118. The various parts of the probe station, such as the environmental control system 550, may be controlled by the controller and/or may be controlled at least in part by additional controllers.

Once the probes 256 are positioned and the environment is set, testing is ready to begin. At this point, the probe station 100 begins using the probes 256 to either apply or acquire test signals. Typically, one probe will be used to apply a test signal at a desired point in the circuit of specimen 118, and another probe will be used to acquire the signal resulting from the application of the test signal at another point on the circuit of specimen 118. The probe station 100 may then be used to analyze the acquired signal to determine if it is generally equal to the signal that should have been acquired at that particular point in the circuit of specimen 118. If it is equivalent, that portion of the circuit is presumed to be operating correctly. If the acquired signal is not equivalent to the signal that should have been received at that particular point in the circuit, then the specimen 118 may be further analyzed to determine what is wrong, or may simply be marked as a defective component.

After this target area has been probed, the probe station 100 may locate and begin testing another target area on DUT 118. Depending on the location of the next target area, the probe station 100 may simply need to raise and re-position the probes 256 via manipulators 252a–d to position the probes 256 above the new target area, or the probe station may need to use additional motion control components including manipulators 252a–d, X, Y and Z stages 312, 314 and 316, and motion control mechanisms 540 and tilt mechanisms 542 in order to position the probes 256 above the new target area. For example, if the new target area is very close to the area that was just probed, fewer motion control mechanisms may be needed in order to position the probes over the new target area. However, if the new target area is farther away from the area that was just probed, more or even all of the motion control mechanisms may be needed in order to position the probes over the new target area, (e.g., if the manipulators 252a–d cannot move the probes 256 far enough to reach the new target area, the carrier X, Y and Z stages 312, 314 and 316 may be needed; similarly, if the X, Y and Z stages cannot move the probes 256 far enough, the motion control mechanisms 540 may be needed).

Once the probes have been positioned over the new target area of the DUT 118, the controller (or other actuator control) will raise the carrier 250 via Z stage 312 and/or lower the probes 256 via manipulators 252a–d to move the probes 256 into sufficient contact with DUT 118 to conduct the desired testing. As discussed above, a probe touchdown sensing mechanism 450 may be used to determine when sufficient probe touchdown has been made. Once testing is ready to begin, the controller begins acquiring and/or applying test signals about the target area via the probes and analyzes the test results to determine if the DUT is operating correctly. The probe station 100 may also be setup using a socket stage adapter 320 and socket card 330, fixed probe card, and/or a test head with which various types of DUTs can be tested. Although the connections and setup for these devices may differ, the general operation of probe station 100 is similar to that discussed above, (e.g., applying probes to target areas, probing and analyzing data, etc.).

The actual control and operation of probe station 100 may be made via traditional input devices associated with the controllers, such as a keyboard, mouse, joystick, touch sensitive screen, or the like. The probe station 100 may also be programmed so that the probe station 100 is capable of performing repetitive testing with minimal user input. Additional controls may be provided on the exterior of housing 102 and/or may be provided in a pendant control which is commonly used in the industry and with the products sold by The Micromanipulator Company, Inc.

Figure 22B:
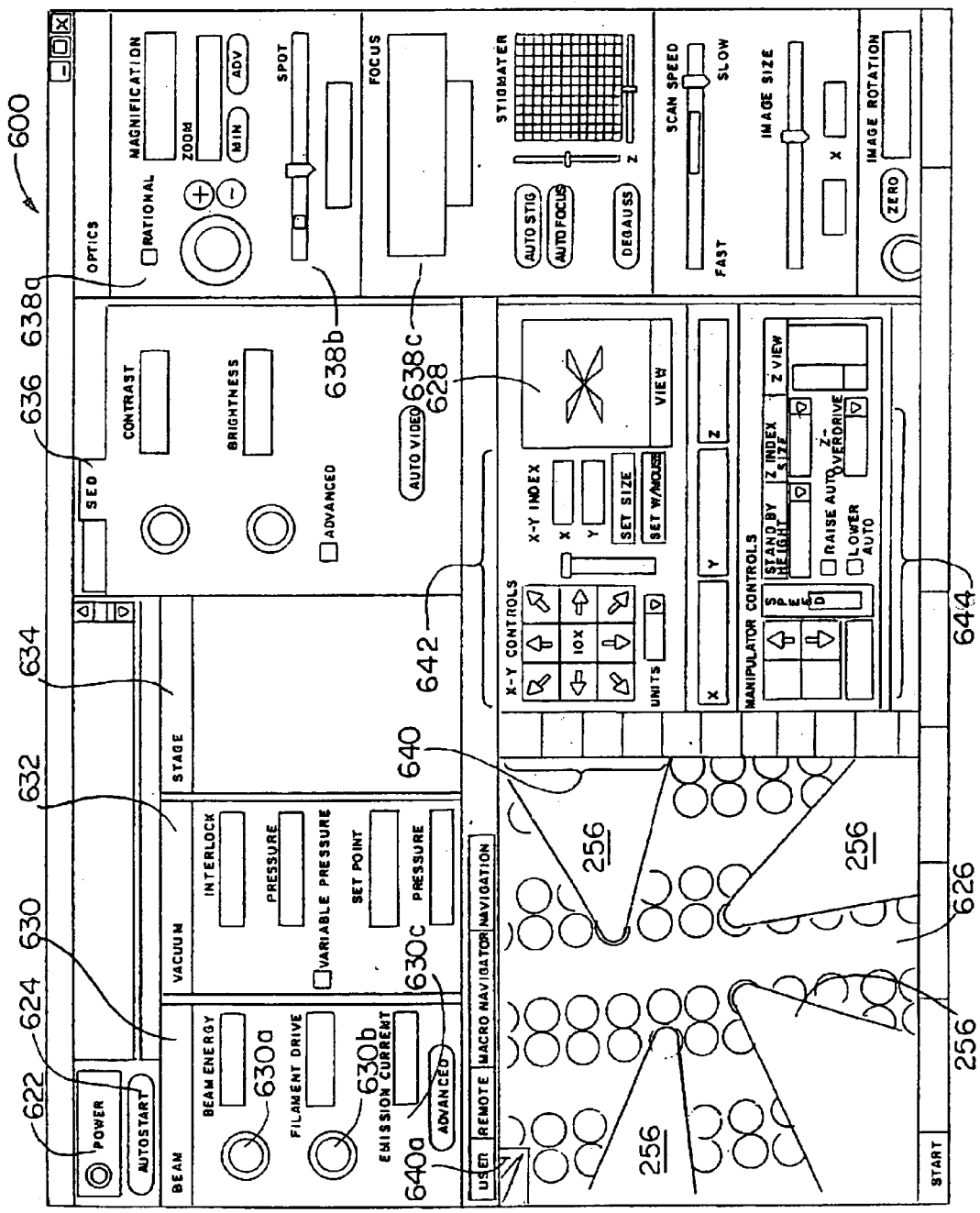

In order to assist the user in probing the DUT 118 and moving the DUT about so that multiple target areas can be probed, the probe station 100 may be setup with the PCPII software discussed above. Screen views of the PCPII software as they may appear on a monitor 572 of a controller external from probe station housing 102, such as computer system 16 mentioned above, can be seen in FIGS. 22A–B. In FIG. 22A, the PCPII software interface 580 allows the probe station user to make remote adjustments to the microscope 104, and manipulators 252a–d and probes 256 via user interface control panels 582 and 584 respectively. For example, the microscope control panel 582 allows the probe station user to adjust the focus of microscope 104 via control 586. In addition, speed may be adjusted by scrolling up or down scroll bar 588 on the control panel 582.

The manipulators 252a–d, and probes 256 can be controlled via control panel 584. For example, speed and direction of travel in the X and Y directions can be adjusted via XY settings 590. Similarly the speed and direction of travel in the Z direction can be adjusted via Z settings 592. The control panel 584 also displays the current position data below the XY settings 590 and Z settings 592, and allows the probe station user to select what units measurements and/or movements are made in.

The PCPII software interface 580 also allows the probe station user to setup and view a wafer profile via control panel 594. For example, when the DUT 118 consists of a wafer, the probe station user can type in the diameter of the wafer and a grid of dies present on the wafer can be generated, (e.g., columns and rows). The probe station user can enter particular features pertaining to the die via the die program tools 596 and can pick which die is to be viewed by the microscope 104 by simply selecting the die with cursor 598.

More particularly, cursor 598 can be used to indicate the respective selected location or test site on the specimen being probed, (e.g., the sites at which test signals are transferred to and from the probe). In this manner, an operator can change selected test locations via on-screen manipulation of the cursor, as by a mouse or other computer interface control. Moving the cursor 598 causes the relative position between the probe 256 and the specimen surface to shift under software control so that the probe 256 is oriented at the selected test site. To this end, the software is programed to operate actuators of the probe assemblies 106 and/or the carrier 250, (e.g., X, Y and Z stages 312–316 and/or the motion control mechanisms 450), on which the specimen is affixed for precision shifting thereof to position the probe 256 at the selected test site. More particularly, the software is used to interpret the cursor movement and determine the precise distance with which the DUT needs to be moved. This analysis may not only require the application of a scaling factor to calculate the horizontal distance that must be traveled, but also may involve determining which actuators are to be used, (e.g., probe assembly actuators, carrier actuators, etc.), in order to accomplish the desired travel in the most efficient manner.

Accordingly, with a mouse, an operator can click and drag the cursor 258 across the screen to the desired conductive path indicia location or terminal they desire to test. This cursor movement can result in a variety of different movements for the probe station 100. For example, the user may click and drag the cursor from one die to another, causing the probes 256 to move from one die to another so that the new die may be probed or analyzed. Alternatively, the user may click and drag the cursor from one probe location to another, causing the selected probe to move from one location on a particular die to another location on that same die. In a preferred form, the operator or user is capable of selecting what type of movement he or she wants via the software prior to making the move. For example, if the user would like to move a single probe from one location to another, he or she would position the cursor 258 over the probe he or she wishes to move, and then would click and hold the mouse input button down and drag the mouse until the cursor 258 is at the desired new test location for that probe. Once the mouse input is released, the software would cause the selected probe to move to its new location. Alternatively, the user could indicate that he or she wishes to switch dies and he or she would position the cursor 258 over the current die, and then click and drag the cursor to the desired die to be probed. Once the mouse input is released, the software would cause the desired die to be placed under the high resolution microscope 104 for probing.

Although a click and drag type input process has been described, alternate input processes may be used so long as the desired movement is achieved. For example, movement from one die to another could be achieved by simply positioning the cursor 258 over the desired die to be tested and clicking or double-clicking the mouse input causing the selected die to be positioned under the high resolution microscope 104. Similarly, probe movement from one location to another on the same die could be achieved by clicking on the desired probe to move, or selecting via a menu which probe is to be moved, moving the cursor 258 over the desired new location for that probe, and then clicking or double-clicking the mouse input at that cursor location causing the selected probe to move to the desired new location.

The wafer profiles and settings entered into the probe station 100 can be saved so that similar DUTs can be probed by simply calling up the stored settings. For example, a wafer ID can be assigned to certain types of wafers and the probe settings and testing procedures for these types of wafers can be recalled by simply entering the assigned wafer ID into the wafer ID field 593. This allows the probe station user to test similar wafers more rapidly and provides a way in which routine probing can be programmed into the probe station 100 so that it can be accurately repeated in the future.

Video images of the probes 256 and DUT 118 may be viewed and/or adjusted via control panel 595. The video images 597 are provided to help the probe station user identify where on the DUT 118 they are at, as well as to assist the user in positioning the probes 256 and in probing the DUT 118. One of the notable features of this control panel 595 is the ability to print images of the DUT 118 via the print icons located in the tool bar of the control panel 595.

The screen view shown in FIG. 22B depicts another form of software interface 620 which may be used to control system 100. In this interface, power to system 100 is turned on/off via power switch 622. The system user can perform an automatic start feature by selecting AutoStart 624 which will start the high resolution microscope 104 imaging. An active image of the probes 256 will be displayed in field 626, and a "bird's eye" view of the probes and specimen will be generated in field 628. The electron beam characteristics can be monitored and controlled view field 630. More particularly, the system user can adjust or monitor the beam's voltage 630a, filament 630b and current 630c via field 630 so that the desired testing can be performed.

Similarly, the system user can control the vacuum characteristics and stages of system 100 in fields 632 and 634. The image displayed in field 626 can be automatically adjusted via the brightness and contrast adjustment switches of filed 636, and/or can be manually adjusted by selecting the advance settings box and selecting AutoVideo button. The optical controls of the SEM 104 can also be adjusted by selecting any of the items in the optics field 638. For example, the magnification of the image can be increased or decreased via the control settings 638a. The spot size and focus characteristics can also be adjusted in field 630 at 630b and 630c. Additional settings for the microscope 104 can be adjusted in field 630 including the astigmatism, beam scan rate, image size and image rotation.

According to this interface 600, the system operator moves the desired probe 256 by selecting which probe assembly 106 he or she wants from the icons identified by reference numeral 640. Once selected an icon 640a identifying which assembly has been selected appears in the top left corner of the active image viewing field 626. In the illustration shown in FIG. 22B, manipulator one has been selected. Thus, the manipulator controls and monitoring sections pertain to that of manipulator one. For example, the manipulator X and Y controls 642 displayed in FIG. 22B are currently setup to maneuver manipulator one and to display the positioning data of this same manipulator. Similarly, the manipulator Z controls 644 shown display the pertinent Z data for manipulator one and control the Z drive mechanism for this assembly. Some of the Z controls shown include probe up/down selections, theta speed setting selections, and course adjustment selections for the Z direction (or Z job selections).

Below the manipulator selection icons 640, are stage selection, tilt selection, theta selection, live image selection and freeze image selection icons which allow the system user to perform the stated task and/or select from a variety of available tasks for the stated feature. For example, the system operator could select the stage select icon and then select from any of the stage mechanisms discussed above including the theta drive 311, X, Y and Z stage 312, 314 and 316, or microscope stage (or platform stage) coupled to platform 544. An auto start feature may be provided for the software interfaces which will provide the system user with quick and easy images from which to start.

FIGS. 22A–B reflect how the PCPII software has been created and/or modified to control both the SEM 104 and the probe station components including probe assemblies 106, carrier 250 and stages 311, 312, 314, 316, 702 and 704. In a preferred form of system 100, the SEM imaging software supplied with SEM 104, was only setup to be run with an ActiveX component having specific names and interfaces. Since the ActiveX component is the only way to interface other components with SEM 104, the PCPII software of system 100 was redesigned to handle both the SEM imaging and control, and the probe station navigation (pcNav) and video (pcVideo). The pcNav and pcVideo are collectively referred to herein as the probe station application.

A pcRouter Dynamic Data Exchange interface was created to allow the 16 bit probe station application (probe station navigation and video) to work in conjunction with the 32 bit SEM control application. Since both applications are competing for system resources, a preferred form of system 100 turns the SEM imaging application off when navigation is desired, and turns the navigation application off when SEM imaging is desired. Thus, when the system user is done viewing a target with the SEM 104 and desires to move to a new target on DUT 118, the SEM imaging application is shut off and the pcNav application is operated. In this way the user can move from conductive path indicia on one die to other conductive path indicia on the same die or on other dies located on the DUT 118. Conversely, when SEM imaging is again desired, the pcNav application can be shut off and the SEM imaging turned back on so that SEM 104 can begin scanning the target specimen and system 100 can display a high resolution image. This configuration ensures that all motion control functions will be initiated from the ActiveX navigator in the SEM 104.

The optional joystick or pendant control discussed above with respect to the operation of the system 100 can be used in conjunction with the PCPII software interface and is implemented by using an application such as pcLaunch to take over the operating system of the controller, (e.g., to take over WINDOWS). More particularly, when a movement in the joystick or input device is made, pcLaunch is activated thereby taking control of the operating system. Once this event occurs, the SEM imaging application is shut off so that the desired navigation function can be performed. Once navigation is complete, the navigation application (including the joystick navigation controls) is shut off and the SEM imaging application is turned back on.

Thus, PCPII provides an interface for allowing the system user to both control the SEM 104 and the probe station including its many components, (e.g., the carrier 250, probe assemblies 106, drives and stages 311, 312, 314, 316, 702 and 704, etc.). With the interfaces described a system user can position individual probes, as well as multiple probes, wafer (or carrier) stages 311, 312, 314, 316, 702 and 704, platen 258, and probe assemblies 106 including the various stages of manipulators 252a–d. More particularly, the probe assembly controls and high resolution microscope controls can be integrated together with auto scaling to the SEM image in on the screen (the active image), which allows for the click-n-drag navigation to be used. Furthermore, the positioning controls of system 100 are kept from being effected by the image update time of microscope 104. For example, the click-n-drag navigation of the software interfaces described above allows for precise placement of probes without concern for the amount of time microscope 104 takes for image updating.

The system 100, as described above, is a fully functional probe station incorporating high resolution microscopy in order to allow a system user to probe 0.1 μm. It is low current ready and can pump down in less than five minutes. The system is further capable of dual duty as a high resolution probe station on one hand, and as a light microscope probe station on the other hand. Such a dual capacity may be desired for a variety of reasons beyond the obvious fact that two separate pieces of equipment can now be replaced by one. For example, the light microscope 105 may be used to setup the DUT for testing and for laser cutting. The light microscope 105 may also be operated by the software interface and can be adjusted manually or by motorized drives. The high resolution SEM microscope 104 offers sufficient resolution to probe 100 nm features and offers a magnification range of 15× to 25 k×. By offering probing capabilities, the system 100 can also offer the ability to both inject signals and measure actual signal amplitudes.

The drive mechanisms of system 100 provide heat radiators for probe drift caused by thermal expansion as discussed above and offer high precision lead screw drives which offer high resolutions with large ranges of motion. In a preferred form, the platform stage may be moved up to one inch (25 mm) and allow for X and Y travels approximately equal to 0.25 inches. The manipulators utilized offer the ability to stay on submicron devices for extended periods of time without damaging the DUT or sliding off the target. The preferred manipulators offer X, Y and Z travel of approximately 12.5 mm with a position resolution of 50 nm. The X and Y stages 312 and 314 have the ability to travel approximately 200 mm in the X and Y direction with a resolution of 0.1 µm and an accuracy or repeatability of ±1.5 µm. In addition, the preferred theta drive offers 100° of travel with 0.7 µm of resolution and the ability to be controlled by the joystick/pendant or software interface.

The probes are designed with probe link arms that are capable of further dampening vibration and can give strong support to the probes. The probes 256 can all be placed within one square micron or less and four probes can be placed within one square µm area. A variety of different probe tips may be used with the probes of system 100, including concave, convex and nipple tipped configurations. For example, concave tips which are very sharp but not very durable, can be used in applications where a low Z forces are desired to be applied to the DUT. Convex tips which are durable but have no point, can be used in applications where it is desired to penetrate (or punch through) oxides or in applications where probes that exert a large amount of force are desired. Nipple tips are both durable and sharp and find uses in a variety of applications.

The system can further image at low beam voltages and can blank the beam to prevent damage to DUTs and allow for low current measurements (e.g., sub-femto ampere measurements) to be taken. The beam voltage can be varied from a preferred range of 1.5 kV to 20 kV.

The software of system 100 also allows for the system user to interface with CAD navigation systems and equipment, and gives the system operator the ability to combine control and microscope images on one screen.

While there has been illustrated and described a preferred embodiment of the present invention, it will be appreciated that modifications may occur to those skilled in the art, and it is intended in the appended claims to cover all those changes and modifications which fall within the true spirit and scope of the present invention.

What is claimed is:

1. A probe station for high resolution, low current probing of a device under test (DUT), the probe station comprising:
    a vacuum housing having an interior space in which a DUT is disposed with the interior space under vacuum conditions during testing operation;
    a high resolution microscope extending into the interior space for taking images of the DUT;
    a housing wall assembly generally extending about the interior space; and
    at least two portions of the wall assembly that are of electrically conductive material and are insulated from each other to allow flexibility in providing different electrical guarding or shielding arrangements for the interior space.

2. The probe station of claim 1 wherein the wall portions comprise distinct walls that are electrically isolated from each other.

3. The probe station of claim 1 wherein the wall portions comprise a generally annular outer wall member and a generally annular inner wall member with at least one of the wall members being configured in at least one of a signal, guard and shield arrangement for minimizing noise and interference in a probing operation.

4. The probe station of claim 3 further comprising:
    a carrier for supporting the DUT within the interior space that is configured in at least one of a signal, guard and shield arrangement; and
    a stage located within the interior space for supporting and shifting the carrier to a plurality of different positions.

5. The probe station of claim 1 wherein the high resolution microscope includes a portion that extends into the interior space having an electrically conductive layer configured in at least one of a signal, guard and shield arrangement.

6. The probe station of claim 1 wherein the vacuum housing comprises:
    at least one passage extending through the two portions of the wall assembly in order to provide access to the interior space of the housing for leads extending externally from the housing to components in the internal space; and
    at least one connector attached to the housing to seal the passage and connect portions of the leads external of the housing to portions of the leads in the housing internal space.

7. The probe station of claim 6 wherein the components comprise at least one of a carrier, stage, probe assembly, and environmental control, and wherein the components and leads are capable of being configured in at least one of a signal, guard and shield arrangement.

8. The probe station of claim 7 wherein the component comprises a probe assembly having an electrically conductive element for probing a specific target on the DUT, the probe assembly being connected to at least one of the leads such that the probe assembly is configured in at least one of a signal, guard and shield arrangement.

9. The probe station of claim 1 further comprising:
    a probe assembly having an electrically conductive element for probing a specific target on the DUT; and
    a touchdown sensor electrically connected to the probe assembly, the touchdown sensor detecting when the electrically conductive element of the probe assembly has made sufficient electrical contact with a DUT for probing in order to prevent damaging the DUT via excessive touchdown forces.

10. The probe station of claim 9 wherein the touchdown sensor comprises a logic component for applying a carrier signal to the DUT and receiving a corresponding electrical signal from the electrically conductive element when a sufficient electrical connection has been made between the probe and the DUT for probing.

11. The probe station of claim 10 wherein the carrier signal is a low frequency signal and the corresponding electrical signal from the probe comprises a rapid change in potential that is representative of the electrically conductive element making electrical contact with the DUT.

12. The probe station of claim 1 further comprising:
    a drive system for shifting a component located within the interior space to a predetermined position; and
    a heat insulating or deflecting device of the drive system to allow for precision shifting of the component by the drive system in the vacuum housing.

13. The probe station of claim 12 wherein the drive system includes a motor and the heat insulating or deflecting device comprises an output shaft of the motor, wherein at least a portion of one of the motor and motor output shaft is made from a predetermined heat insulating material.

14. The probe station of claim 12 wherein the drive system includes a motor and motor output shaft that is rotated upon operation of the motor for shifting the component by the drive system in the vacuum housing; and
    the heat insulating or deflecting device comprises a shield disposed between the motor and output shaft to deflect heat or energy from the operating motor away from the output shaft and the component.

15. The probe station of claim 1 wherein the high resolution microscope emits a charged beam for viewing at least a portion of the DUT, the probe station further comprising a shutter for being shifted between a first position wherein the beam of the microscope is allowed to contact the DUT and a second position wherein the beam is prevented from contacting the DUT to prevent damage thereto.

* * * * *